(12) United States Patent
Sharangpani et al.

(10) Patent No.: US 10,361,213 B2
(45) Date of Patent: Jul. 23, 2019

(54) THREE DIMENSIONAL MEMORY DEVICE CONTAINING MULTILAYER WORDLINE BARRIER FILMS AND METHOD OF MAKING THEREOF

(71) Applicant: SANDISK TECHNOLOGIES LLC, Plano, TX (US)

(72) Inventors: Rahul Sharangpani, Fremont, CA (US); Fumitaka Amano, Yokkaichi (JP); Raghuveer S. Makala, Campbell, CA (US); Fei Zhou, Milpitas, CA (US); Keerti Shukla, Saratoga, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 29 days.

(21) Appl. No.: 15/483,862

(22) Filed: Apr. 10, 2017

(65) Prior Publication Data

US 2017/0373079 A1 Dec. 28, 2017

Related U.S. Application Data

(63) Continuation-in-part of application No. 15/291,640, filed on Oct. 12, 2016.
(Continued)

(51) Int. Cl.
*H01L 27/11524* (2017.01)
*H01L 23/532* (2006.01)
(Continued)

(52) U.S. Cl.
CPC .. *H01L 27/11556* (2013.01); *H01L 21/28282* (2013.01); *H01L 21/76847* (2013.01);
(Continued)

(58) Field of Classification Search
CPC ......... H01L 27/11556; H01L 27/11582; H01L 29/7883; H01L 27/11529; H01L 27/11573;
(Continued)

(56) References Cited

U.S. PATENT DOCUMENTS 5,084,417 A 1/1992 Joshi et al.
5,807,788 A 9/1998 Brodsky et al.
(Continued)

FOREIGN PATENT DOCUMENTS

WO WO2002/015277 A2 2/2002

OTHER PUBLICATIONS

Non-final Office Action for U.S. Appl. No. 15/291,640, dated Sep. 8, 2017, 27 pages.
(Continued)

*Primary Examiner* — William F Kraig
*Assistant Examiner* — Khatib A Rahman
(74) *Attorney, Agent, or Firm* — The Marbury Law Group PLLC

(57) ABSTRACT

Memory stack structures are formed through an alternating stack of insulating layers and sacrificial material layers. Backside recesses are formed by removal of the sacrificial material layers selective to the insulating layers and the memory stack structures. A barrier layer stack including a crystalline electrically conductive barrier layer and an amorphous barrier layer is formed in the backside recesses prior to formation of a metal fill material layer.

11 Claims, 47 Drawing Sheets

Related U.S. Application Data

(60) Provisional application No. 62/355,765, filed on Jun. 28, 2016, provisional application No. 62/440,564, filed on Dec. 30, 2016.

(51) Int. Cl.
*H01L 21/768* (2006.01)
*H01L 27/11556* (2017.01)
*H01L 27/11582* (2017.01)
*H01L 27/1157* (2017.01)
*H01L 21/28* (2006.01)
*H01L 29/792* (2006.01)

(52) U.S. Cl.
CPC .... *H01L 23/53266* (2013.01); *H01L 27/1157* (2013.01); *H01L 27/11524* (2013.01); *H01L 27/11582* (2013.01); *H01L 29/7926* (2013.01)

(58) Field of Classification Search
CPC ....... H01L 27/11565; H01L 27/115–27/11597; H01L 29/4234–29/42352; H01L 29/66825–29/66833; H01L 29/792–29/7926; H01L 2924/145–2924/1451; H01L 27/11524; H01L 27/1157; H01L 23/53266; H01L 21/76847; H01L 21/28282; G11C 16/0483
See application file for complete search history.

(56) References Cited

U.S. PATENT DOCUMENTS

| | | | |
|---|---|---|---|
| 5,915,167 A | 6/1999 | Leedy | |
| 5,942,799 A * | 8/1999 | Danek | H01L 23/53223 257/751 |
| 6,001,461 A * | 12/1999 | Toyoda | H01L 21/32051 174/258 |
| 6,194,310 B1 | 2/2001 | Hsu et al. | |
| 6,404,054 B1 * | 6/2002 | Oh | H01L 21/28556 257/751 |
| 6,525,364 B1 * | 2/2003 | Lee | H01L 21/3143 257/296 |
| 6,958,265 B2 | 10/2005 | Steimle et al. | |
| 7,067,871 B2 | 6/2006 | Ozawa | |
| 7,071,108 B2 | 7/2006 | Matsui et al. | |
| 7,177,191 B2 | 2/2007 | Fasoli et al. | |
| 7,221,588 B2 | 5/2007 | Fasoli et al. | |
| 7,232,764 B1 | 6/2007 | Yaegashi | |
| 7,233,522 B2 | 6/2007 | Chen et al. | |
| 7,378,353 B2 | 5/2008 | Lee et al. | |
| 7,485,961 B2 | 2/2009 | Doan et al. | |
| 7,514,321 B2 | 4/2009 | Mokhlesi et al. | |
| 7,531,862 B2 | 5/2009 | Fujimori | |
| 7,547,951 B2 | 6/2009 | Lim et al. | |
| 7,575,973 B2 | 8/2009 | Mokhlesi et al. | |
| 7,598,557 B2 | 10/2009 | Sashida et al. | |
| 7,608,195 B2 | 10/2009 | Wilson | |
| 7,648,872 B2 | 1/2010 | Benson | |
| 7,745,265 B2 | 6/2010 | Mokhlesi et al. | |
| 7,745,312 B2 | 6/2010 | Herner et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 7,969,008 B2 | 6/2011 | Nagai | |
| 8,008,710 B2 | 8/2011 | Fukuzumi | |
| 8,053,829 B2 | 11/2011 | Kang et al. | |
| 8,093,725 B2 | 1/2012 | Wilson | |
| 8,187,936 B2 | 5/2012 | Alsmeier et al. | |
| 8,193,054 B2 | 6/2012 | Alsmeier | |
| 8,193,074 B2 | 6/2012 | Tanaka | |
| 8,198,672 B2 | 6/2012 | Alsmeier | |
| 8,222,160 B2 | 7/2012 | Uozumi | |
| 8,283,228 B2 | 10/2012 | Alsmeier | |
| 8,349,681 B2 | 1/2013 | Alsmeier et al. | |
| 8,446,003 B2 | 5/2013 | Komura et al. | |
| 8,767,439 B2 | 7/2014 | Terai | |
| 8,828,814 B2 | 9/2014 | Wang et al. | |
| 8,884,357 B2 | 11/2014 | Wang et al. | |
| 8,987,087 B2 | 3/2015 | Chien et al. | |
| 8,987,089 B1 | 3/2015 | Pachamuthu et al. | |
| 9,023,719 B2 | 5/2015 | Pachamuthu et al. | |
| 9,153,486 B2 | 10/2015 | Arghavani et al. | |
| 9,230,973 B2 | 1/2016 | Pachamuthu et al. | |
| 9,252,151 B2 | 2/2016 | Chien et al. | |
| 9,397,046 B1 | 7/2016 | Sharangpani et al. | |
| 9,397,093 B2 | 7/2016 | Makala et al. | |
| 9,406,694 B1 | 8/2016 | Ikeno et al. | |
| 9,449,983 B2 | 9/2016 | Yada et al. | |
| 9,460,931 B2 | 10/2016 | Pachamuthu et al. | |
| 9,659,998 B1 * | 5/2017 | Lung | H01L 27/2481 |
| 2002/0190379 A1 | 12/2002 | Jian et al. | |
| 2003/0059632 A1 | 3/2003 | Inoue | |
| 2003/0075802 A1 * | 4/2003 | Derraa | H01L 21/28556 257/758 |
| 2003/0209746 A1 | 11/2003 | Horii | |
| 2004/0082156 A1 * | 4/2004 | Agarwal | H01L 21/28061 438/592 |
| 2004/0159874 A1 | 8/2004 | Tsuchiya et al. | |
| 2004/0232467 A1 * | 11/2004 | Otsuki | C23C 16/34 257/303 |
| 2006/0102586 A1 | 5/2006 | Lee et al. | |
| 2006/0118954 A1 | 6/2006 | Eun | |
| 2007/0023917 A1 | 2/2007 | Yamada | |
| 2007/0210338 A1 | 9/2007 | Orlowski | |
| 2007/0252201 A1 | 11/2007 | Kito et al. | |
| 2009/0227105 A1 | 9/2009 | Fu et al. | |
| 2009/0267132 A1 | 10/2009 | Cha et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0176432 A1 | 7/2010 | Ramaswamy et al. | |
| 2010/0181610 A1 | 7/2010 | Kim et al. | |
| 2010/0187584 A1 | 7/2010 | Matsuda | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0012921 A1 | 1/2012 | Liu | |
| 2012/0070944 A1 | 3/2012 | Kim et al. | |
| 2012/0115300 A1 * | 5/2012 | Hirota | H01L 27/10817 438/381 |
| 2012/0256247 A1 | 10/2012 | Alsmeier | |
| 2013/0094109 A1 * | 4/2013 | Marchon | G11B 5/722 360/244 |
| 2013/0122712 A1 | 5/2013 | Kim et al. | |
| 2013/0221445 A1 | 8/2013 | Lei et al. | |
| 2013/0224960 A1 | 8/2013 | Payyapilly et al. | |
| 2013/0248974 A1 | 9/2013 | Alsmeier et al. | |
| 2013/0264631 A1 | 10/2013 | Alsmeier et al. | |
| 2013/0270631 A1 * | 10/2013 | Kim | H01L 29/7827 257/331 |
| 2013/0313627 A1 | 11/2013 | Lee et al. | |
| 2014/0008714 A1 | 1/2014 | Makala et al. | |
| 2014/0264471 A1 | 9/2014 | Fife et al. | |
| 2014/0353738 A1 | 12/2014 | Makala et al. | |
| 2015/0037912 A1 | 2/2015 | Sakata | |
| 2015/0076585 A1 | 3/2015 | Pachamuthu et al. | |
| 2015/0144481 A1 * | 5/2015 | Etzion | C23C 8/28 204/242 |
| 2015/0325473 A1 | 11/2015 | Niimi et al. | |
| 2015/0380419 A1 | 12/2015 | Gunji-Yoneoka et al. | |
| 2016/0133512 A1 | 5/2016 | Lee et al. | |
| 2016/0148945 A1 | 5/2016 | Sharangpani et al. | |
| 2016/0149002 A1 | 5/2016 | Sharangpani et al. | |
| 2016/0149049 A1 | 5/2016 | Sharangpani et al. | |
| 2016/0163870 A1 | 6/2016 | Ito et al. | |
| 2016/0276158 A1 | 9/2016 | Hsiao et al. | |

(56) References Cited

U.S. PATENT DOCUMENTS

2017/0186752 A1    6/2017    Choi et al.
2017/0243873 A1*    8/2017    Kobayashi ........ H01L 29/42364
2018/0151474 A1    5/2018    Chen et al.

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Y.S. Kim et al., "Direct Copper Electroless Deposition on a Tungsten Barrier Layer for Ultralarge Scale Integration," Journal of the Electrochemical Society, vol. 152 (2) 2005.

Y. Au et al., "Filling Narrow Trenches by Iodine-Catalyzed CVD of Copper and Manganese on Manganese Nitride Barrier/Adhesion Layers," Journal of the Electrochemical Society, vol. 158 (5) 2011.

K. R. Williams et al., "Etch Rates for Micromachining Processing," Journal of Microelectromechanical Systems, vol. 5, No. 4, Dec. 1996.

K. R. Williams et al., "Etch Rates for Micromachining Processing Part II," Journal of the Microelectromechanical Systems, vol. 12, No. 6, Dec. 2003.

M. Claes et al., "Selective Wet Etching of Hf-based Layers," Abstracts, 204th Meeting of the Electrochemical Society, 2003.

U.S. Appl. No. 14/680,414, filed Apr. 7, 2015, SanDisk Technologies.

U.S. Appl. No. 14/926,347, filed Oct. 29, 2015, SanDisk Technologies.

U.S. Appl. No. 15/086,702, filed Mar. 31, 2016, SanDisk Technologies.

U.S. Appl. No. 15/215,006, filed Jul. 20, 2016, SanDisk Technologies.

U.S. Appl. No. 15/291,640, filed Oct. 12, 2016, SanDisk Technologies.

International Search Report and Written Opinion of the International Searching Authority for International Patent Application No. PCT/US2017/029363, dated Sep. 11, 2017, 18 pages.

Final Office Action from Parent U.S. Appl. No. 15/291,640, dated Jun. 29, 2018, 35 pages.

Invitation to Pay Additional Fees from the International Searching Authority for International Patent Application No. PCT/US2017/029363, dated Jul. 19, 2017, 13 pages.

U.S. Appl. No. 15/291,640, Office Action dated Oct. 18, 2018, 25pgs.

U.S. Appl. No. 15/291,640, Office Action dated Mar. 7, 2019, 24pgs.

* cited by examiner

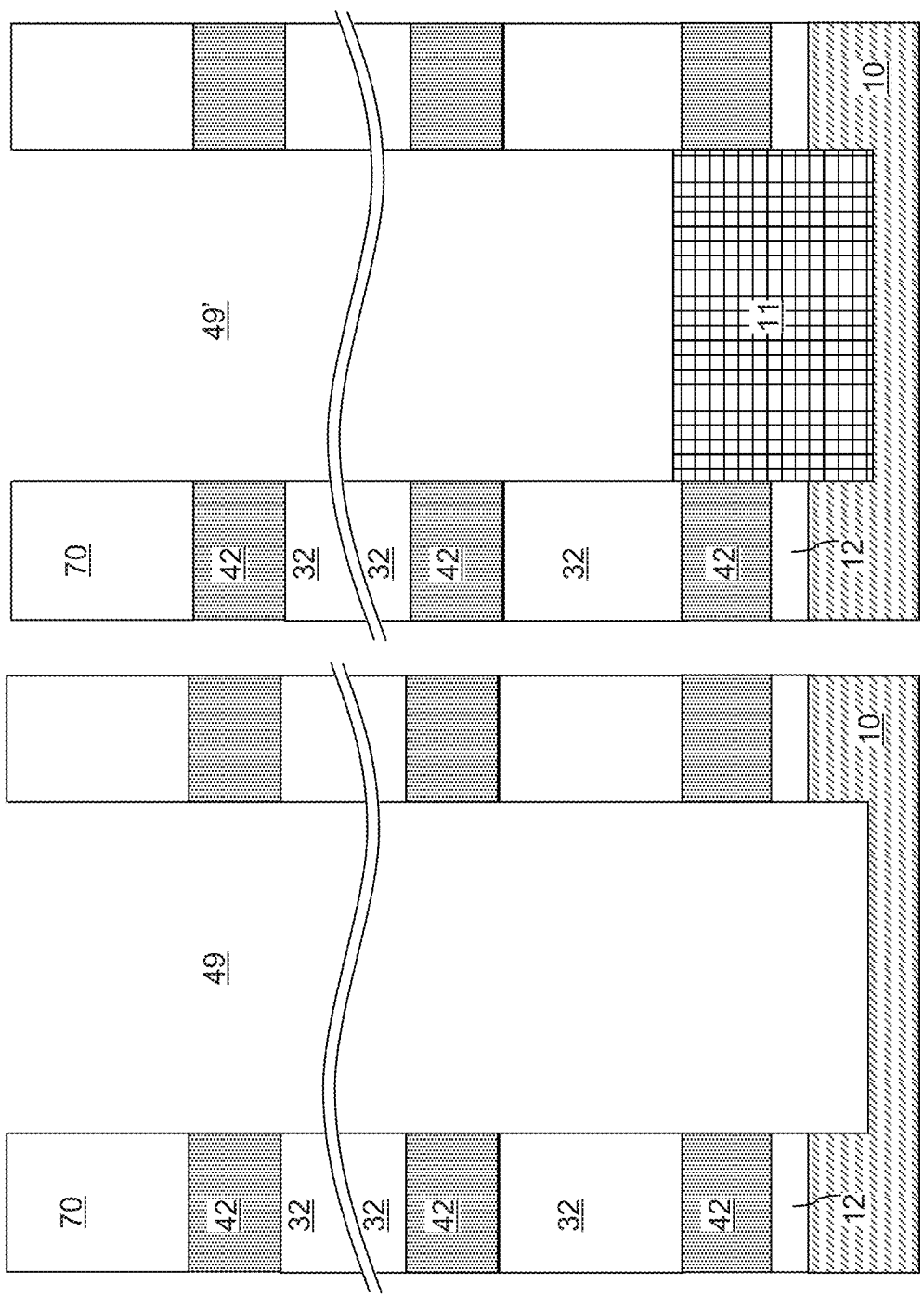

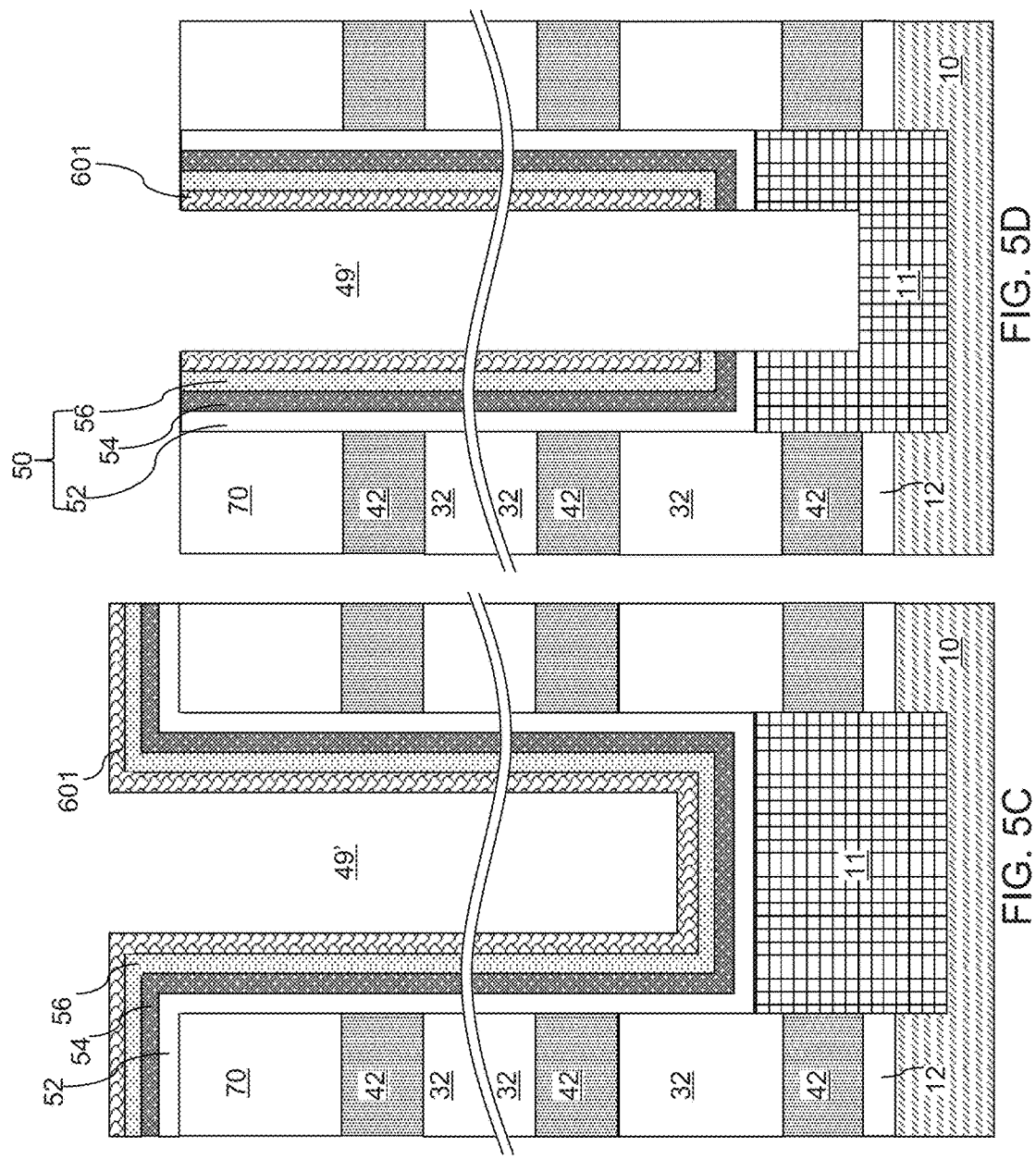

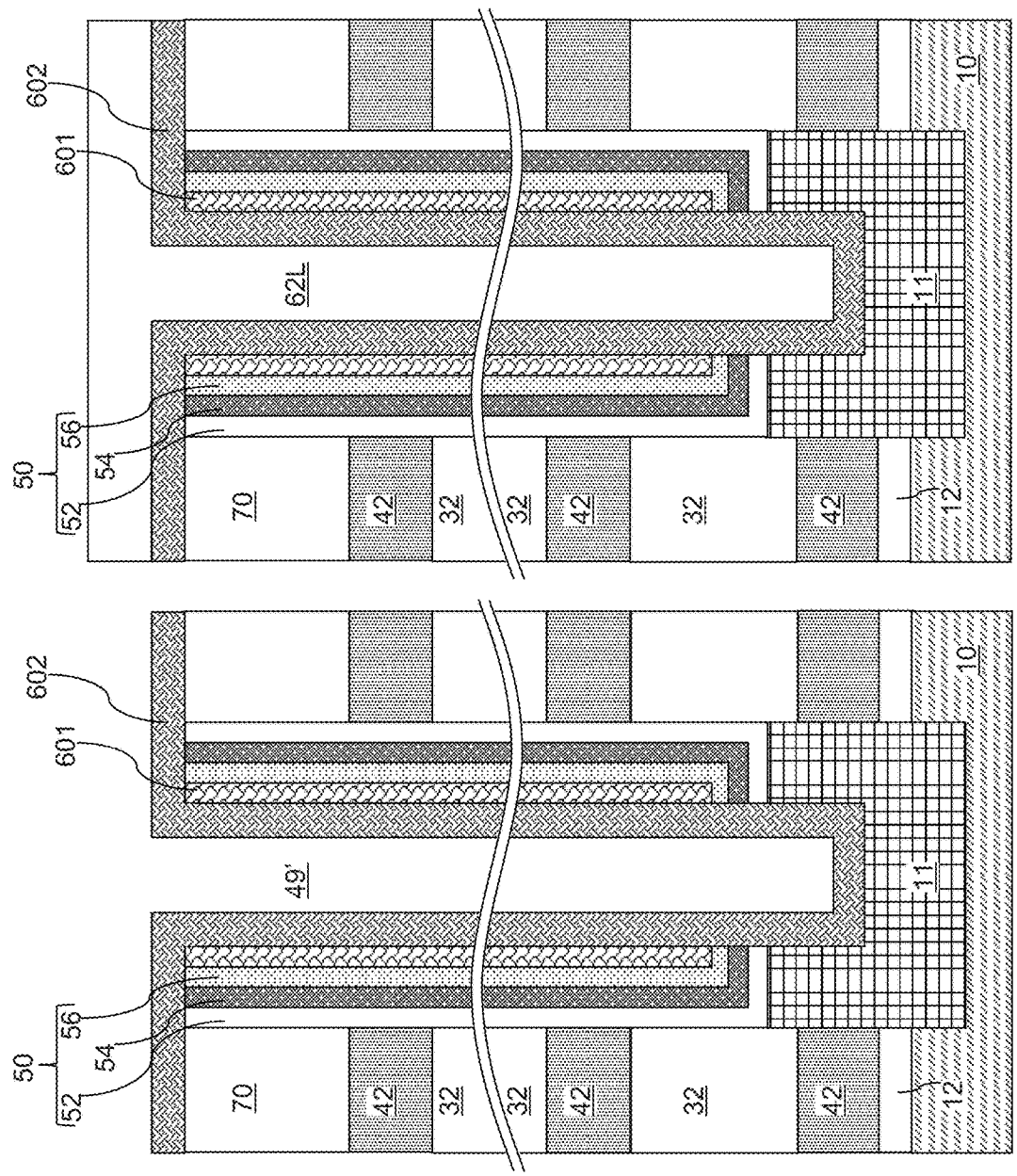

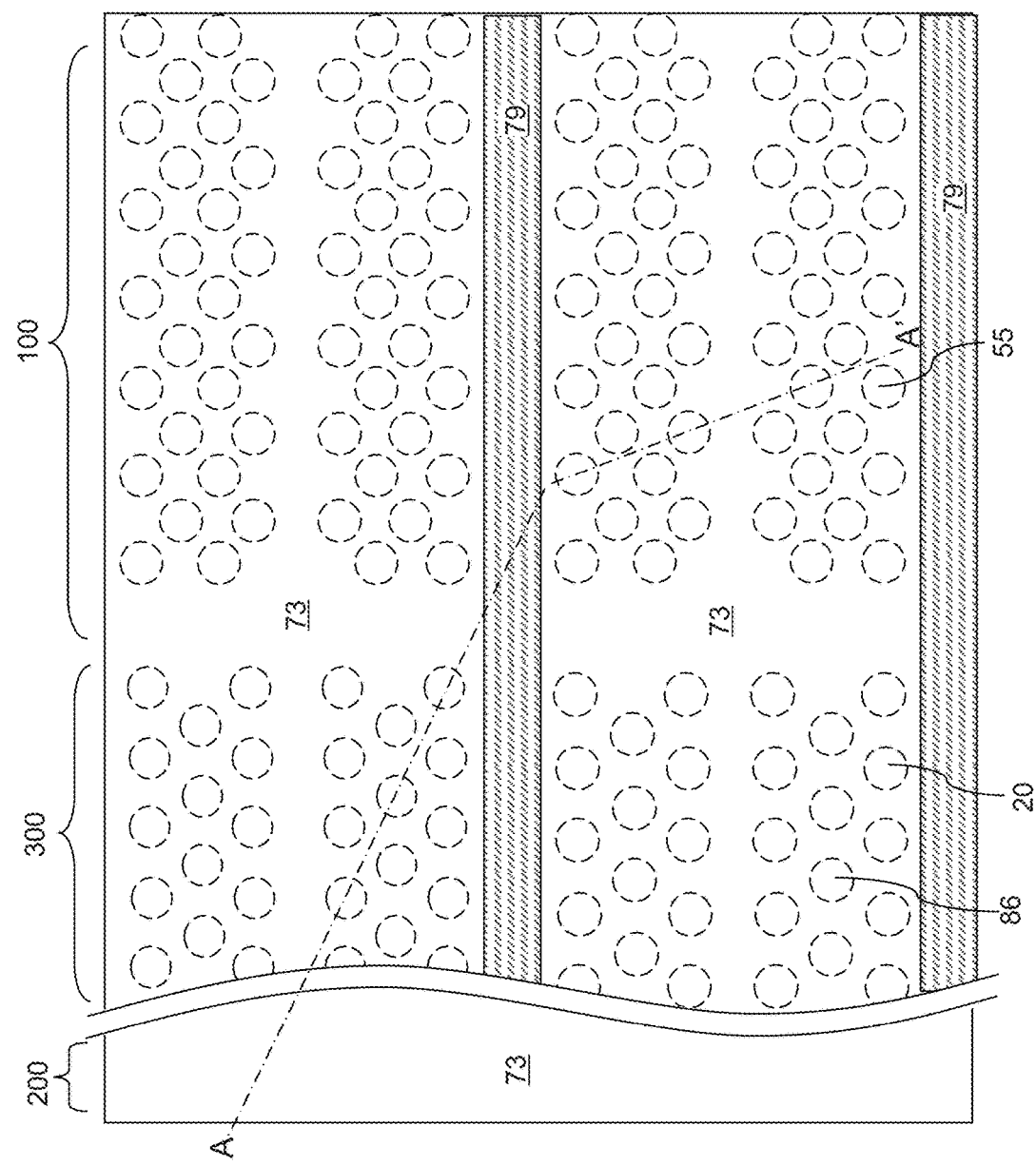

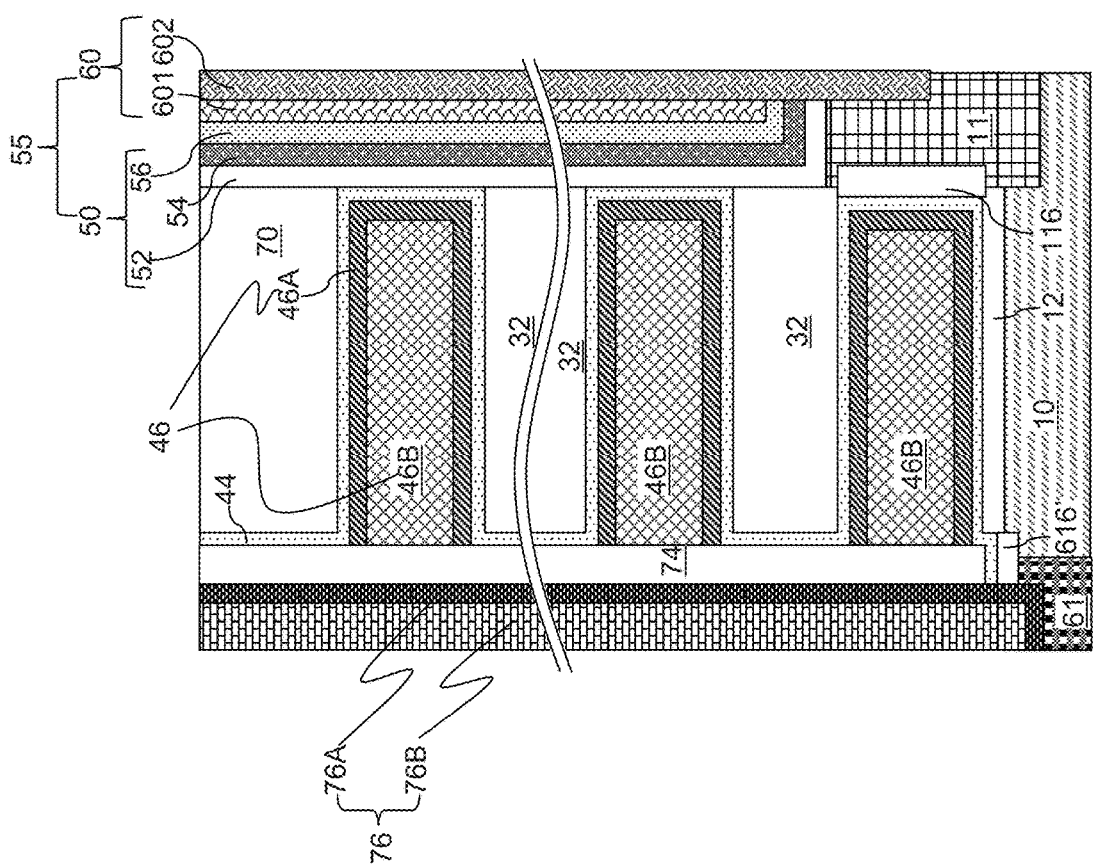

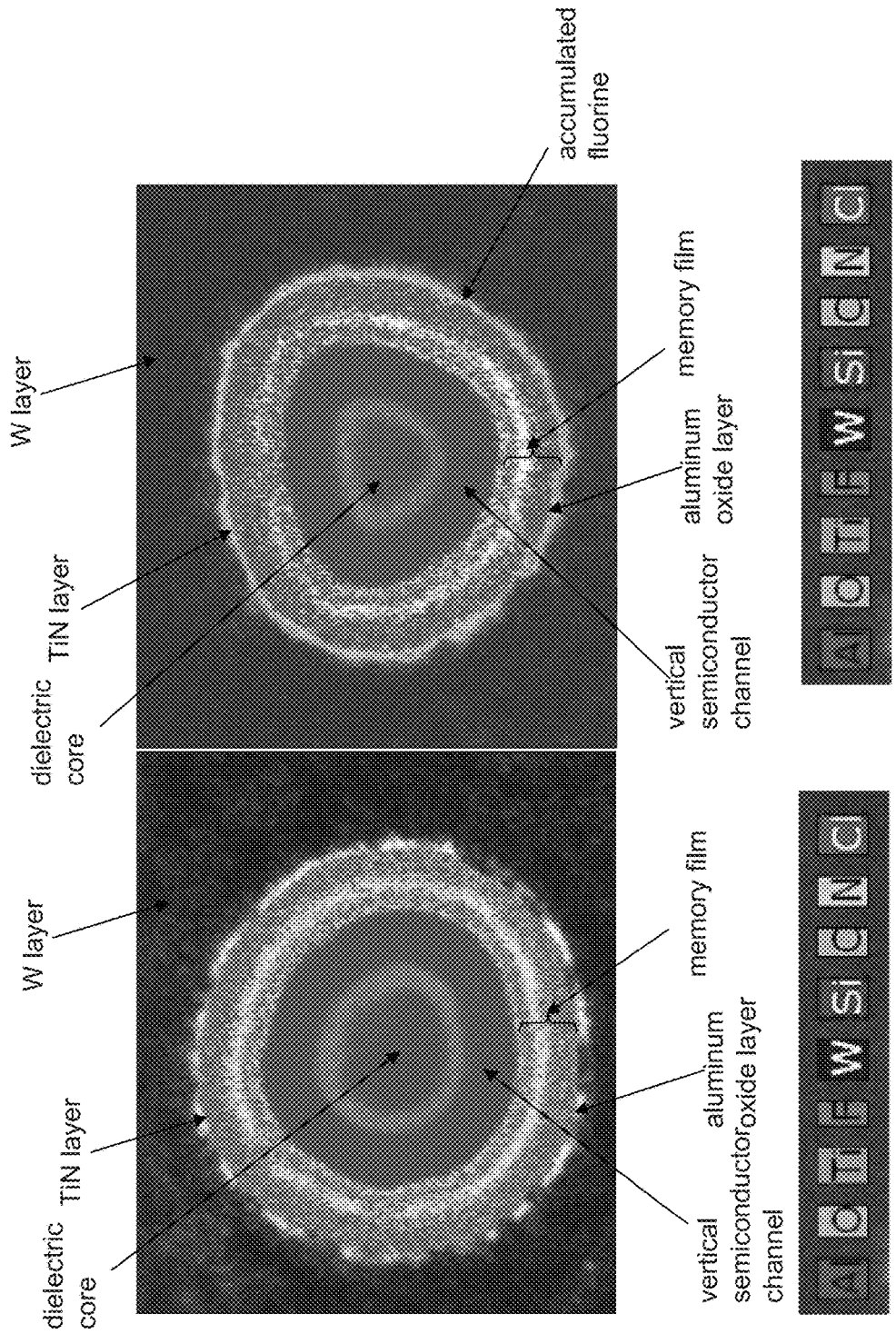

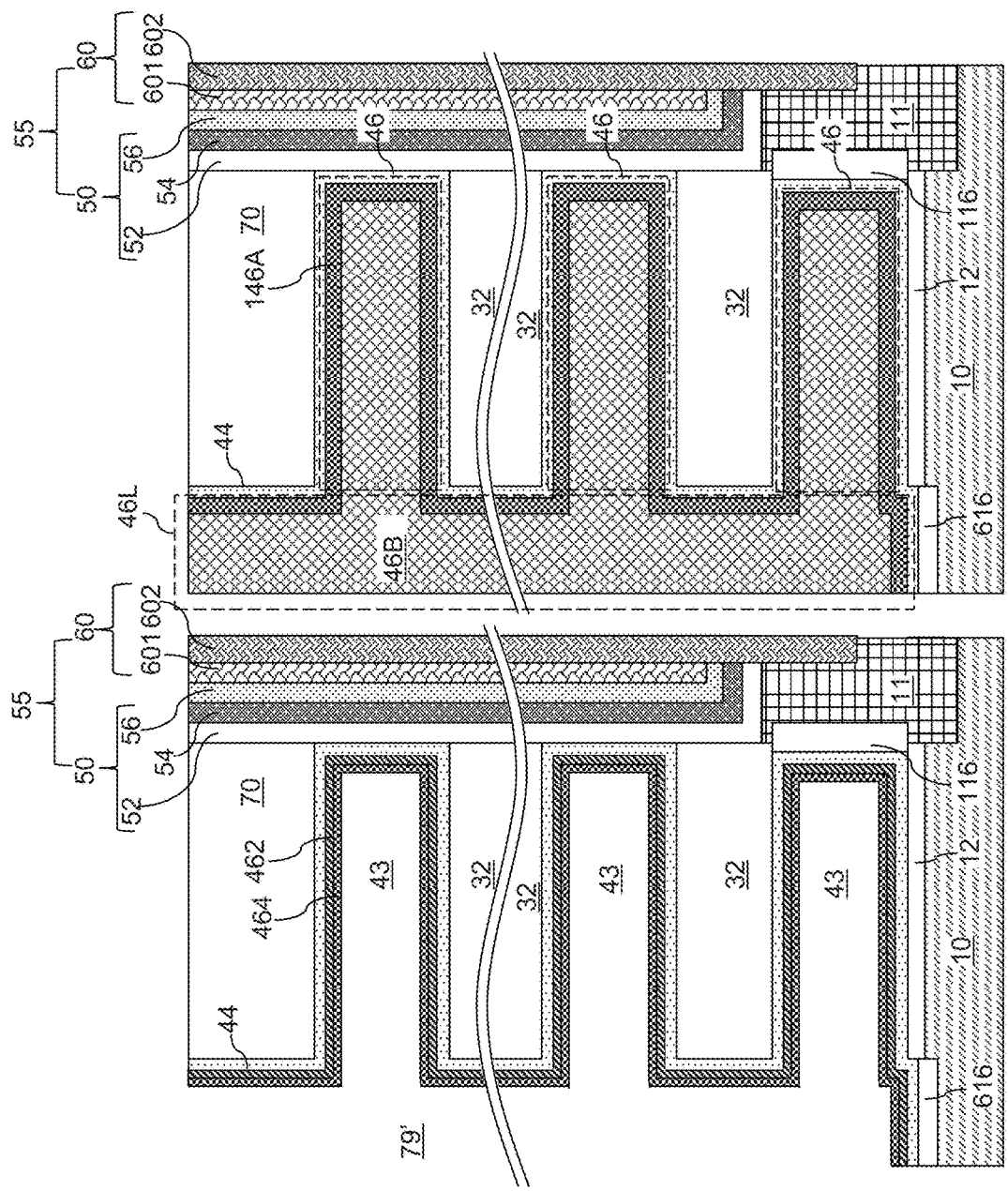

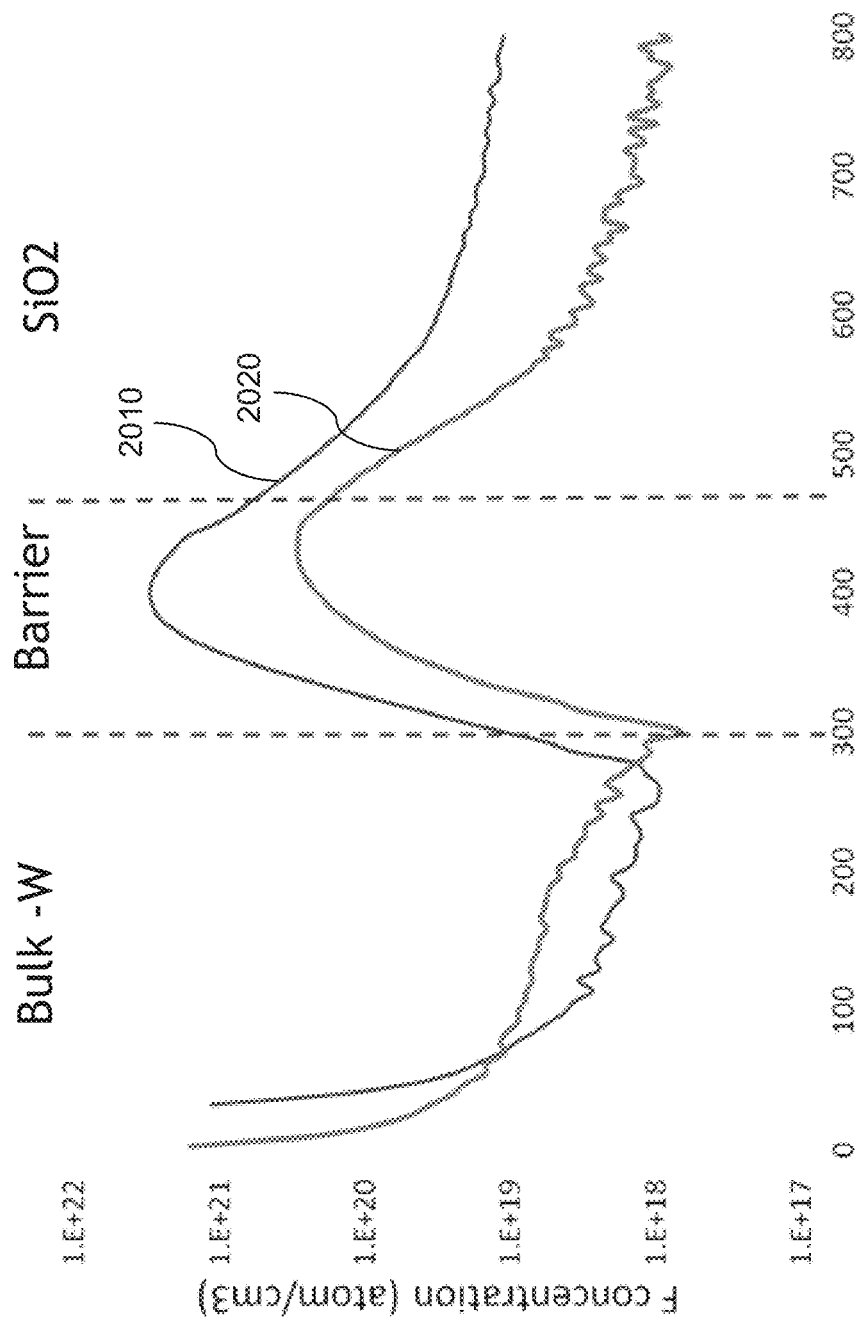

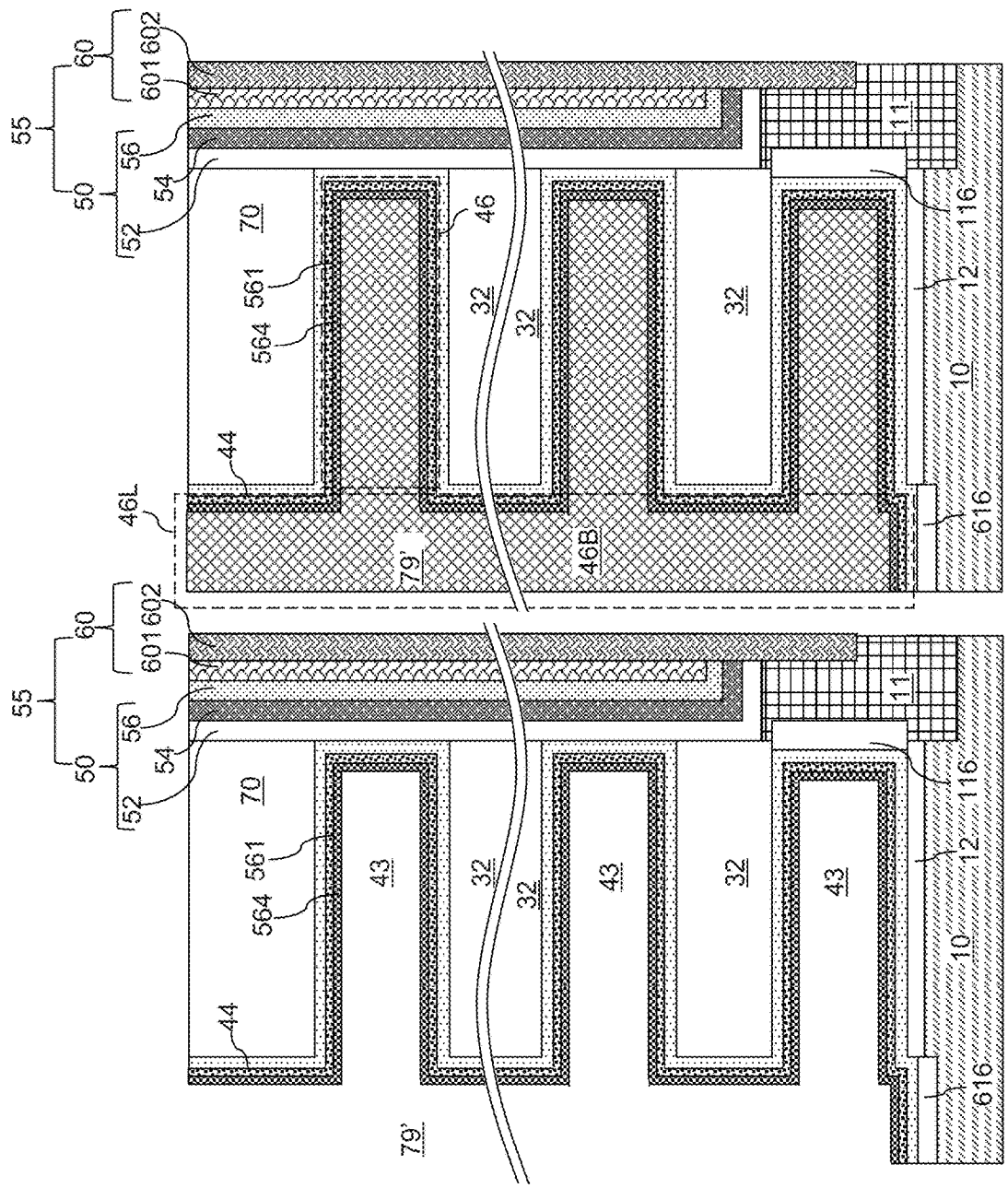

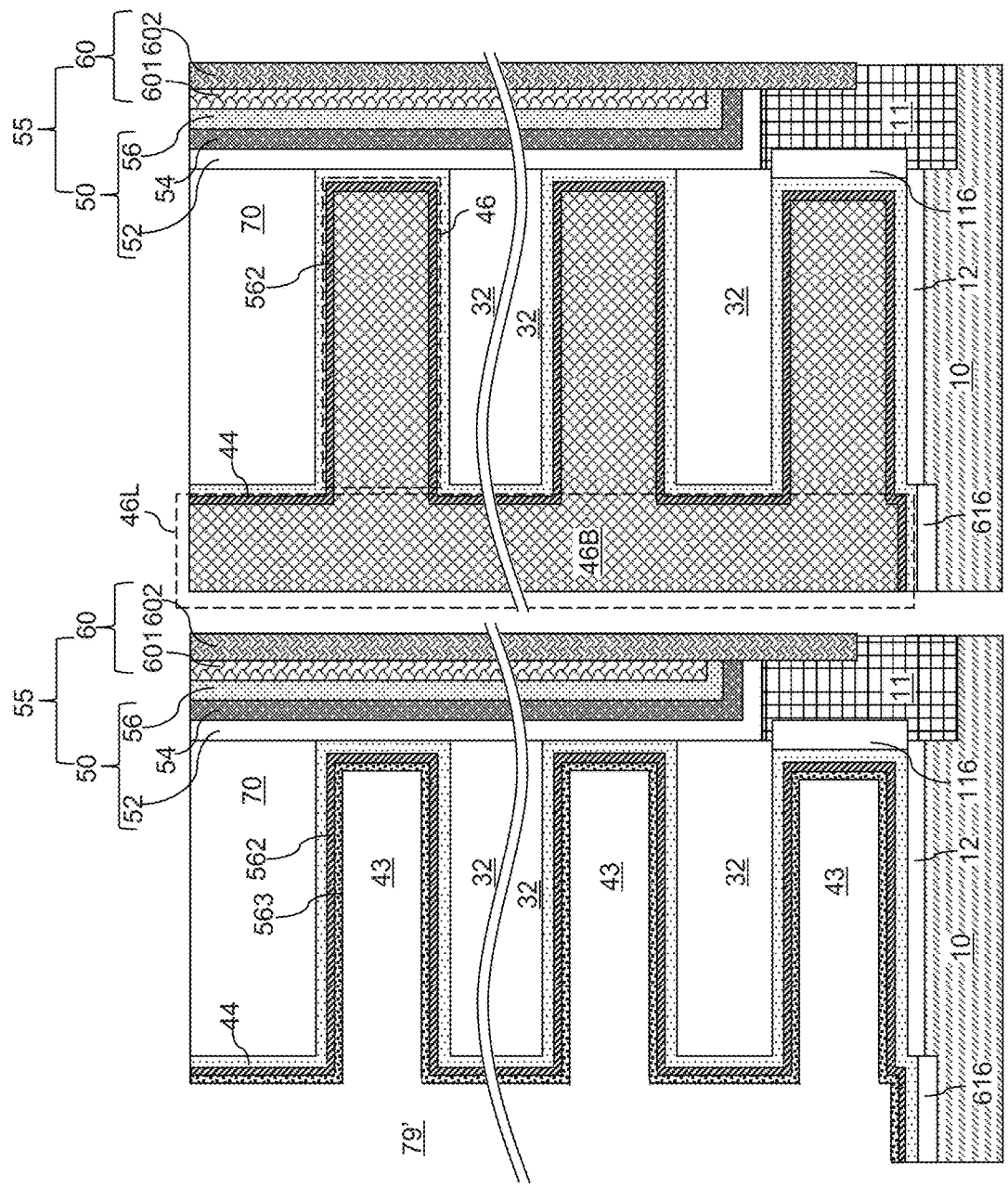

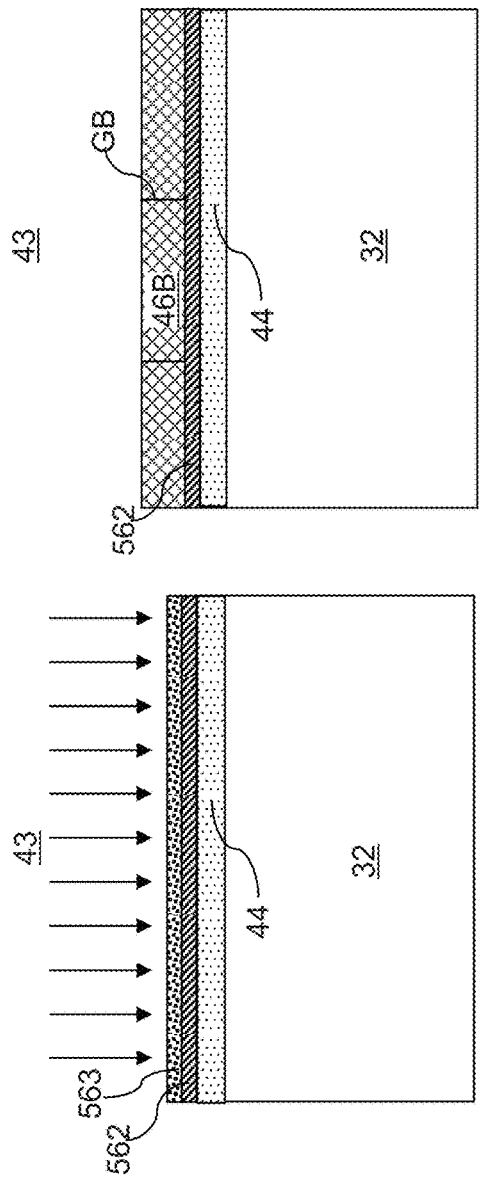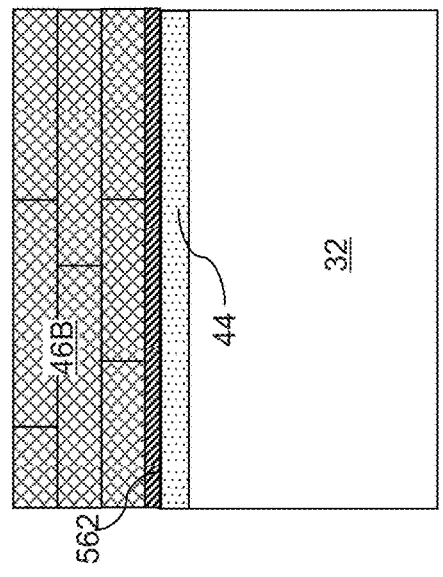

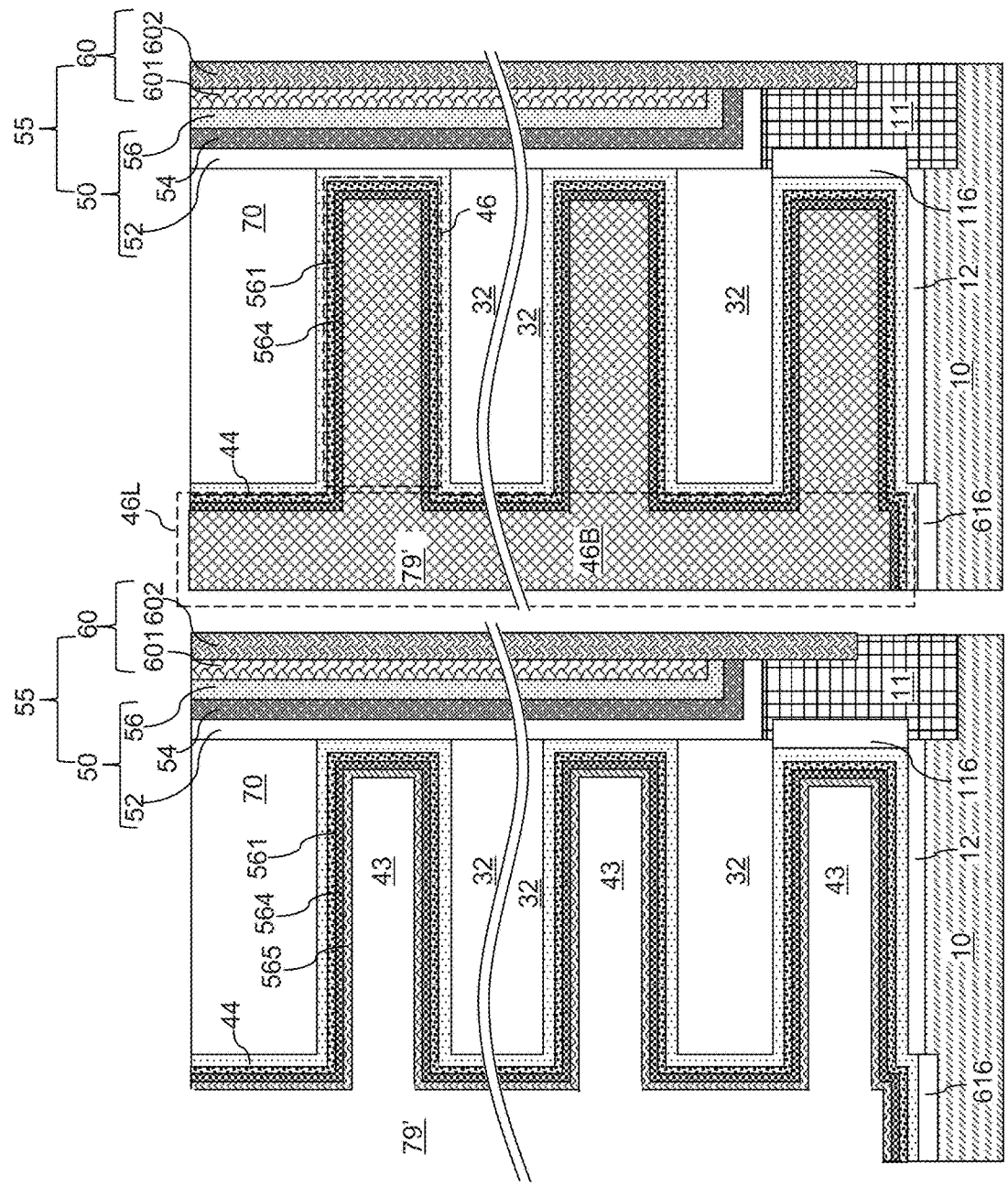

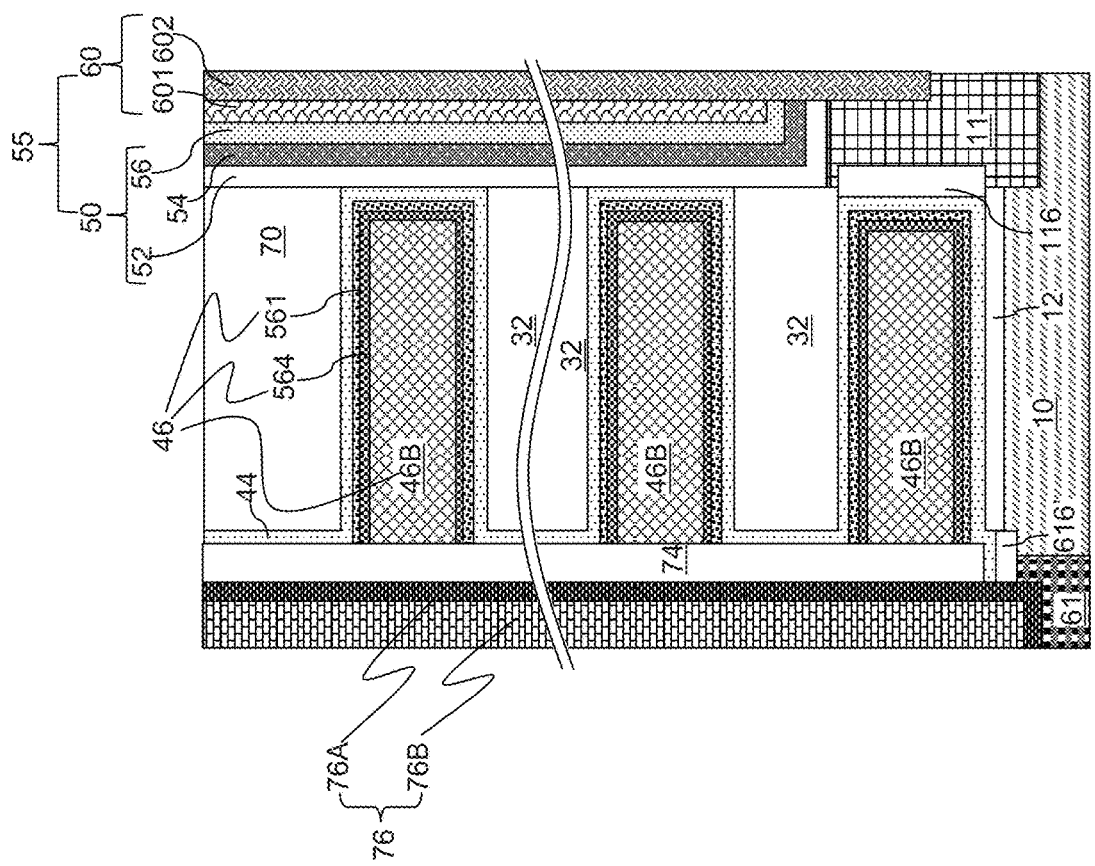

THREE DIMENSIONAL MEMORY DEVICE CONTAINING MULTILAYER WORDLINE BARRIER FILMS AND METHOD OF MAKING THEREOF

RELATED APPLICATIONS

This application is a continuation-in-part application of U.S. application Ser. No. 15/291,640 filed on Oct. 12, 2016, which claims the benefit of priority of U.S. Provisional Application Ser. No. 62/355,765 filed on Jun. 28, 2016. Further, this application claims the benefit of priority of U.S. Provisional Application Ser. No. 62/440,564 filed on Dec. 30, 2016. The entire contents the three above applications are incorporated herein by reference in their entirety.

FIELD

The present disclosure relates generally to the field of semiconductor devices and specifically to three-dimensional semiconductor devices employing a barrier layer stack for formation of control gates and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

Fluorine diffusion between word lines and insulating layers in an alternating stack of layers of a three-dimensional memory device can adversely impact reliability of the three-dimensional memory device by forming voids in the insulating layers, causing migration of materials, and forming electrical shorts.

SUMMARY

According to an aspect of the present disclosure, method of forming a three-dimensional memory device is provided, which comprises: forming an alternating stack of insulating layers and sacrificial material layers over a semiconductor substrate; forming memory stack structures through the alternating stack, wherein each of the memory stack structures comprises a memory film and a vertical semiconductor channel; forming backside recesses by removing the sacrificial material layers selective to the insulating layers and the memory stack structures; forming an amorphous barrier layer in the backside recesses; and forming a metal fill material layer within remaining volumes of the backside recesses after formation of the amorphous barrier layer.

According to another aspect of the present disclosure, a method of forming a three-dimensional memory device is provided, which comprises: forming an alternating stack of insulating layers and sacrificial material layers over a semiconductor substrate; forming memory stack structures through the alternating stack, wherein each of the memory stack structures comprises a memory film and a vertical semiconductor channel; forming backside recesses by removing the sacrificial material layers selective to the insulating layers and the memory stack structures; forming an alternating barrier stack of titanium nitride layers and boron-containing layers; and depositing a metal fill material layer within remaining volumes of the backside recesses after formation of the alternating barrier stack.

According to another aspect of the present disclosure, a three-dimensional memory device is provided, which comprises: an alternating stack of insulating layers and electrically conductive layers located over a substrate; and memory stack structures extending through the alternating stack, wherein each of the memory stack structures comprises a memory film and a vertical semiconductor channel laterally surrounded by the memory film. Each of the electrically conductive layers comprises: a barrier layer stack including a crystalline electrically conductive barrier layer and an amorphous barrier layer; and a metal fill material layer spaced from the insulating layers and the memory stack structures by the barrier layer stack.

According to yet another aspect of the present disclosure, a three-dimensional memory device is provided, which comprises: an alternating stack of insulating layers and electrically conductive layers located over a substrate; and memory stack structures extending through the alternating stack, wherein each of the memory stack structures comprises a memory film and a vertical semiconductor channel laterally surrounded by the memory film. Each of the electrically conductive layers comprises at least a ternary transition metal boronitride barrier layer; and a metal fill material layer spaced from the insulating layers and the memory stack structures by the barrier layer.

According to an aspect of the present disclosure, a three-dimensional memory device is provided, which comprises: an alternating stack of insulating layers and electrically conductive layers located over a substrate; and memory stack structures extending through the alternating stack, wherein each of the memory stack structures comprises a memory film and a vertical semiconductor channel laterally surrounded by the memory film. Each of the electrically conductive layers comprises: an amorphous, electrically conductive barrier layer, and a metal fill material layer spaced from the insulating layers and the memory stack structures by the electrically conductive barrier layer.

According to another aspect of the present disclosure, a method of forming a three-dimensional semiconductor structure is provided. An alternating stack of insulating layers and sacrificial material layers is formed over a semiconductor substrate. Memory stack structures are formed through the alternating stack. Each of the memory stack structures comprises a memory film and a vertical semiconductor channel. Backside recesses are formed by removing the sacrificial material layers selective to the insulating layers and the memory stack structures. An electrically conductive amorphous barrier layer is formed in the backside recesses. A metal fill material layer is formed within remaining volumes of the backside recesses.

BRIEF DESCRIPTION OF THE DRAWINGS

FIGS. 5A-5H are sequential schematic vertical cross-sectional views of a memory opening within the exemplary structure during various processing steps employed to form a memory stack structure according to an embodiment of the present disclosure.

FIG. 7B is a partial see-through top-down view of the exemplary structure of FIG. 7A. The vertical plane A-A' is the plane of the schematic vertical cross-sectional view of FIG. 7A.

FIG. 12B is a magnified view of a region of the exemplary structure of FIG. 12A.

FIGS. 16A and 16B are combined energy dispersive X-ray (EDX) profiles of the reference structure of FIG. 15A and the exemplary structure of FIG. 15B, respectively.

FIGS. 21A and 21B are sequential vertical cross-sectional views of a region of the exemplary structure during formation of an electrically conductive layer according to an embodiment of the present disclosure.

FIG. 22 is a comparison of fluorine concentration as determined by secondary ion mass spectroscopy within a first film stack including a tungsten layer, a TiN barrier layer, and a silicon oxide layer and a second film stack including a tungsten layer, a WCN barrier layer, and a silicon oxide layer.

FIGS. 24A-24B schematically illustrate a region of the exemplary structure during formation of electrically conductive layers employing a first exemplary barrier liner stack according to the first embodiment of the present disclosure.

FIGS. 27A-27B schematically illustrate a region of the exemplary structure during formation of electrically conductive layers employing a second exemplary barrier liner stack according to the second embodiment of the present disclosure.

FIGS. 28A-28C are sequential magnified views of a portion of a backside recess during formation of an electrically conductive layer employing the second exemplary barrier liner stack and a metal fill material layer according to the second embodiment of the present disclosure.

FIGS. 30A-30B schematically illustrate a region of the exemplary structure during formation of electrically conductive layers employing a third exemplary barrier liner stack according to the third embodiment of the present disclosure.

FIGS. 32A and 32B schematically illustrate a region of the exemplary structure after formation of a backside contact via structure according to the third embodiment of the present disclosure.

DETAILED DESCRIPTION

Figure 1:
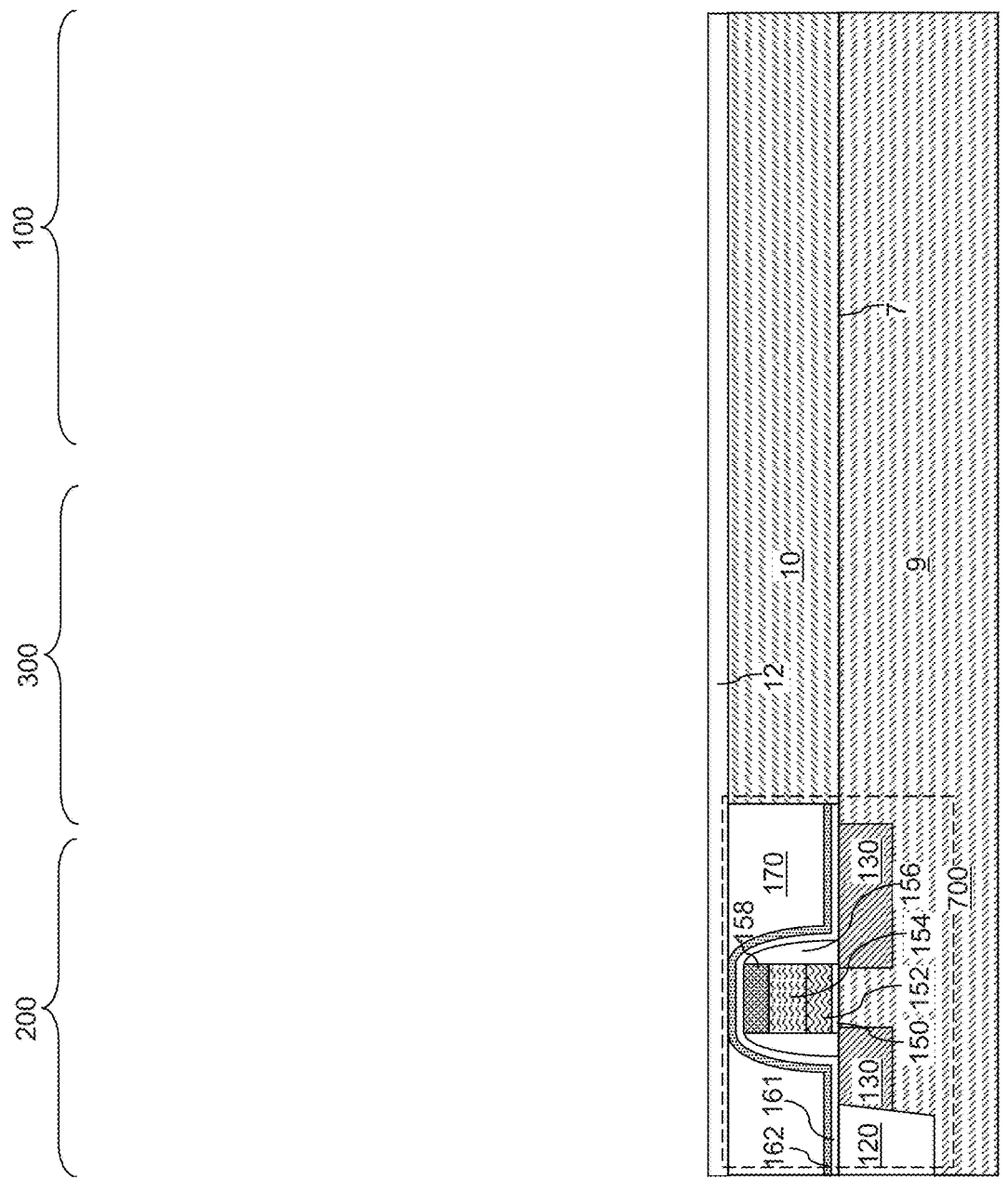
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional semiconductor devices employing a barrier layer stack for formation of control gates and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

The various embodiments of the present disclosure can be employed to provide a metallic barrier layer that effectively suppresses fluorine diffusion between electrically conductive layers and insulating layers in a three-dimensional memory device.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
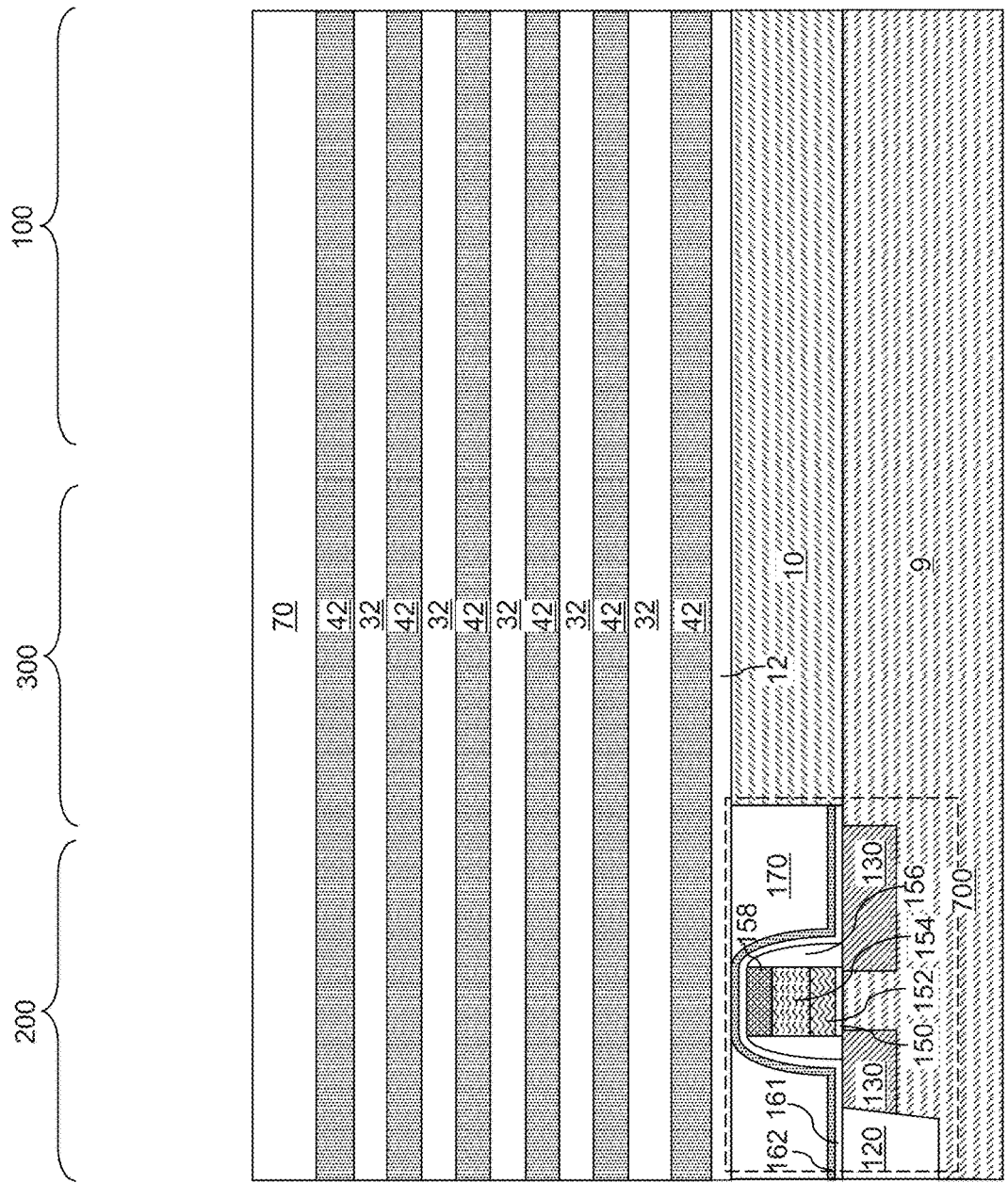
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
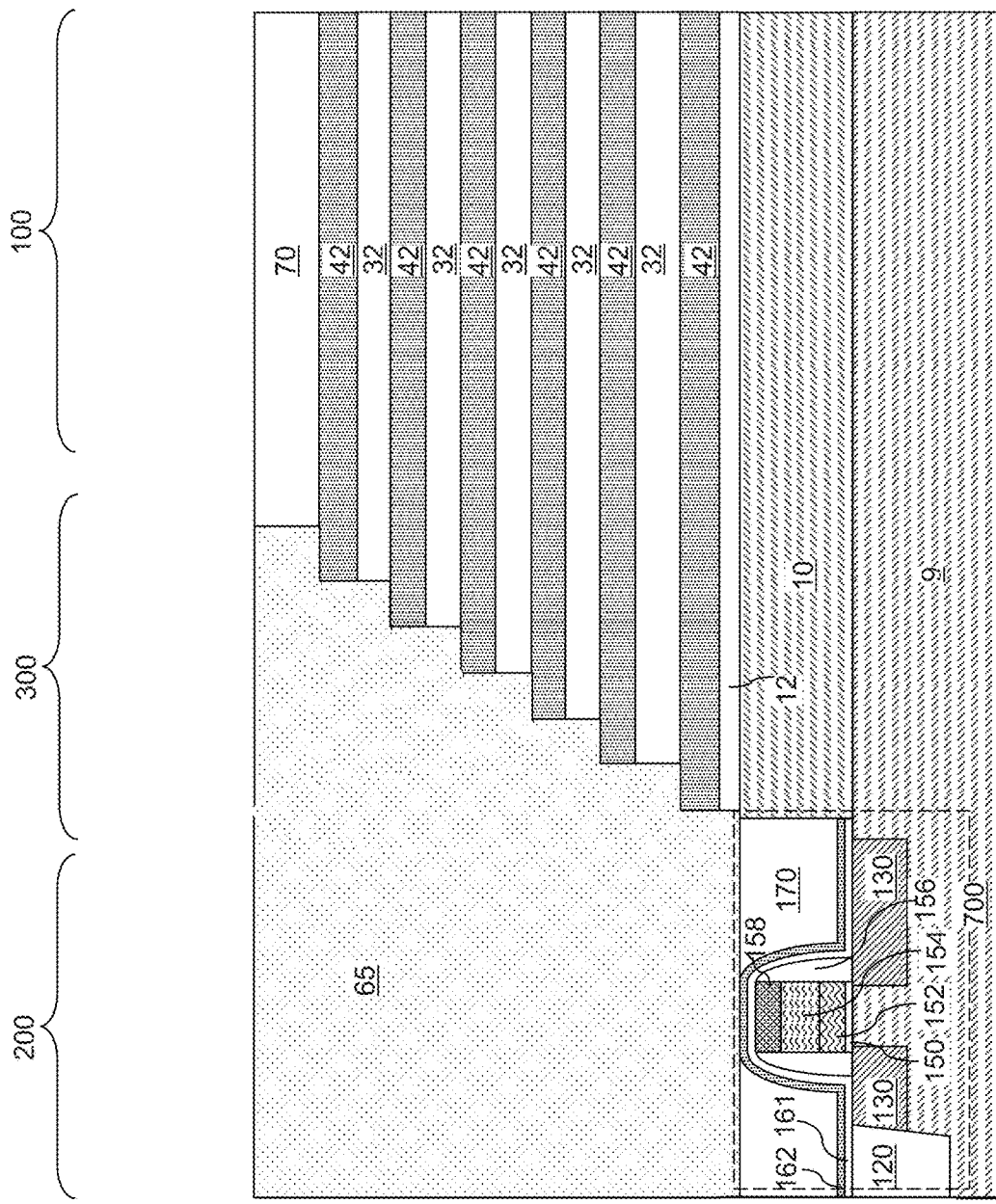
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region (e.g., device region) 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
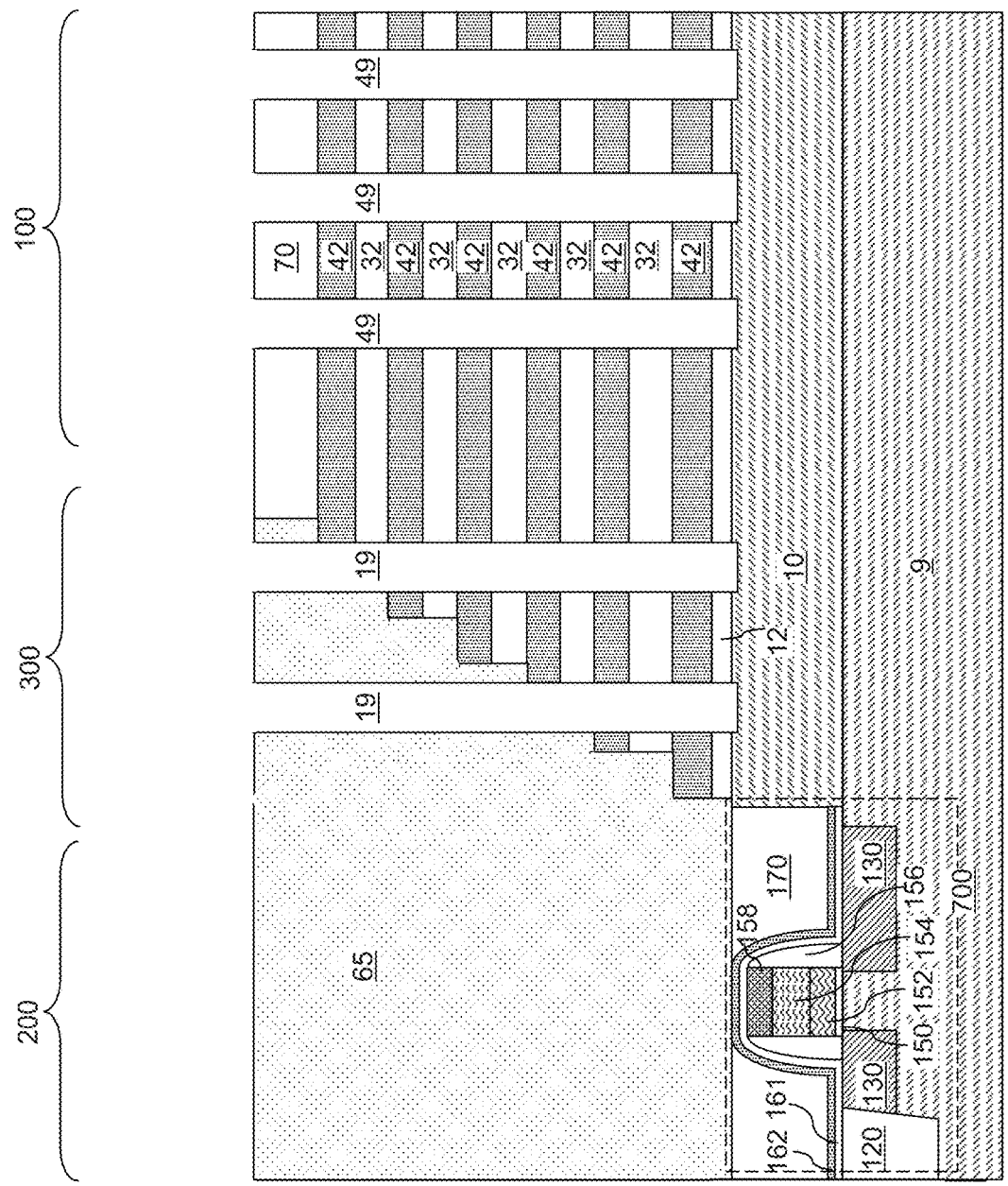
FIG. 4A is a schematic vertical cross-sectional view of the exemplary structure after formation of memory openings according to an embodiment of the present disclosure.
Figure 4B:
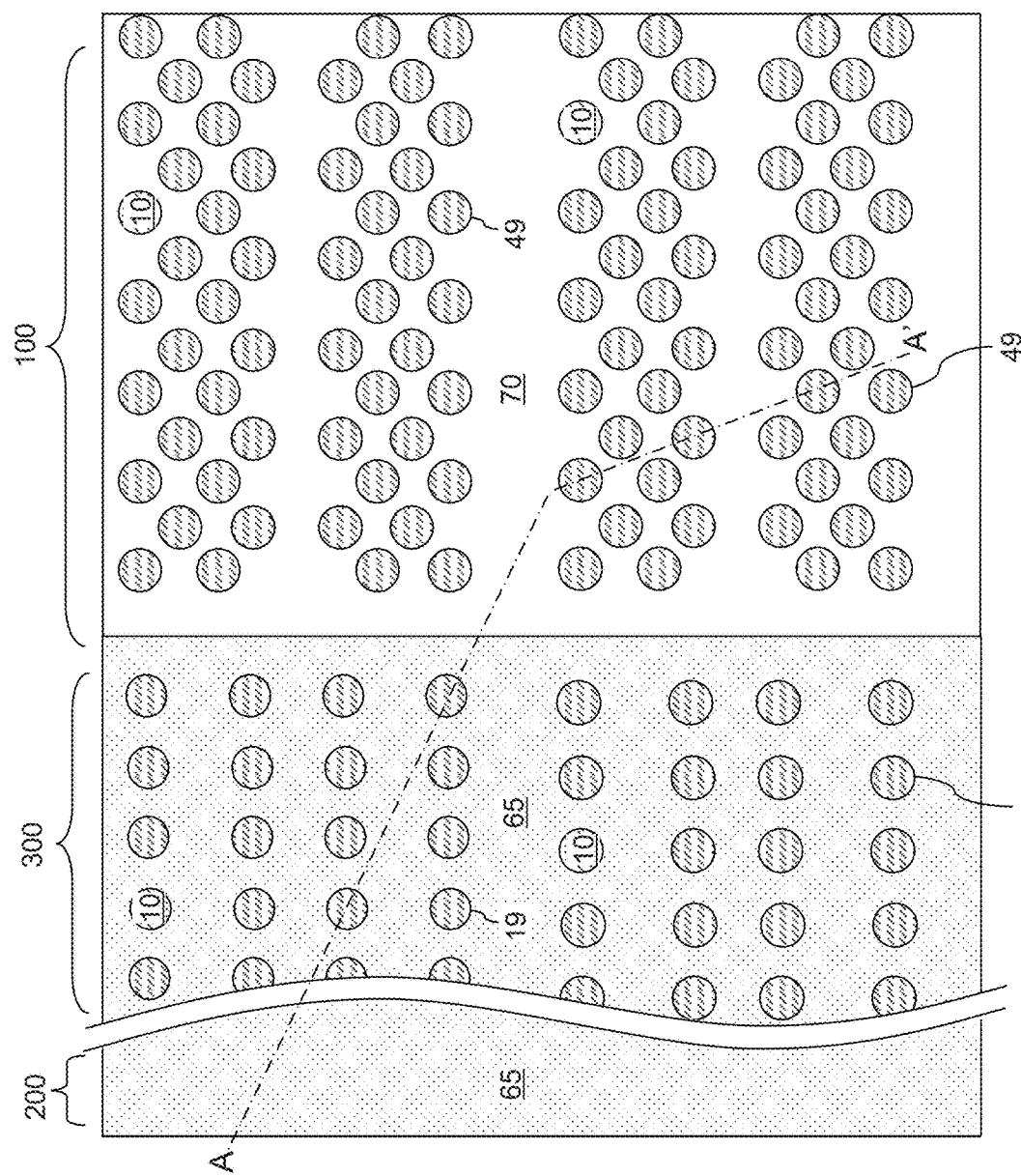
FIG. 4B is a top-down view of the exemplary structure of FIG. 4A. The vertical plane A-A' is the plane of the schematic vertical cross-sectional view of FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100.

A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIG. 4 is illustrated. The memory opening 49 extends through the insulating cap layer 70, the alternating stack (32, 42), the gate dielectric layer 12, and optionally into an upper portion of the semiconductor material layer 10. At this processing step, each support opening 19 can extend through the retro-stepped dielectric material portion 65, a subset of layers in the alternating stack (32, 42), the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional epitaxial channel portion (e.g., an epitaxial pedestal) 11 can be formed at the bottom portion of each memory opening 49 and each support openings 19, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11 as well as in the support opening 19. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49 and the support opening 19.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by anisotropic etch process.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the epitaxial channel portion 11 or the semiconductor substrate layer 10 if portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5G:
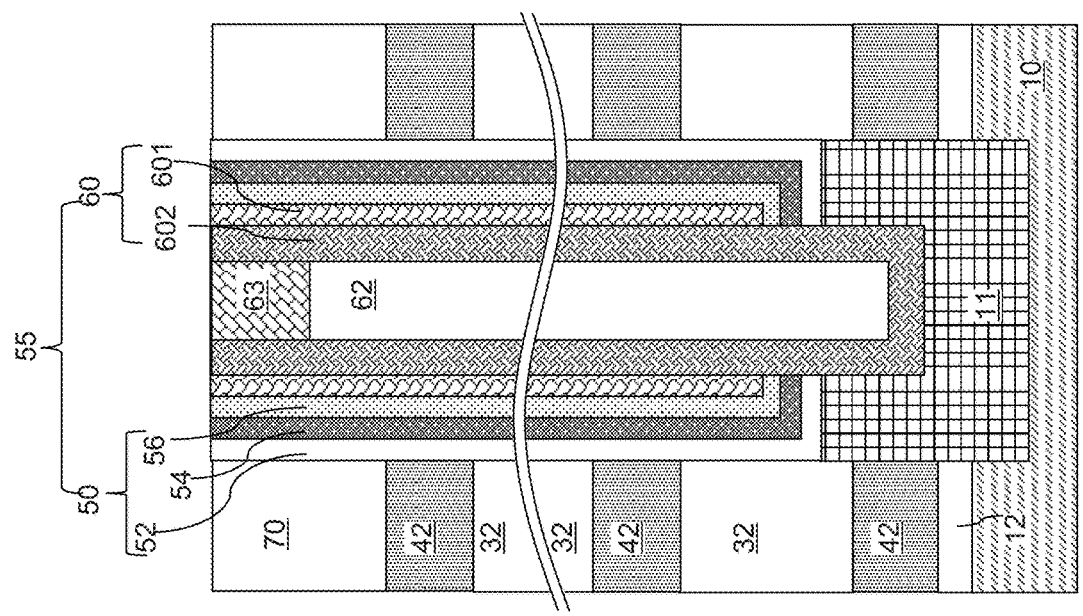

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirely within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5H:
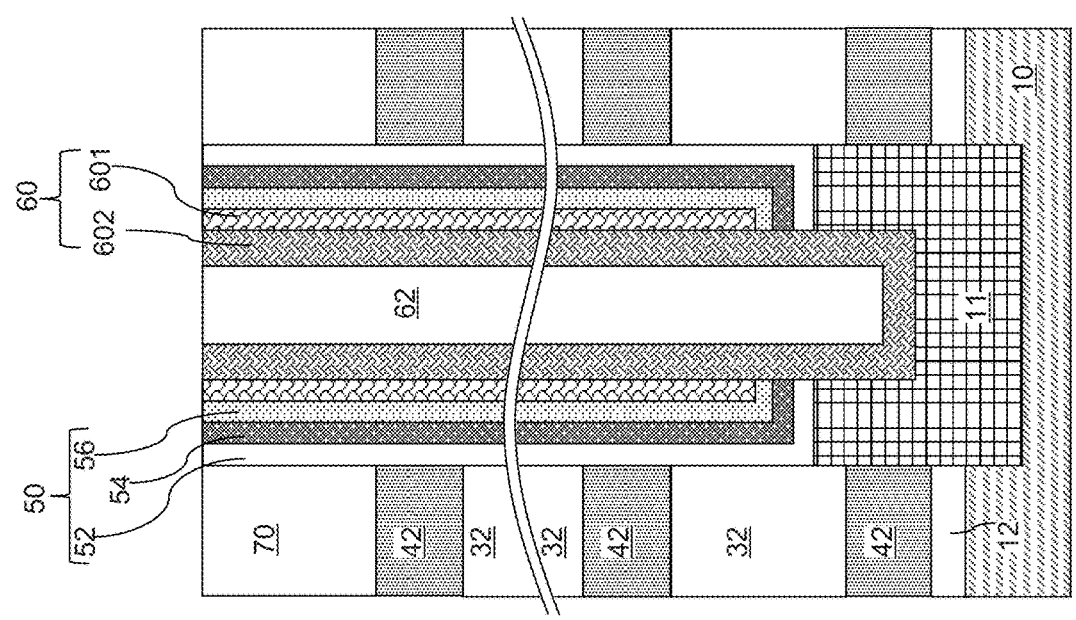

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of an epitaxial channel portion 11 (if present), a memory stack structure 55, a dielectric core 62, and a drain region 63 within a memory opening 49 is herein referred to as a memory opening fill structure (11, 55, 62, 63). Each combination of an epitaxial channel portion 11 (if present), a memory film 50, a vertical semiconductor channel 60, a dielectric core 62, and a drain region 63 within each support opening 19 fills the respective support openings 19, and constitutes a support pillar structure 20. See FIG. 6.

Figure 6:
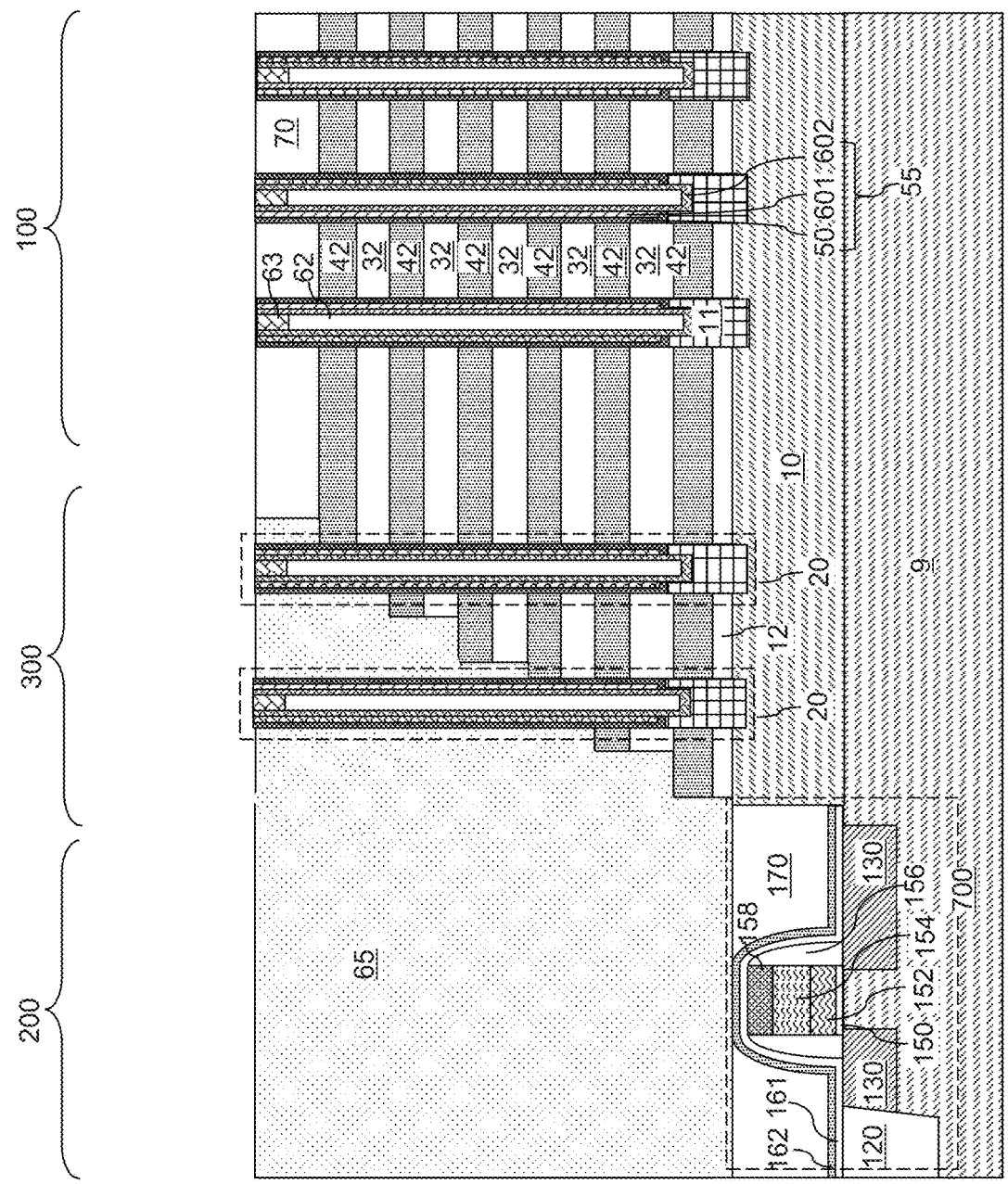
FIG. 6 is a schematic vertical cross-sectional view of the exemplary structure after formation of memory stack structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each exemplary memory stack structure 55 includes a vertical semiconductor channel 60 which may comprise multiple semiconductor channel layers (601, 602) and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
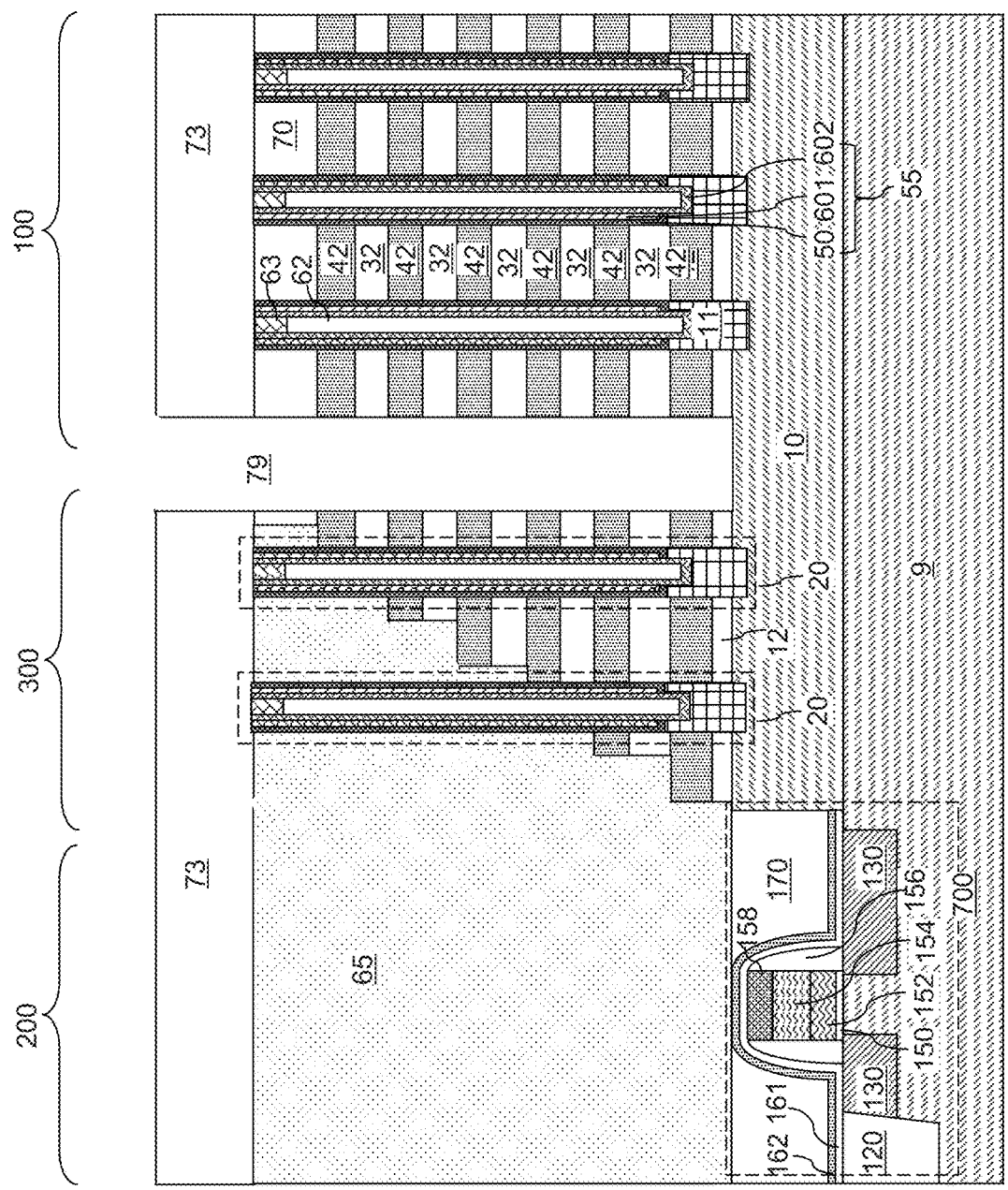
FIG. 7A is a schematic vertical cross-sectional view of the exemplary structure after formation of a backside trench according to an embodiment of the present disclosure.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the alternating stack (32, 42), and is lithographically patterned to form openings in areas between clusters of memory stack structures 55. The pattern in the photoresist layer can be transferred through the alternating stack (32, 42) and/or the retro-stepped dielectric material portion 65 employing an anisotropic etch to form the backside trenches 79, which vertically extend at least to the top surface of the substrate (9, 10), and laterally extend through the memory array region 100 and the contact region 300. In one embodiment, the backside trenches 79 can include a source contact opening in which a source contact via structure can be subsequently formed.

Figure 8:
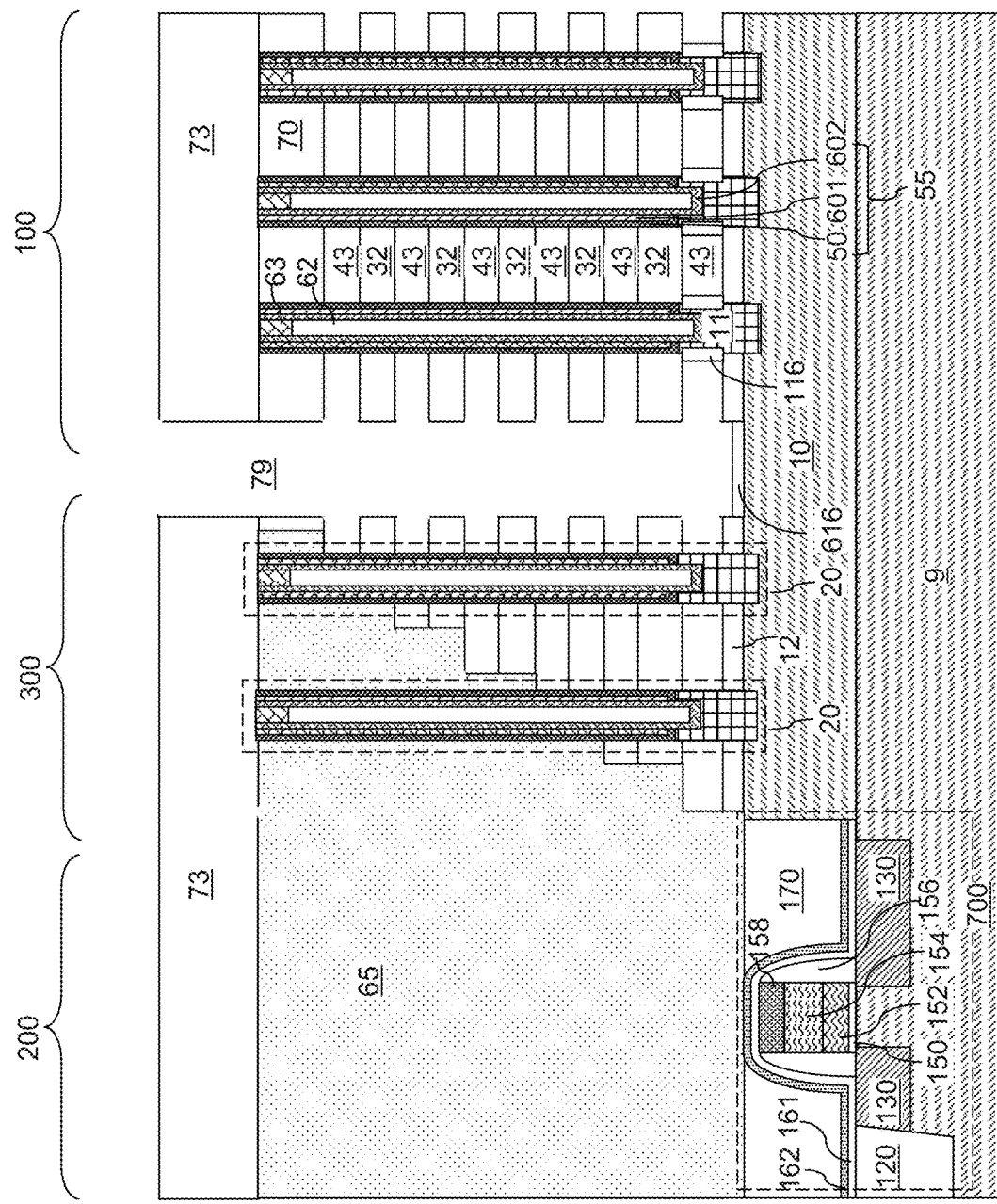
FIG. 8 is a schematic vertical cross-sectional view of the exemplary structure after formation of backside recesses according to an embodiment of the present disclosure.

Referring to FIG. 8, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32 and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor material layer 10.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

FIGS. 9A-9D illustrate a region of a backside recess 43 during the processing steps employed to form a backside blocking dielectric layer 44 and electrically conductive layer 46.

Figure 9A:
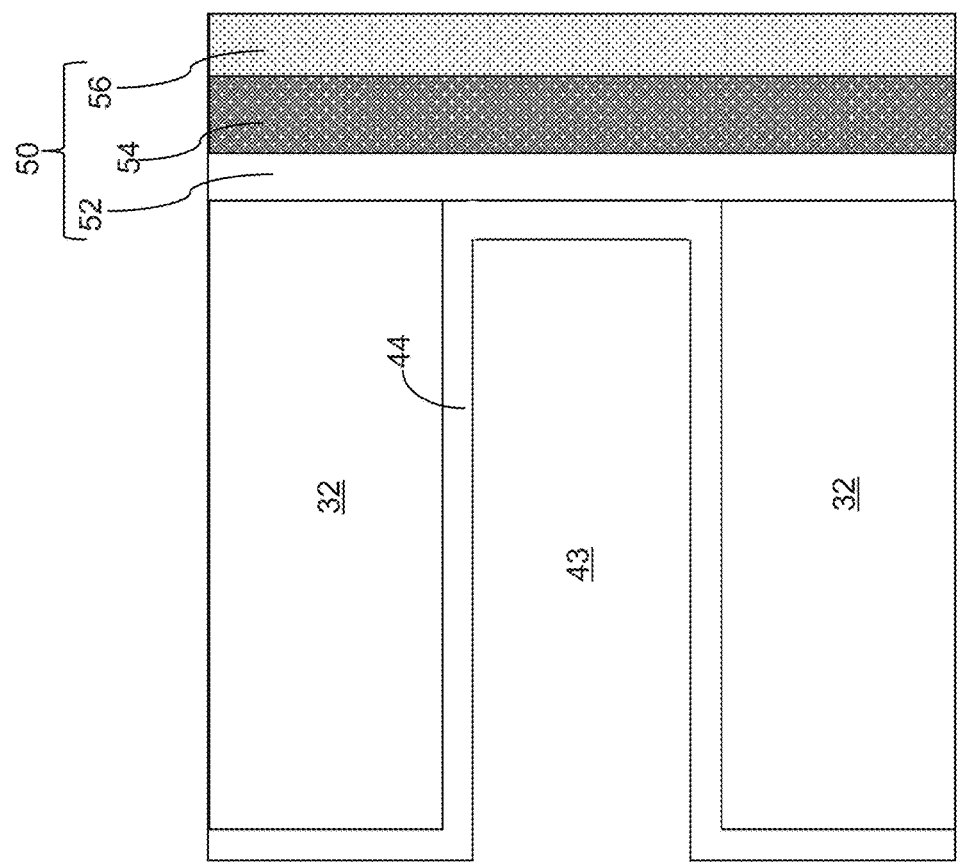
FIGS. 9A-9D are sequential vertical cross-sectional views of a region of the exemplary structure during formation of an electrically conductive layer according to an embodiment of the present disclosure.

Referring to FIG. 9A, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

Figure 9B:
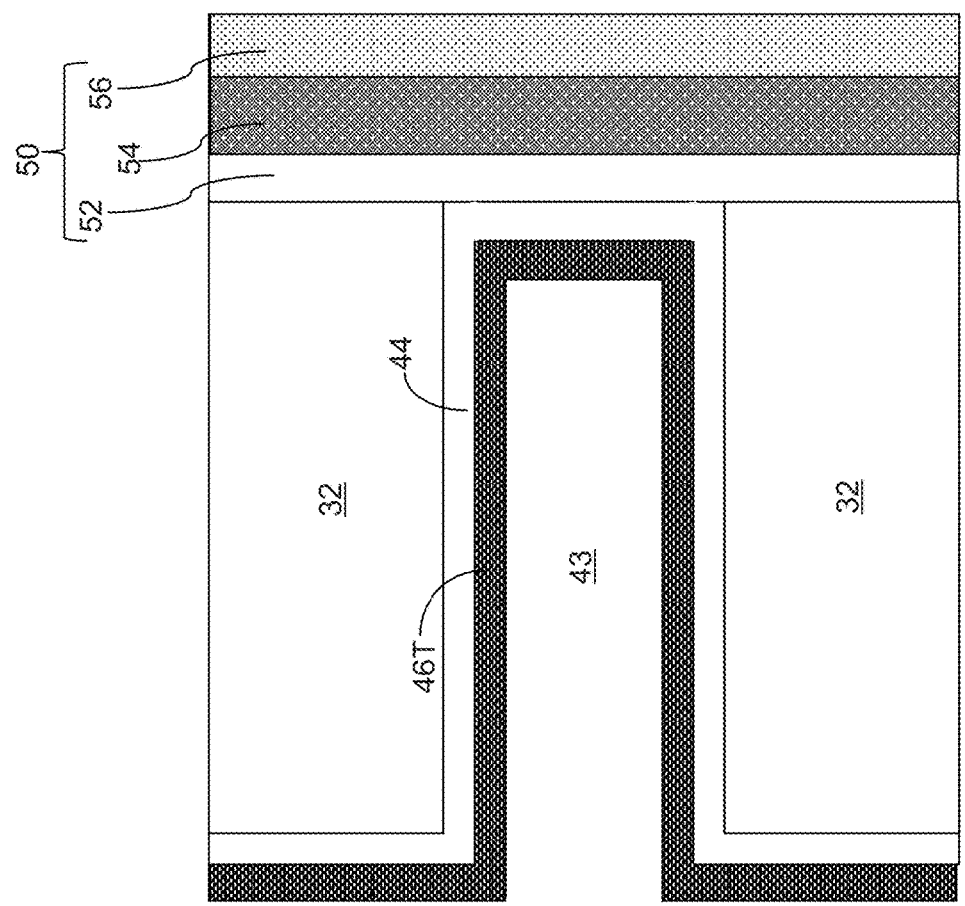

Referring to FIG. 9B, a titanium nitride layer 46T can be deposited in the backside recesses. The titanium nitride layer 46T can consist essentially of titanium nitride, and can be deposited by a conformal deposition process such as chemical vapor deposition (CVD) or atomic layer deposition (ALD). The thickness of the titanium nitride layer 46T can be in a range from 2 nm to 8 nm, such as from 3 nm to 6 nm, although lesser and greater thicknesses can also be employed. The titanium nitride layer 46T can be formed as a continuous polycrystalline film that extends from the bottommost insulating layer 32 to the topmost insulating layer 32. The grains of the titanium nitride layer 46T can be columnar, i.e., can predominantly extend along the local thickness direction. Thus, horizontal portions of the titanium nitride layer 46T can have grains that extend predominantly along the vertical direction, and vertical portions of the titanium nitride layer 46T can have grains that extend predominantly along the horizontal direction. The columnar grain boundaries that extend along the local thickness direction of the titanium nitride layer 46T, if left alone, allows diffusion of fluorine-containing gases through the titanium nitride layer 46T, thereby leading to barrier breakdown in a three-dimensional memory device. In addition, diffusion of other impurities, such as boron (if nucleation or seed layer is deposited using diborane) may also be significant. Use of a diborane-based nucleation layer makes diffusion of boron atoms increasingly important.

During the course of research leading to the present disclosure, the inventors have discovered that oxidation of TiN removes residual chlorine atoms in TiN films. The chlorine atoms can originate from a precursor for titanium such as $TiCl_4$. This characteristic is significant because chlorine etches aluminum oxide effectively, and thus, residual chlorine in a TiN film can etch a neighboring portion of an aluminum oxide film. The X-ray photoelectron spectroscopy (XPS) data summarized in Table 1 illustrates this phenomenon.

TABLE 1

| Elemental composition analysis by XPS | | | | | | | | |
|---|---|---|---|---|---|---|---|---|
| Title | Ti3p | Al2p | Si2p | P2p | Cl1s | N1s | O1s | F1s | Cl2p |
| W on TiO$_x$ | 10.9% | 10.6% | 5.9% | 1.6% | 21.2% | 1.3% | 47.6% | 1.0% | |
| W on TiN | 11.4% | 11.0% | 5.0% | 0.3% | 28.7% | 9.4% | 33.5% | | 0.7% |

Thus, oxidation of TiN can provide chlorine free TiO$_x$, and the absence of chlorine can also contribute to lower a collateral alumina etch rate in addition to better fluorine blocking due to the amorphous nature of the film.

Figure 9C:
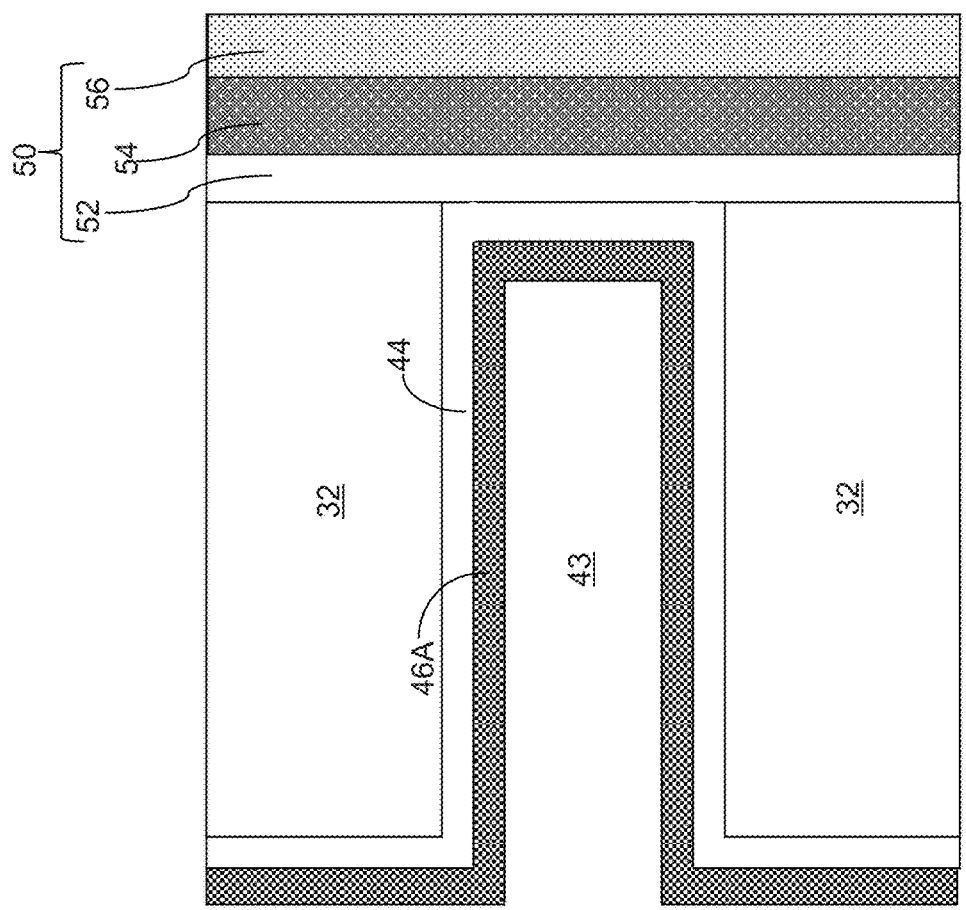

Referring to FIG. 9C, and according to an embodiment of the present disclosure, an oxidation process is performed to convert the titanium nitride layer 46T into an oxygen-containing titanium compound layer 46A. The oxidation process can be a thermal oxidation process or a plasma oxidation process. In a thermal oxidation process, the temperature of the titanium nitride layer 46T can be elevated to an oxidation temperature in an ambient including an oxygen-containing gas such as O2, NO, or H2O. The oxidation temperature may be in a range from 600 degrees Celsius to 1,000 degrees Celsius, although lesser and greater temperatures can also be employed. In a plasma oxidation process, the titanium nitride layer 46T can be exposed to an oxygen plasma generated from an oxygen-containing gas such as O2 or ozone.

The titanium nitride layer 46T can be completely or partially oxidized. In case the titanium nitride layer 46T is completely oxidized, the oxygen-containing titanium compound layer 46A can be a titanium oxide layer consisting essentially of titanium oxide (e.g., TiOx, where x=2 for stoichiometric titanium dioxide or x=2+/−θ, where θ ranges from 0.01 to 0.5. In case the titanium nitride layer 46T is only partially oxidized, the oxygen-containing titanium compound layer 46A can be a titanium oxynitride layer including more oxygen atoms than nitrogen atoms. The oxidation process converts the polycrystalline structure of the titanium nitride layer 46T into an amorphous compound layer including an oxygen-containing titanium compound, which can be titanium oxide or titanium oxynitride. In other words, the titanium nitride layer 46T can be formed as a polycrystalline material layer, and oxidation of the titanium nitride layer 46T changes the polycrystalline material layer into an amorphous material layer. Thus, the columnar grain boundaries of the titanium nitride layer 46T disappear during the transition of the polycrystalline material into an amorphous material. In an alternative embodiment, the oxygen-containing titanium compound layer 46A (e.g., titanium oxide or oxynitride) can be directly deposited as an amorphous layer. In one embodiment, oxidation conditions may be selected such that only a top portion (e.g., 25%-75% of the initial thickness) of the titanium nitride layer 46T is converted to titanium oxide or titanium oxynitride. A bottom portion of the titanium nitride layer 46T may remain intact as titanium nitride. This embodiment provides the benefit that the work function differences resulting from using TiO$_2$ versus TiN are minimized since only 25-75% of the film is TiO$_2$. Since the work function affects programming and erase characteristics, this characteristic can be significant.

Figure 9D:
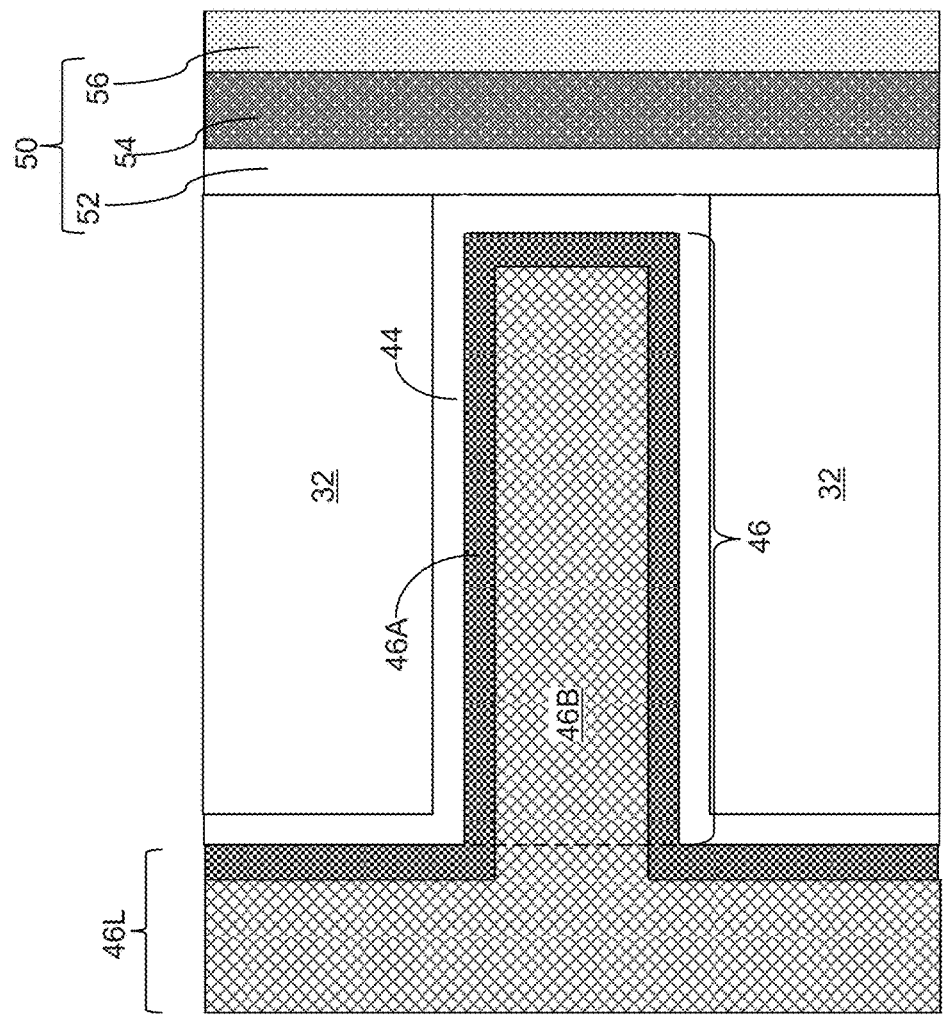
Figure 10:
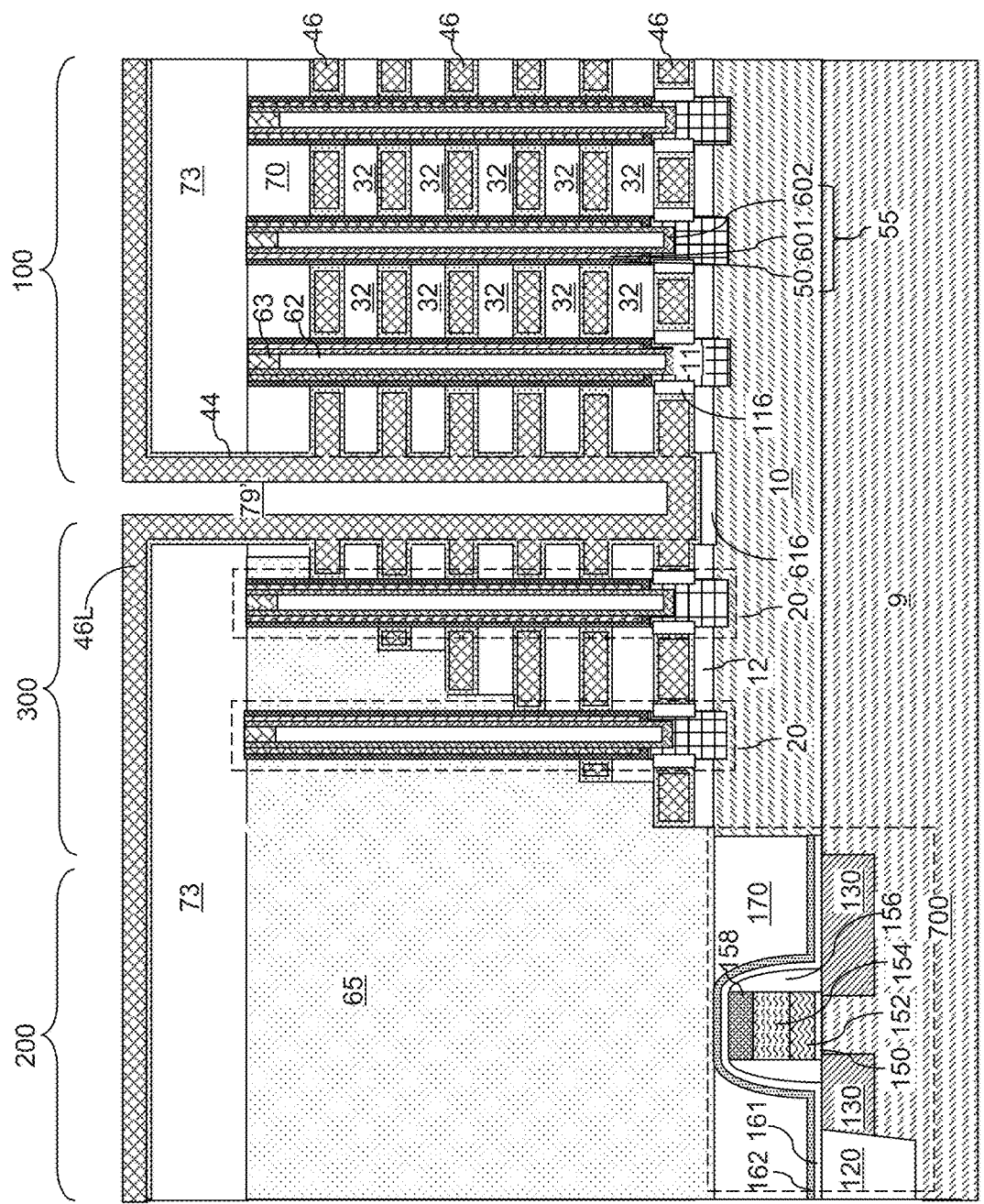
FIG. 10 is a schematic vertical cross-sectional view of the exemplary structure after formation of electrically conductive layers and a continuous conductive material layer according to an embodiment of the present disclosure.

Referring to FIGS. 9D and 10, a metal fill material is deposited in the plurality of backside recesses 43, on the sidewalls of the at least one backside contact trench 79, and over the top surface of the contact level dielectric layer 73 to form a metal fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metal fill material layer 46B can consist essentially of at least one elemental metal. The at least one elemental metal of the metal fill material layer 46B can be selected, for example, from tungsten, cobalt, ruthenium, titanium, and tantalum. In one embodiment, the metal fill material layer 46B can consist essentially of a single elemental metal. In one embodiment, the metal fill material layer 46B can be deposited employing a fluorine-containing precursor gas such as WF$_6$. In one embodiment, the metal fill material layer 46B can be a tungsten layer including a residual level of fluorine atoms as impurities. The metal fill material layer 46B is spaced from the insulating layers 32 and the memory stack structures 55 by the oxygen-containing titanium compound layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside contact trench 79 and over the contact level dielectric layer 73. Each electrically conductive layer 46 includes a portion of the oxygen-containing titanium compound layer 46A and a portion of the metal fill material layer 46B that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the oxygen-containing titanium compound layer 46A and a continuous portion of the metal fill material layer 46B that are located in the backside trenches 79 or above the contact level dielectric layer 73.

Each sacrificial material layer 42 can be replaced with an electrically conductive layer 46. A backside cavity 79' is present in the portion of each backside contact trench 79 that is not filled with the backside blocking dielectric layer and the continuous metallic material layer 46L. A tubular dielectric spacer 116 laterally surrounds an epitaxial channel portion 11. A bottommost electrically conductive layer 46 laterally surrounds each tubular dielectric spacer 116 upon formation of the electrically conductive layers 46.

Figure 11:
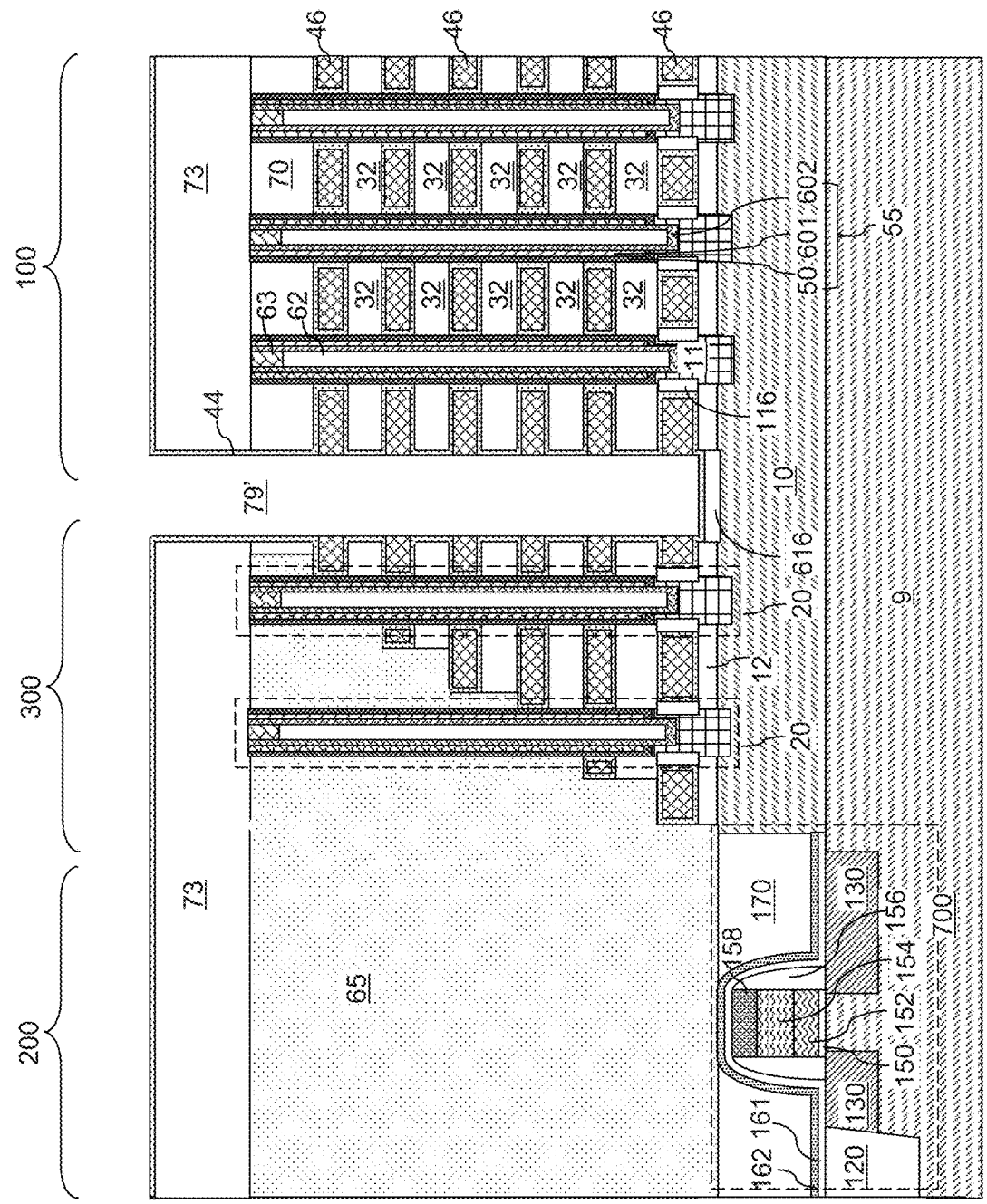
FIG. 11 is a schematic vertical cross-sectional view of the exemplary structure after removal of a deposited conductive material from within the backside trench according to an embodiment of the present disclosure.

Referring to FIG. 11, the deposited metallic material of the continuous electrically conductive material layer 46L is etched back from the sidewalls of each backside contact trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside contact trench 79. The gate dielectric layer 12 can be vertically spaced from the backside contact trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside contact trench 79 depending on whether the gate dielectric layer 12 is not removed or partially removed during removal of the continuous electrically conductive material layer 46L. In one embodiment, a top surface of the cap gate dielectric layer 616 can be physically exposed at the bottom of the backside contact trench 79 after removal of the continuous electrically conductive material layer 46L. A backside cavity 79' is present within each backside contact trench 79.

Figure 12A:
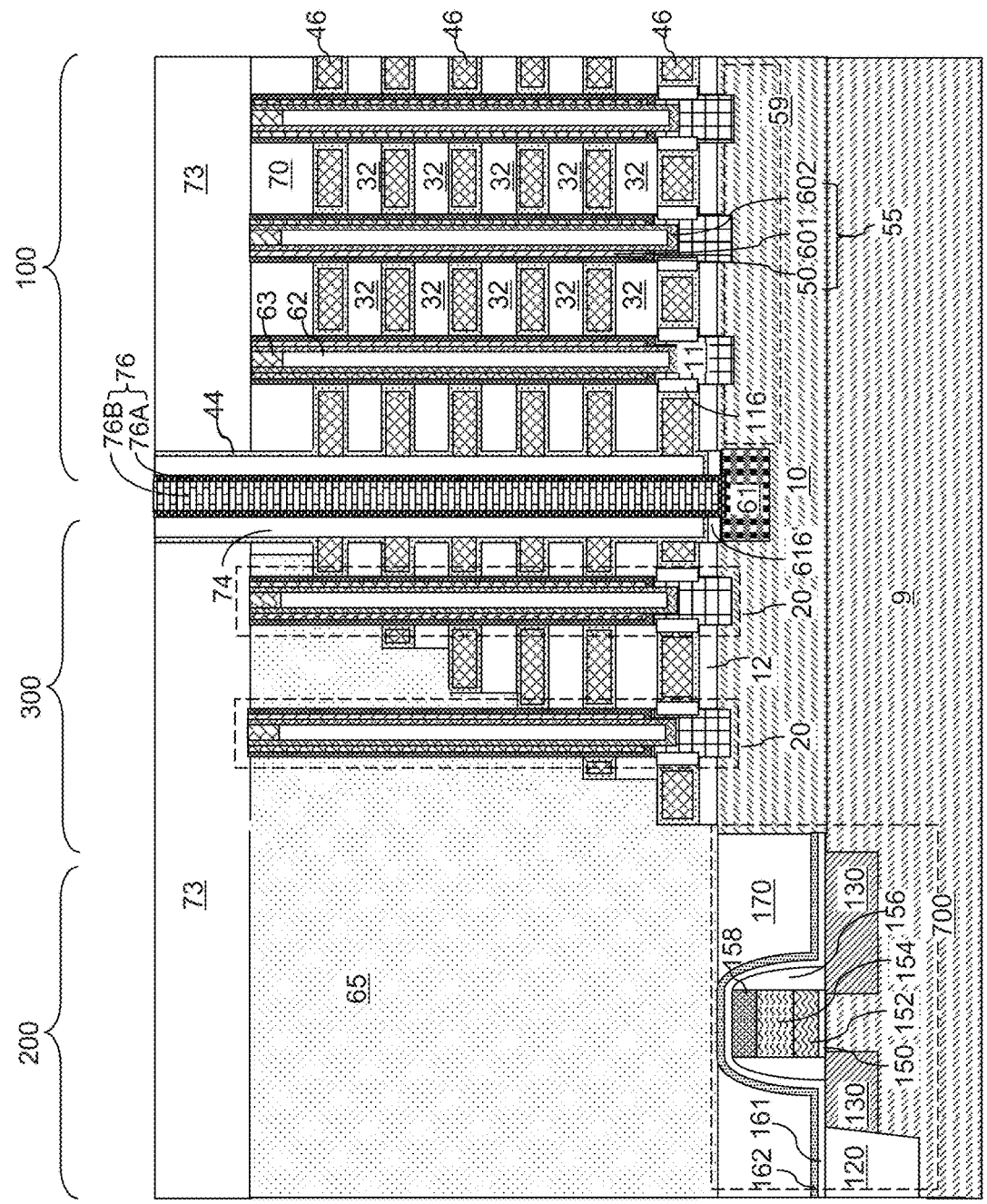
FIG. 12A is a schematic vertical cross-sectional view of the exemplary structure after formation of an insulating spacer and a backside contact structure according to an embodiment of the present disclosure.

Referring to FIGS. 12A and 12B, an insulating material layer can be formed in the at least one backside contact trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside contact trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside contact trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44. Each metallic barrier layer (as embodied as the oxygen-containing titanium compound layers 46A) contacts an outer sidewall of an insulating spacer 74.

Figure 13A:
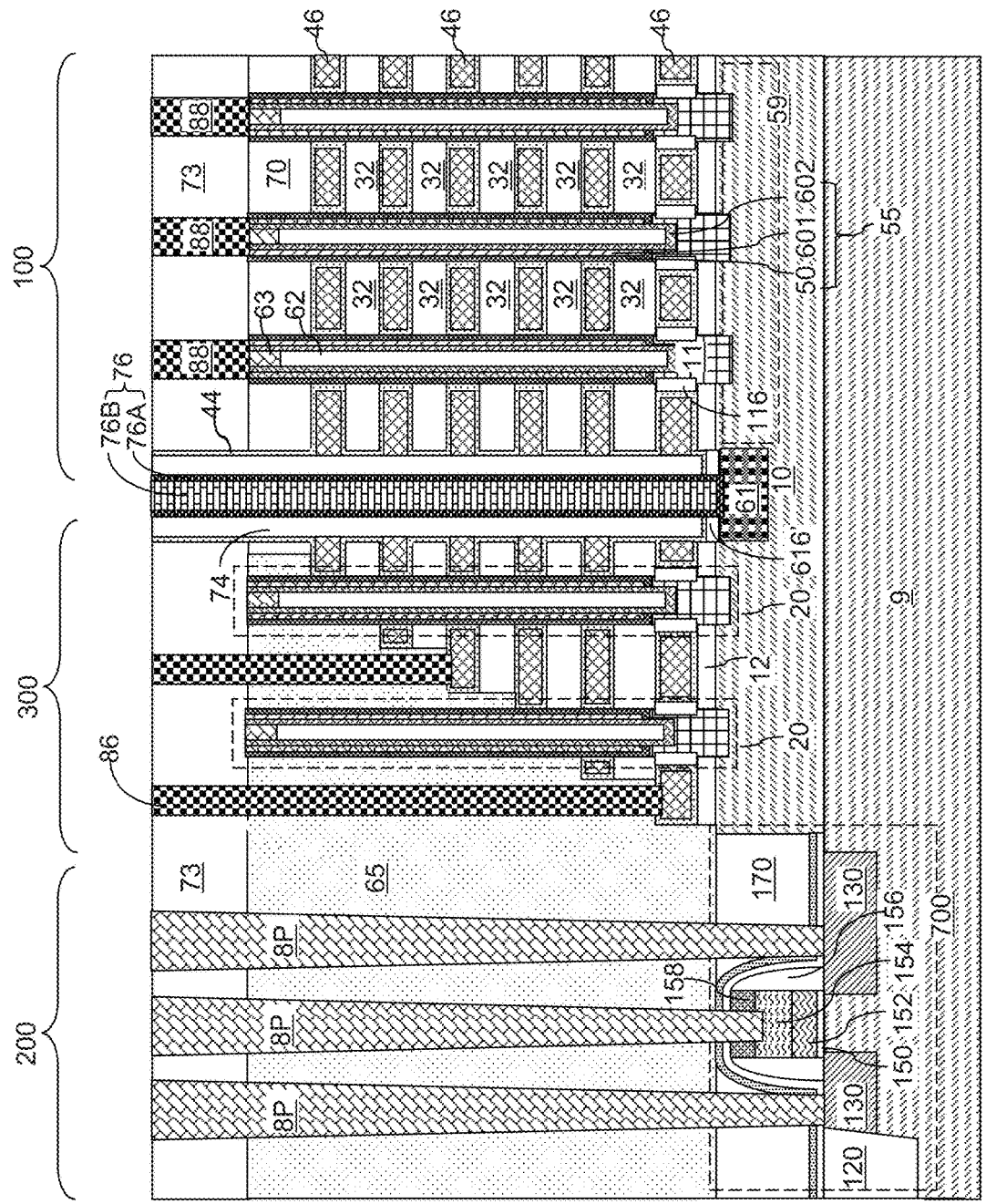
FIG. 13A is a schematic vertical cross-sectional view of the exemplary structure after formation of additional contact via structures according to an embodiment of the present disclosure.
Figure 13B:
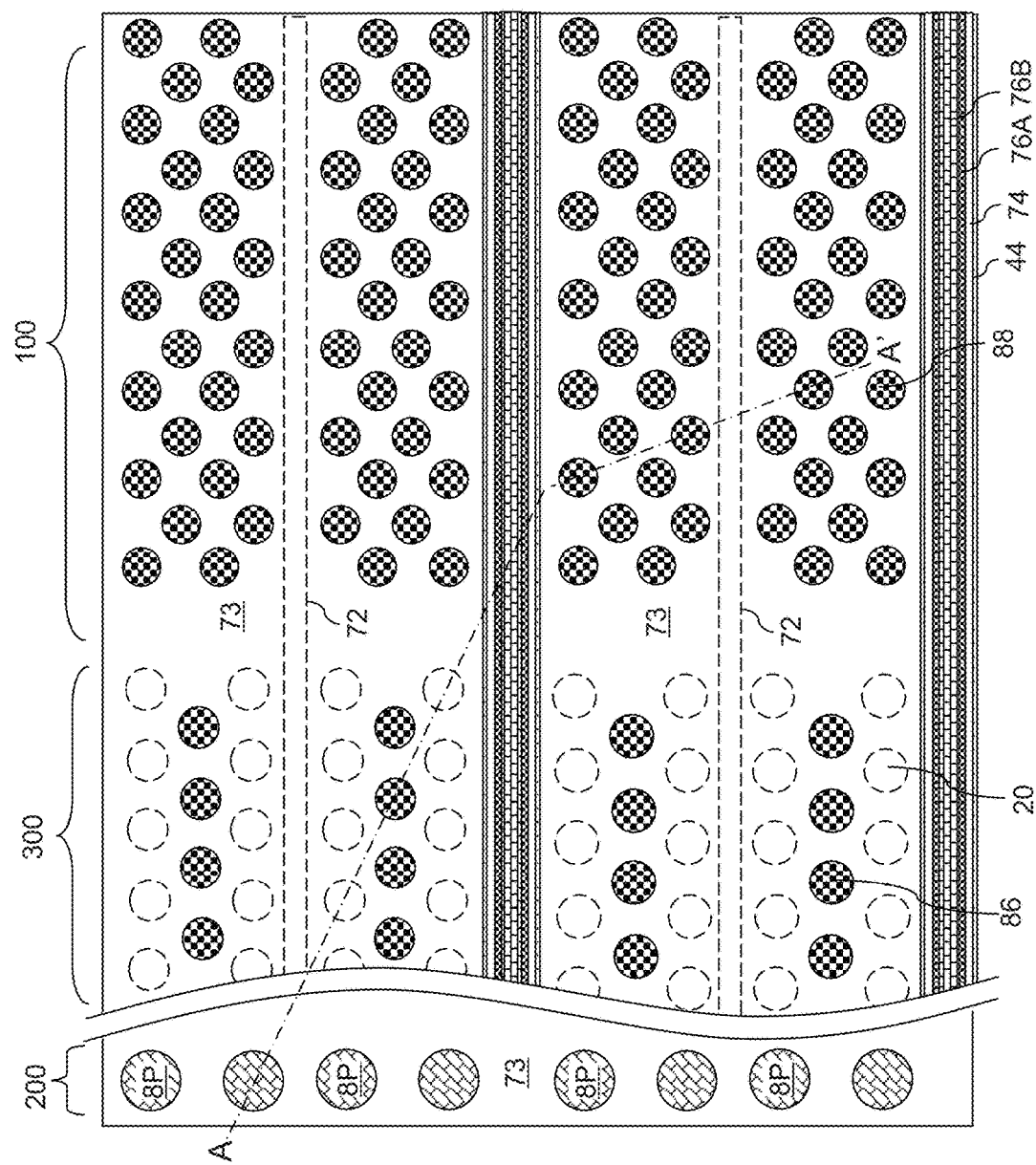
FIG. 13B is a top-down view of the exemplary structure of FIG. 13A. The plane A-A' is the plane of the vertical cross-section of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 14:
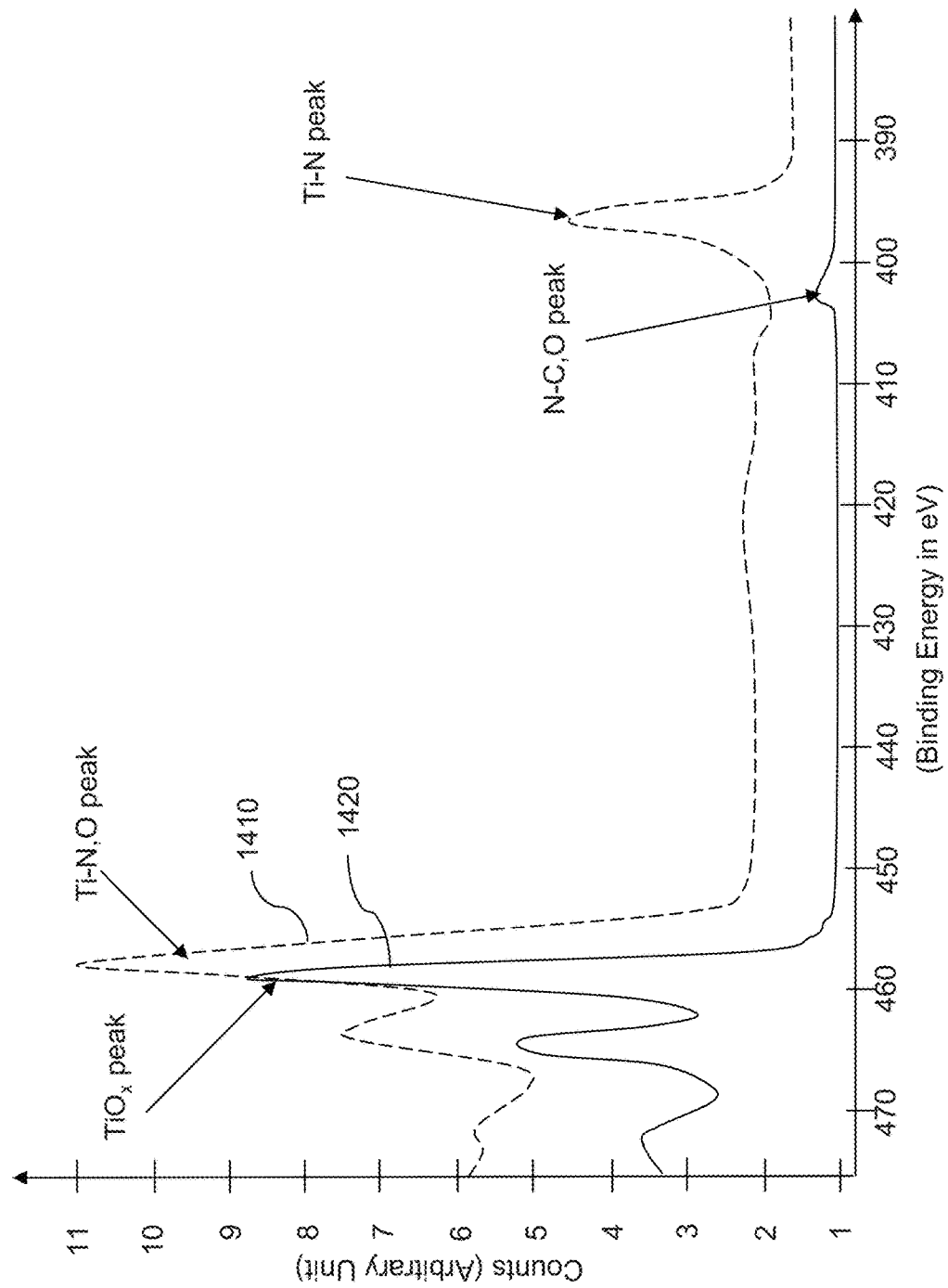
FIG. 14 illustrates X-ray photoelectron spectra (XPS) of a TiN film and a TiO film.

FIG. 14 illustrates X-ray photoelectron spectra (XPS) of a TiN film and a TiO$_x$ film. Specifically, curve 1410 shows an X-ray photoelectron spectrum of a TiN film, and curve 1420 shows an X-ray photoelectron spectrum of a TiO$_x$ film, in which x is estimated to be in a range from 1.8 to 2.0. The two X-ray photoelectron spectra show clear distinction in the locations of the peaks in the XPS. The XPS spectrum of the TiO$_x$ film shows almost no nitrogen, and all Ti is present in the form of a titanium oxide compound. Thus, most of nitrogen atoms are removed, and are replaced with oxygen atoms during the oxidation process.

Figures 15A, 15B:
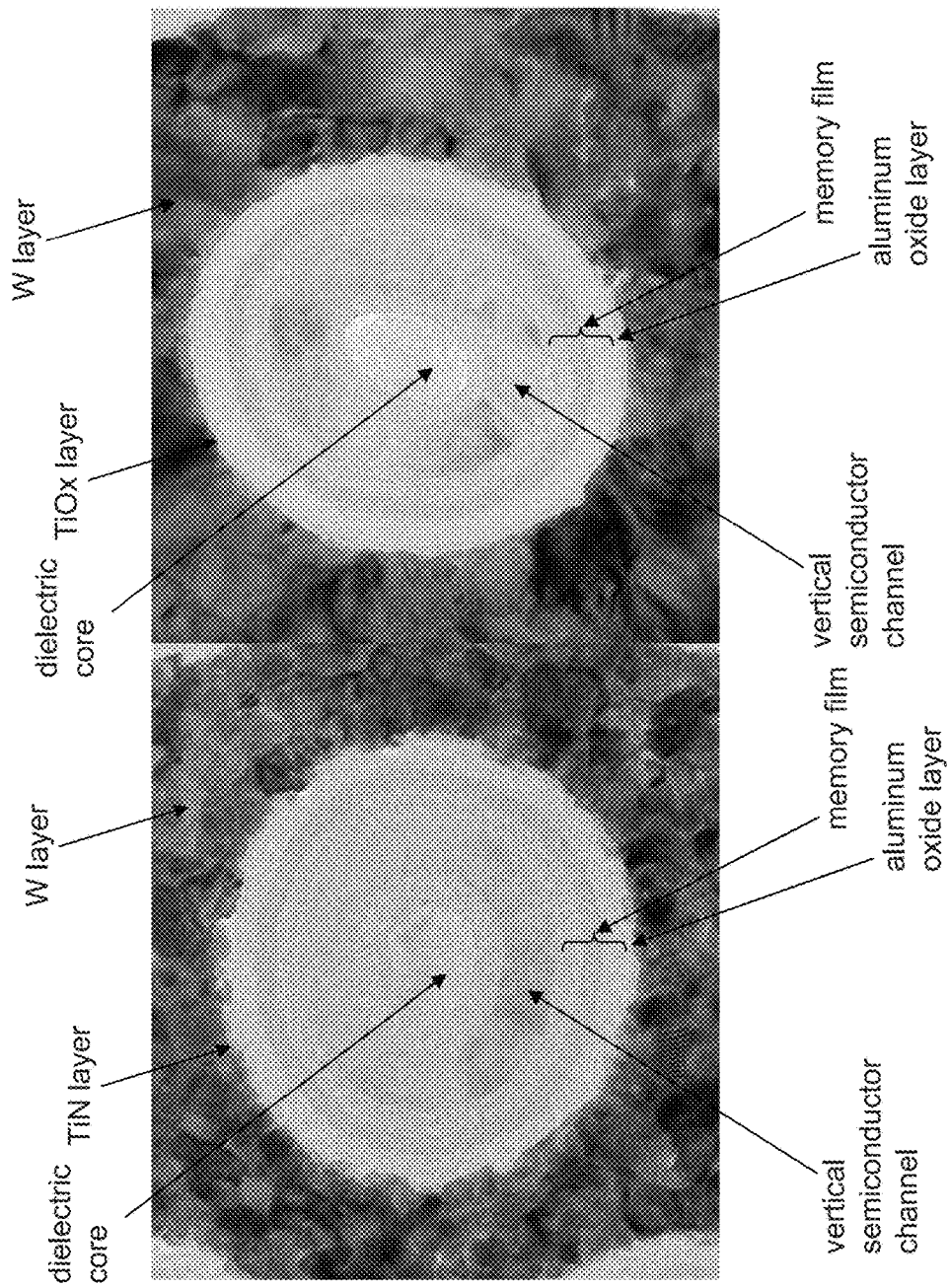
FIGS. 15A and 15B are transmission electron micrographs (TEM) of a reference structure employing tungsten a TiN film and an exemplary structure of the present disclosure that employs tungsten on a $TiO_x$ film, respectively.

FIG. 15A is a transmission electron micrograph of a memory region of a reference structure in a horizontal cross-sectional view. The reference structure is derived from the first exemplary structure by not performing the oxidation process that converts the titanium nitride layer 46T into the titanium-containing dielectric compound layer 46A, and by employing a tungsten layer deposited employing WF$_6$ as the metal fill material layer 46B. In other words, the electrically conductive layer of the reference structure includes a polycrystalline titanium nitride barrier layer and a tungsten layer including fluorine as residual atoms.

FIG. 15B is a transmission electron micrograph of a memory region of a physical embodiment of the first exemplary structure in a horizontal cross-sectional view. The physical embodiment of the first exemplary structure employs a titanium oxide layer formed by oxidation of a titanium nitride layer as the titanium-containing dielectric compound layer 46A, and by employing a tungsten layer deposited employing WF$_6$ as the metal fill material layer 46B. In other words, the electrically conductive layer of the physical embodiment of the first exemplary structure includes an amorphous titanium oxide barrier layer and a tungsten layer including fluorine as residual atoms.

Comparison of the TEM's of FIGS. 15A and 15B shows that the TiO$_x$ film provides a smoother boundary for the memory openings. FIG. 15B shows a continuous aluminum oxide layer, while FIG. 15B shows a discontinuous aluminum oxide layer, which is believed to have been caused by fluorine that diffuses through the titanium nitride layer from the tungsten layer. Tungsten average grain size is also much larger in FIG. 15B in comparison with FIG. 15A, which indicates that nucleation behavior is fundamentally changed during deposition of tungsten in an advantageous manner due to the amorphous titanium-containing compound electrically conductive barrier layer 46A of the exemplary structure. Without wishing to be bound by any particular theory, complete (or near complete) removal of residual chlorine in the TiN layer during the oxidation process may also be contributing to lower degree of attack on the aluminum oxide layer (since chlorine atoms etch aluminum oxide).

FIG. 16A shows a combined energy dispersive X-ray (EDX) profiles of the reference structure of FIG. 15A, which shows that fluorine diffuses through the titanium nitride layer into the memory stack structure because of the grain boundaries in the polycrystalline structure of the titanium nitride layer.

FIG. 16B shows a combined EDX profile of the exemplary structure of FIG. 15B, which shows that fluorine accumulates outside of the titanium-containing dielectric compound layer 46A because the fluorine atoms are effectively stopped on the side of the tungsten layer by the titanium-containing dielectric compound layer 46A.

Figures 17A, 17B:
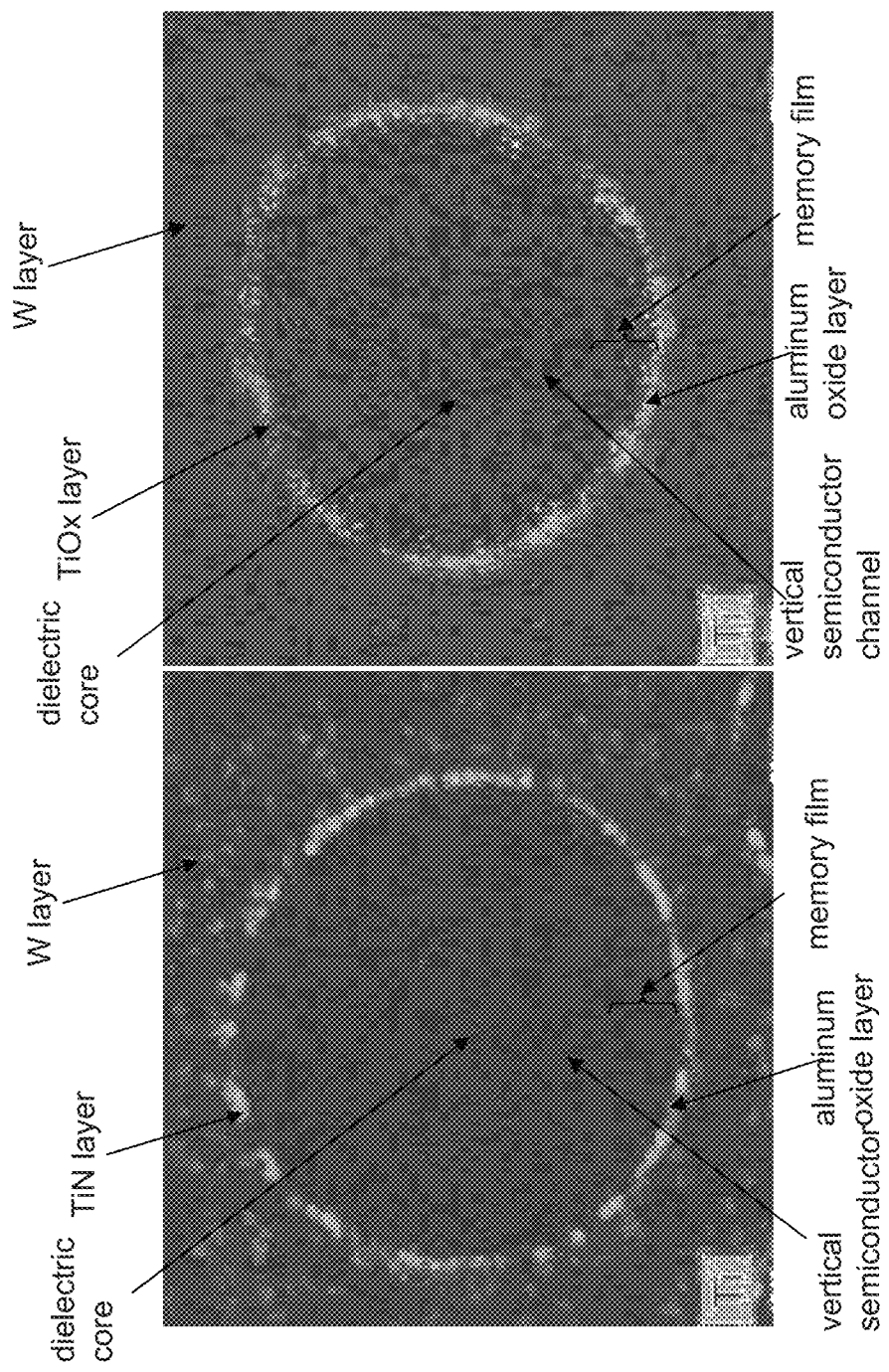
FIGS. 17A and 17B are Ti energy dispersive X-ray (EDX) profiles of the reference structure of FIG. 15A and the exemplary structure of FIG. 15B, respectively.

FIG. 17A shows a titanium component of the EDX profile of the reference structure of FIG. 15A, which shows gaps in the titanium nitride layer. Thus, the titanium nitride layer has multiple openings therein.

FIG. 17B shows a titanium component of the EDX profile of the exemplary structure of FIG. 15B, which shows the titanium-containing dielectric compound layer 46A is a continuous material layer. The titanium-containing dielectric compound layer 46A appears diffuse due to the amorphous nature of the material. Conversion of TiN to TiO$_x$ is accompanied by a volume expansion of about 30%. This means that any preexisting gaps in the TiN are filled with TiO$_x$ due to the volume expansion, provided that the gaps are not too large. This explains the more continuous nature of the TiO$_x$ barrier layer.

Figures 18A, 18B:
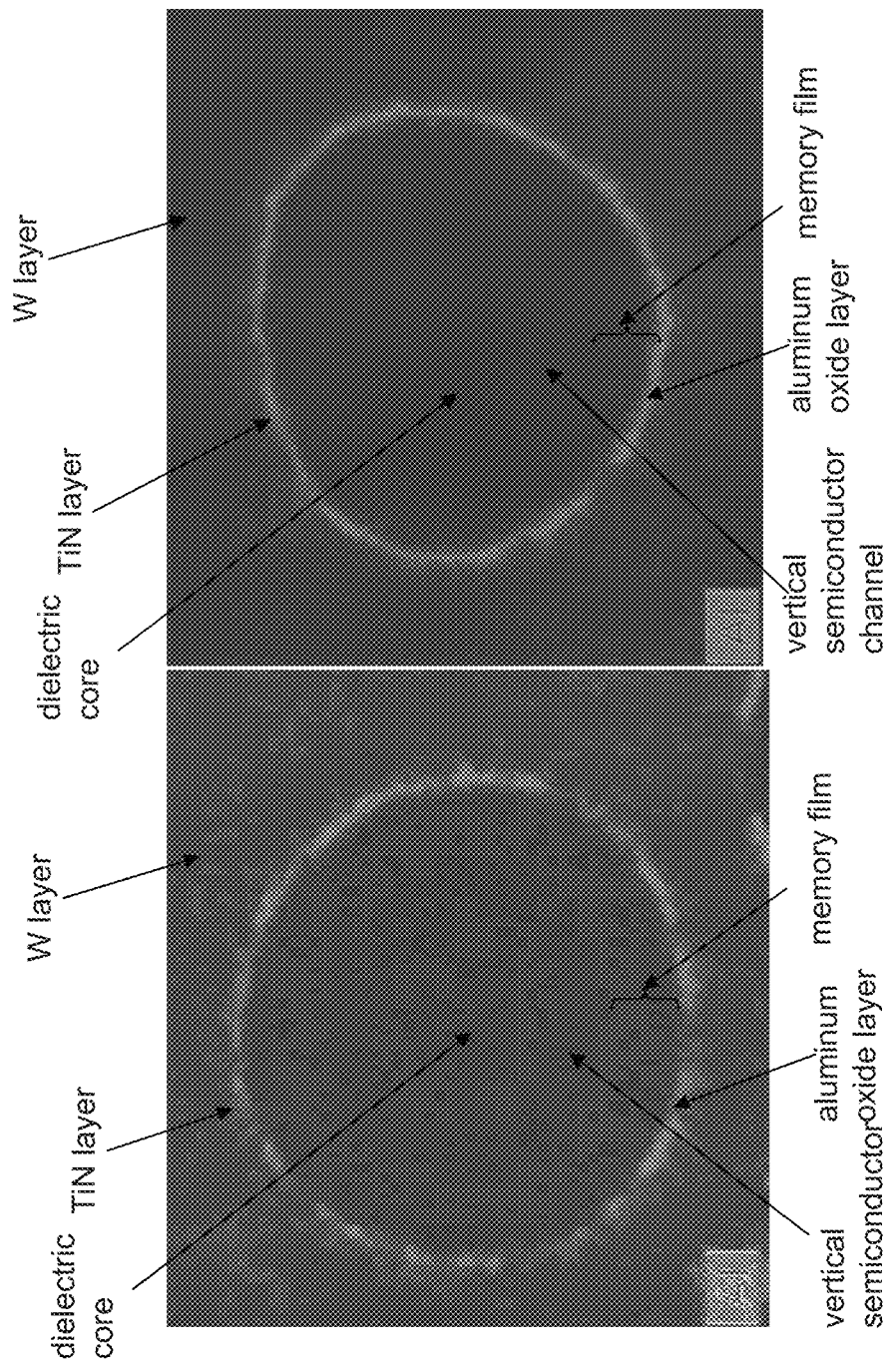
FIGS. 18A and 18B are Al energy dispersive X-ray (EDX) profiles of the reference structure of FIG. 15A and the exemplary structure of FIG. 15B, respectively.

FIG. 18A shows an aluminum component of the EDX profile of the reference structure of FIG. 15A, which shows the aluminum oxide layer, as embodied as a backside blocking dielectric layer, includes gaps.

FIG. 18B shows an aluminum component of the EDX profile of the exemplary structure of FIG. 15B, which shows a continuous aluminum oxide layer without openings therethrough. Thus, the exemplary structure provides a continuous aluminum oxide layer without a diffusion path for fluorine atoms. Less chlorine attack may also contribute to thicker aluminum oxide films.

Figures 19A, 19B:
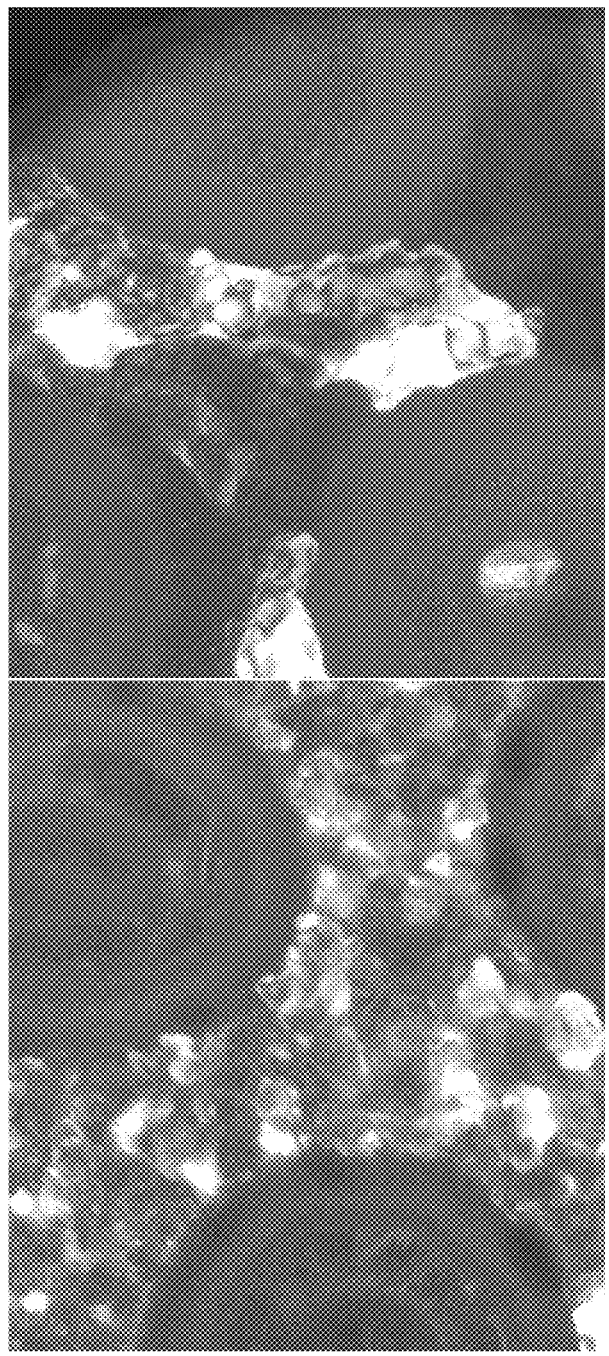
FIGS. 19A and 19B are dark field TEM images of tungsten deposited on a TiN film and tungsten deposited on a $TiO_x$ film, respectively.

FIG. 19A shows a dark field TEM image of the reference structure of FIG. 15A, which shows relatively small average grain size for the tungsten layer.

FIG. 19B shows a dark field TEM image of the exemplary structure of FIG. 15B, which shows larger average grain size for the tungsten layer.

Figures 20A, 20B:
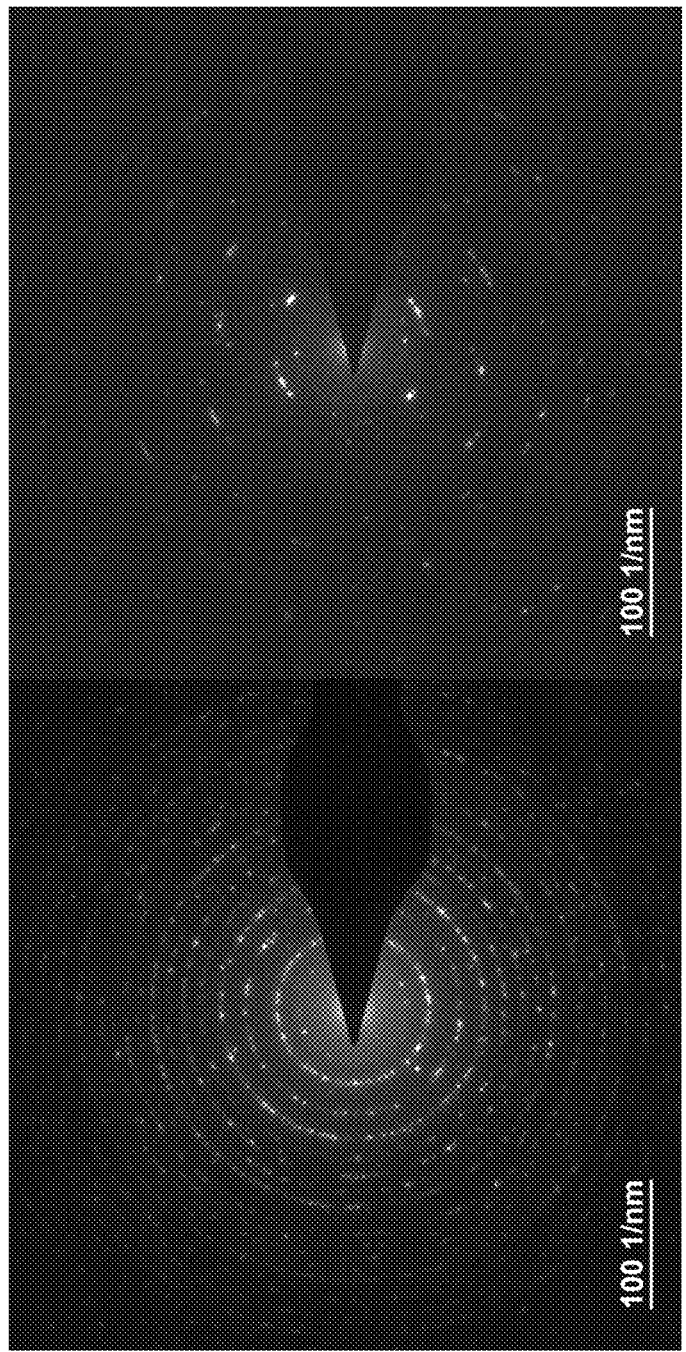
FIGS. 20A and 20B are Laue diffraction patterns of tungsten on a TiN film and tungsten on a $TiO_x$ film, respectively.

FIG. 20A shows a selective area electron diffraction pattern of the reference structure of FIG. 15A, which shows diffuse background, indicating the relatively small grains for the tungsten layer.

FIG. 20B shows a selective area electron diffraction pattern of the exemplary structure of FIG. 15B, which shows dark background and a discontinuous pattern with a small number of diffraction peaks, indicating relative few grain orientations and large grain sizes of the tungsten layer. In one embodiment, the tungsten comprises a tungsten electrode of a semiconductor device and the barrier layer comprises a barrier for the tungsten electrode. In one embodiment, the tungsten electrode comprises a word line or a source line of a memory device, such as a three dimensional NAND memory device described above, or any other suitable device. A resistivity of the tungsten drops by more than 40%, such as 41 to 50% in contact with the amorphous barrier layer, which is believed to be due to the larger grain size of the tungsten compared to the tungsten formed on crystalline TiN barrier layer of the prior art. A resistivity of the tungsten is less than 15 μΩ·cm, such as 12.7 to 14 μΩ·cm in contact with the barrier layer (as opposed to 24 to 25 μΩ·cm without contacting the titanium oxide or oxynitride barrier layer.

According to the first embodiment of the present disclosure, a barrier layer for a refractory metal or a transition metal is provided. The barrier layer comprises titanium oxide or titanium oxynitride. The titanium oxide or oxynitride is preferably amorphous. The barrier layer may be formed by oxidizing a titanium nitride barrier layer to form an oxidized titanium nitride barrier layer which may have a composition of $TiO_x$ where x may be 2, less than 2, or greater than 2. The barrier layer may also contain some residual nitrogen or may be substantially nitrogen free (e.g., less than 2 atomic percent nitrogen, such as 0.1 to 1.3 atomic percent nitrogen). The refractory metal may comprises tungsten, such as tungsten deposited without fluorine or tungsten deposited using a fluorine containing source, such as tungsten hexafluoride. The tungsten comprises a layer which contacts the barrier layer.

The TiN barrier material of prior art does not sufficiently prevent diffusion of F based gases to inner layers of the memory film. This leads to backside blocking dielectric (e.g., $Al_2O_3$) and silicon oxide blocking dielectric attack and makes the word line (WL)/memory opening (MH) interface rougher. It is believed that TiN contains columnar grains. F containing gases can quickly diffuse through the TiN grain boundaries, leading to barrier breakdown. Further, the TiN barrier material of prior art includes chlorine at a significant concentration, and is prone to attack, and cause damage to, aluminum oxide.

The use of amorphous barrier material such as $TiO_x$ or TiON (Ti oxynitride) can reduce grain boundaries and eliminate a primary diffusion pathway for F. $TiO_x$ or TiON is also conducting which helps keep WL resistance low. $TiO_x$ or TiON can easily be formed by oxidizing existing TiN barrier layer or by directly depositing this barrier layer after the backside blocking dielectric (e.g., alumina) deposition. The amorphous barrier layer can be made thinner than the crystalline barrier layer due to its improved barrier property to offset an increase in resistivity of the amorphous material compared to the crystalline material.

The resistivity of W deposited on TiOx is much lower than that of W deposited on TiN (12.7 vs. 25 μΩ·cm) as measured on a blanket $TiN/AlO_x/SiO_2$ stack. The near 50% resistivity reduction is significant considering the low thickness of word lines. The decrease of W resistivity is believed to be due to larger W grain size for W deposited on the $TiO_x$ layer. Thus, the $TiO_x$ layer can minimize F diffusion to the memory stack structures during W deposition. This provides greater protection for alumina and other memory film 50 and channel 60 layers. Significant tungsten grain size increase accompanied by 50% resistivity reduction may be obtained with the $TiO_x$ layer. Similar or greater benefits can be expected for TiON (since N can provide added F diffusion capability).

According to a second embodiment of the present disclosure, an electrically conductive (e.g., metallic) barrier layer can consist essentially of an amorphous compound including a ternary transition metal nitride. The ternary transition metal nitride can consist essentially of a first element of a transition metal element, a second element of nitrogen, and a third element different from the first and second elements. As such, the ternary transistor metal nitride can be a ternary transition metal nitride. The metallic barrier layer of the second embodiment can be formed in lieu of the titanium-containing dielectric compound layer 46A. Specifically, the processing steps of FIGS. 9B and 9C can be replaced with processing steps for forming an amorphous ternary transition metal nitride layer. Without wishing to be bound by a particular theory, it is believed that that the W grains are large on titanium oxide principally because titanium oxide is amorphous. It is generally seen that the grain growth of films deposited on a crystalline substrate are constrained by the regular atomic arrangement of the underlying crystalline substrate, but if the substrate is amorphous the overlying film is free to arrange itself in the most energetically favorable configuration, which is its crystalline state with large grains. In general, ternary nitrides are amorphous, so they should also lead to large grain W by the same mechanism as what is seen for titanium oxide which is an amorphous material.

Referring to FIG. 21A, a process of forming an amorphous ternary transition metal nitride layer according to the second embodiment of the present disclosure is shown. The process of FIG. 21A can be derived from the structure of FIG. 9A by depositing a first layer 462 including a compound of the first element and the second element (i.e., nitrogen) and a second layer 464 including the third element, by any suitable method, such as atomic layer deposition.

In one embodiment, the third element can be a Group IIIA element or a Group IVA element. For example, the third element can be Si, Ge, Al, B, or C. Alternatively, the third element can be V or Sr. The first element can be Ta, Ti, or W. The thickness of the first layer 462 can be in a range from 0.5 nm to 3 nm, and the thickness of the second layer 464 can be in a range from 0.5 nm to 3 nm, although lesser and greater thicknesses can also be employed. The thickness of the first layer 462 and the second layer 464 can be selected such that complete interdiffusion between the first layer 462 and the second layer 464 can be induced during a subsequent anneal process to form a single homogenous film after the anneal process. Optionally, at least one additional instance of the first layer 462 and/or at least one additional instance of the second layer 464 can be formed after formation of the first layer 462 and the second layer 464. The total thickness of all instances of the first layer 462 and the second layer 464 can be in a range from 2 nm to 8 nm, although lesser and greater thicknesses can also be employed.

Referring to FIG. 21B, an anneal process at an elevated temperature (such as a temperature in a range from 600 degrees to 1,000 degrees) can be performed to induce interdiffusion of atoms between the first layer(s) 462 and the second layer(s) 464. A homogenous material layer including the amorphous compound of the ternary transition metal nitride can be formed, which is herein referred to as an amorphous ternary transition metal nitride layer 146A. The amorphous ternary transition metal nitride layer 146A is a metallic barrier layer that functionally replaces the titanium-containing dielectric compound layer 46A of the first embodiment. In one embodiment, the amorphous ternary transition metal nitride layer 146A can include an amorphous compound selected from TiSiN, TiGeN, TiAlN, TiVN, TiSrN, TiCN, TiBN, TaSiN, TaAlN, WSiN, WCN, and WBN. It should be noted that the above short hand acronyms for the compounds (i.e., alloys) do not imply a 1:1:1 atomic ratio. Instead, the above compounds can have the following formula: $(M_{1-x}A_x) N_{1+/-\delta}$, where $0.04<x<0.2$, such as $0.06<x<0.1$, and $0\leq\delta\leq0.01$. The symbol M includes Ti, Ta and/or W, and the symbol A includes Si, Ge, Al, V, Sr, C and/or B.

Alternatively, the amorphous ternary transition metal nitride layer 146A may be deposited in a single deposition process by providing each of the three elements within the amorphous ternary transition metal nitride layer 146A in a reaction gas stream.

Subsequently, the processing steps of FIGS. 9D and 10 can be performed to form a metal fill material layer 46B within remaining volumes of the backside recesses 43. The metal fill material layer 46B can be the same as in the first embodiment.

The amorphous ternary transition metal nitride layer 146A can include any of the amorphous compounds described below.

In one embodiment, the amorphous ternary transition metal nitride layer 146A can include TiSiN (e.g., $(Ti_{1-x}Si_x)N_{1+/-\delta}$). An amorphous TiSiN layer can be formed by employing a TiN layer as the first layer 462 and an amorphous silicon layer as the second layer 464. The thickness of each TiN layer can be in a range from 0.5 nm to 2 nm (such as from 0.8 nm to 1.2 nm), and the thickness of each amorphous silicon layer can be in a range from 0.5 nm to 1.2 nm ((such as from 0.8 nm to 1.0 nm). Multiple repetitions of the TiN layer and the amorphous silicon layer may be employed. The intermediate amorphous silicon layer interrupts grain boundaries of the TiN layer(s), and removes continuous grain boundary pathway for F diffusion. The stack of the at least one TiN layer and the at least one amorphous silicon layer can be annealed to form a homogenous amorphous film.

In one embodiment, the atomic percentage of silicon in TiSiN can be in a range from 4% to 20%, such as from 6% to 10%, although lesser and greater atomic percentages of silicon can be employed. The atomic percentage of titanium can be in a range from 30% to 46%, such as 40-44%. The atomic percentage of nitrogen atoms can be in a range from 40% to 50%. An amorphous TiSiN layer can be formed by introducing a silane or disilane pulse between a $TiCl_4$ pulse and an $NH_3$ pulse in an atomic layer deposition. The deposited TiSiN remains amorphous below 650 degrees Celsius. Additional nitrogen atoms can be introduced into the TiSiN film employing an anneal in an environment include $NH_3$ or $N_2$ to further enhance barrier properties.

In one embodiment, the amorphous ternary transition metal nitride layer 146A can include TiAlN. The TiAlN compound exhibits amorphous structure in a manner similar to TiSiN. An amorphous TiAlN layer can be formed by an atomic layer deposition process that employs TiCl4, NH3, and trimethylaluminum as precursor gases. A TiAlN film functions as a better diffusion barrier material for fluorine than a TiN film of the same thickness, and exhibits better thermal stability compared to a TiN layer, which is a polycrystalline film.

In one embodiment, the amorphous ternary transition metal nitride layer 146A can include other amorphous titanium-containing ternary compounds such as TiVN, TiSrN, TiCN, TiBN, and TiGeN.

In one embodiment, the amorphous ternary transition metal nitride layer 146A can include an amorphous tantalum-containing ternary compound such as TaAlN or TiSiN. An amorphous TaAlN film can be deposited by an atomic layer deposition process employing a precursor for Ta, a precursor for aluminum (such as $AlCl_3$ or trimethylaluminum), and a nitrogen-containing gas (such as $NH_3$). An amorphous TaSiN film can be formed by various methods including atomic layer deposition.

In one embodiment, the amorphous ternary transition metal nitride layer 146A can include an amorphous tungsten-containing ternary compound such as WBN, WSiN, or WCN. An amorphous tungsten-containing ternary compound can be deposited by an atomic layer deposition process employing a precursor for W, a precursor for boron, silicon, or carbon, and a nitrogen-containing gas (such as $NH_3$).

Referring to FIG. 22, fluorine concentrations within a first film stack from a prior art structure and within a second film stack according to an embodiment of the present disclosure are shown, which were determined by secondary ion mass spectroscopy. The first film stack included a tungsten layer, a TiN barrier layer, and a silicon oxide layer. The second film stack included a tungsten layer, a WCN barrier layer, and a silicon oxide layer. The fluorine concentration in the first film is shown by a first curve 2010, and the fluorine concentration in the second film is shown by a second curve 2020. The WCN barrier layer according to an embodiment of the present disclosure provides superior protection against fluorine diffusion at a same thickness.

Figure 23:
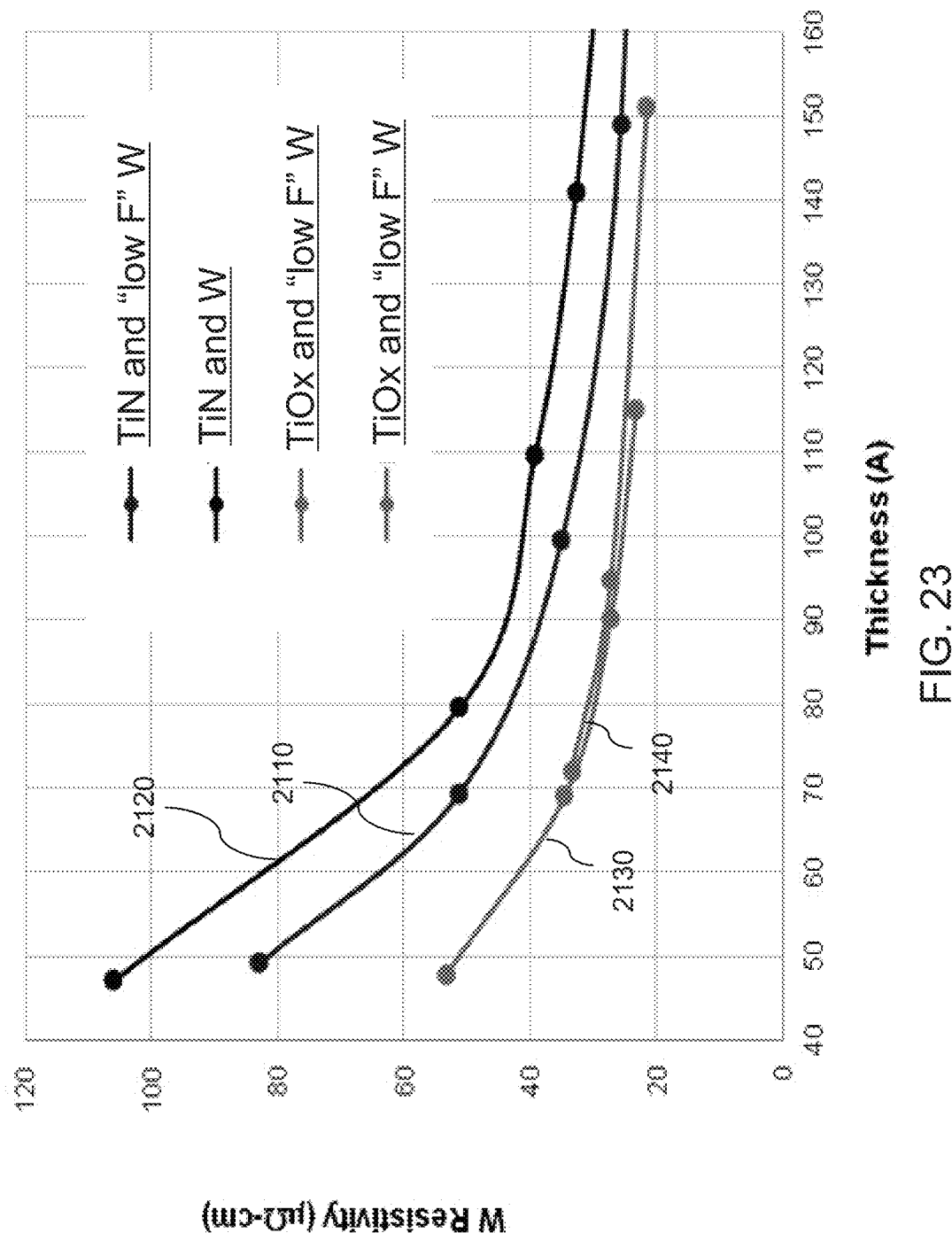
FIG. 23 is a comparison of electrical resistivity of tungsten as measured on various barrier metal layers.

FIG. 23 is a comparison of electrical resistivity of tungsten as measured on various barrier metal layers. The first curve 2110 and the second curve 2120 show the bulk resistivity of tungsten (using low fluorine and high fluorine sources, respectively) that nucleated on two different TiN barrier layers. The third curve 2130 and the fourth curve 2140 show the bulk resistivity of low fluorine tungsten that nucleated on WCN barrier layers. The amorphous nature of the amorphous ternary transition metal nitride layer 146A of the present disclosure is conductive to formation of large crystalline grains during tungsten deposition, which results in lower bulk electrical resistivity.

FIG. 23 shows lower net resistivity for W on WCN (vs. TiN) barrier. However, the principal reason for this feature is that the WCN layer is thinner, and thus, the contribution of the barrier to the overall resistivity from the barrier itself is lower. The reason the WCN layer is thinner is because the WCN layer is an intrinsically better barrier. Thus, the required thickness for the WCN layer to prevent F diffusion is lower compared to the required thickness for TiN (whose barrier properties are not as good so it has to be made thicker). Also, there may be a contribution from larger grain sizes.

According to various embodiments of the present disclosure, a three-dimensional memory device is provided, which includes an alternating stack (32, 46) of insulating layers 32 and electrically conductive layers 46 located over a substrate (9, 10); and memory stack structures 55 extending through the alternating stack (32, 46). Each of the memory stack structures 55 comprises a memory film 50 and a vertical semiconductor channel 60 laterally surrounded by the memory film 50. Each of the electrically conductive layers 46 comprises a an electrically conductive, amorphous barrier layer (46A or 146A), which can be selected from (e.g., can consist essentially of) an amorphous compound selected from an oxygen-containing titanium compound (in the case of a titanium-containing compound material layer 46A) and a ternary transition metal nitride consisting essentially of a first element of a transition metal element, a second element of nitrogen, and a third element different from the first and second elements (as in the case of an amorphous ternary transition metal nitride layer 146A), and a metal fill material layer 46B spaced from the insulating layers 32 and the memory stack structures 55 by the metallic barrier layer (46A or 146A).

In one embodiment, each of the memory stack structures 55 comprises a charge storage layer 54 and a tunneling dielectric layer 56 that contacts a respective vertical semiconductor channel 60. In one embodiment, a backside blocking dielectric layer 44 can be located between the electrically conductive layers 46 and the insulating layers 32, and can continuously extend from a bottommost layer in the alternating stack (32, 46) to a topmost layer within the alternating stack (32, 46). In one embodiment, each of the metallic barrier layers (46A or 146A) contacts the backside blocking dielectric layer 44.

In one embodiment, drain regions 63 can contact respective vertical semiconductor channels 60. A source region 61 can be located in an upper portion of the substrate (9, 10). Semiconductor channels (59, 11, 60) can extend between the source region 61 and the drain regions 63. The semiconductor channels (59, 11, 60) include the vertical semiconductor channels 60 of the memory stack structures 55.

An insulating spacer 74 can be located at a periphery of a backside trench 79 that extends through the alternating stack (32, 46). A backside contact via structure 76 contacting the source region 61 can be located in the insulating spacer 74. Each of the metallic barrier layers (46A or 146A) can contact an outer sidewall of the insulating spacer 74.

In one embodiment, the amorphous compound can be amorphous titanium oxide. In another embodiment, the amorphous compound can be amorphous titanium oxynitride.

In one embodiment, the amorphous compound can be a ternary transition metal nitride. In one embodiment, the third element is Group IIIA element or a Group IVA element. In one embodiment, the amorphous compound can be selected from TiSiN, TiGeN, TiAlN, TiVN, TiSrN, TiCN, TiBN, TaSiN, TaAlN, WSiN, WCN, and WBN. In one embodiment, the first element can be Ti, Ta, or W, and the third element can be Si, Ge, Al, B, or C.

In one embodiment, the elemental metal of the metal fill material layer 46B can be selected from tungsten, cobalt, ruthenium, titanium, and tantalum. In one embodiment, the alternating stack (32, 46) can comprise a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46)) that continuously extend from a bottommost layer within the alternating stack (32, 46) to a topmost layer within the alternating stack (32, 46).

The exemplary structures of the present disclosure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

The various amorphous barrier layers (46A or 146A) of the present disclosure provide a superior fluorine-blocking property due to the absence of columnar grain structures that are present in TiN layers, which are employed in prior art devices. Reduction of fluorine diffusion between electrically conductive layers 46 and insulating layers 32 through use of the amorphous barrier layers (46A or 146A) of the present disclosure can provide a three-dimensional memory device with enhanced reliability and/or performance.

According to another aspect of the present disclosure, a barrier layer stack including a polycrystalline metallic barrier layer and an amorphous barrier layer can be employed to provide resistance to fluorine diffusion and to induce large grain growth during a subsequent metal deposition process that employs a fluorine-containing precursor gas for metal (e.g., tungsten) deposition. The amorphous barrier layer may, or may not, be consumed during deposition of the metal.

Referring to FIG. 24A, a region of the exemplary structure according to a first embodiment of the present disclosure is illustrated in which the crystalline barrier layer is formed over the amorphous barrier layer. The exemplary structure of the first embodiment is derived from the exemplary structure illustrated in FIG. 8 by optional deposition of a backside blocking dielectric layer 44 and subsequent deposition a first barrier layer stack (561, 564). If the backside blocking dielectric layer 44 is employed, the first barrier layer stack (561, 564) is deposited over, and directly on, the outer surfaces of the backside blocking dielectric layer 44. If the backside blocking dielectric layer 44 is not employed, the first barrier layer stack (561, 564) is deposited directly on surfaces of the insulating layers 32 and sidewalls of the memory stack structures 55.

The first barrier layer stack (561, 564) includes an amorphous barrier layer 561 and a polycrystalline metallic (i.e., electrically conductive) barrier layer 564. In one embodiment, the amorphous barrier layer 561 can be deposited over the surfaces of the insulating layers 32 and sidewalls of the memory stack structures 55, and the polycrystalline metallic barrier layer 564 can be deposited directly on the amorphous barrier layer 561.

The amorphous barrier layer 561 and the polycrystalline metallic barrier layer 564 may have different material compositions, or may have the same material composition but different crystallinity. The amorphous barrier layer 561 may be a metallic conductive amorphous material layer or a non-conductive amorphous material layer. In one embodiment, the amorphous barrier layer 561 comprises an amorphous metallic nitride material such as TiSiN, TiCN, TiBN, TiAlN, WCB, WBN, TiGeBN, amorphous TiN, an alloy thereof, or a layer stack thereof. In another embodiment, the amorphous barrier layer 561 comprises an amorphous metal oxide such as $TiO_x$ and $TaO_y$, in which x is in a range from 1.7 to 2.3 and y is in a range from 1.8 to 2.8. In yet another embodiment, the amorphous barrier layer 561 comprises silicon nitride, i.e., $Si_3N_4$.

The amorphous barrier layer 561 can be deposited employing a conformal deposition process such as low pressure chemical vapor deposition (LPCVD) or atomic layer deposition. In one embodiment, the amorphous barrier layer 561 may be formed by at least one cycle of a deposition step that deposits one or more metallic or non-metallic monolayers, and a subsequent nitridation or oxidation step in which the one or more metallic or non-metallic monolayers are nitrided or oxidized. Multiple cycles of the deposition step and the nitridation or oxidation step may be repeated. For example, the amorphous barrier layer 561 may be a titanium oxide amorphous barrier layer formed using chlorine free precursors, such as tetrakis(dimethylamido) titanium (TDMAT). Using Cl free precursors has the benefit of reduced attack on the underlying alumina film, which may be etched by Cl containing gases. The amorphous barrier layer 561 may be formed as a continuous material layer that covers 100% of the underlying surfaces (which may include surfaces of the backside blocking dielectric layer 44 or surfaces of the insulating layers 32 and sidewalls of the memory stack structures 55), or may cover less than 100% (such as from 50% to 99%), where the percentage covered is the covered area divided by the total area of the underlying surfaces. The average thickness of the amorphous barrier layer 561 may be in a range from 0.5 nm to 4 nm, such as from 0.7 nm to 3 nm, although lesser and greater average thicknesses can also be employed.

In one embodiment, the polycrystalline metallic barrier layer 564 includes a polycrystalline metallic conductive material. In one embodiment, the polycrystalline metallic barrier layer 564 comprises a material selected from TiN, TaN, WN, Ti, and Ta, an alloy thereof, and a layer stack thereof. The polycrystalline metallic barrier layer 564 can be deposited employing a conformal deposition process such as low pressure chemical vapor deposition (LPCVD) or atomic layer deposition. In one embodiment, the polycrystalline metallic barrier layer 564 may be formed by at least one cycle of a deposition step that deposits one or more metallic monolayers, and a subsequent nitridation in which the one or more metallic or non-metallic monolayers are nitrided. Multiple cycles of the deposition step and the nitridation step may be repeated. The polycrystalline metallic barrier layer 564 can be formed as a continuous material layer. The average thickness of the polycrystalline metallic barrier layer 564 may be in a range from 0.5 nm to 3 nm, such as from 0.7 nm to 2 nm, although lesser and greater average thicknesses can also be employed.

Subsequently, a metal fill material layer can be deposited directly on the polycrystalline metallic barrier layer 564, as shown in FIG. 24B. FIGS. 25A-25D sequentially illustrate a portion of a backside recess 43 during formation of an electrically conductive layer 46 on the exemplary structure illustrated in FIG. 24A.

Figure 25B:
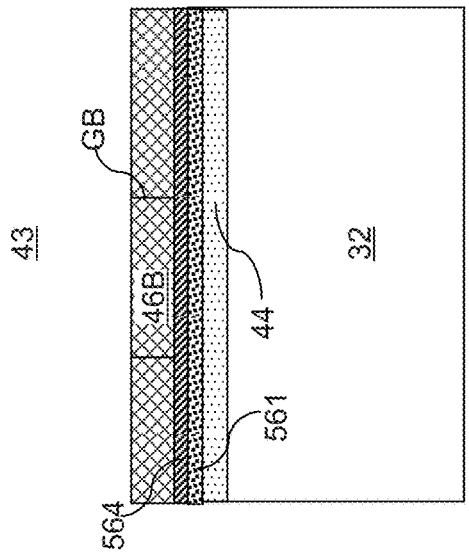
FIGS. 25A-25D are sequential magnified views of a portion of a backside recess during formation of an electrically conductive layer employing the first exemplary barrier liner stack and a metal fill material layer according to the first embodiment of the present disclosure.
Figure 25D:
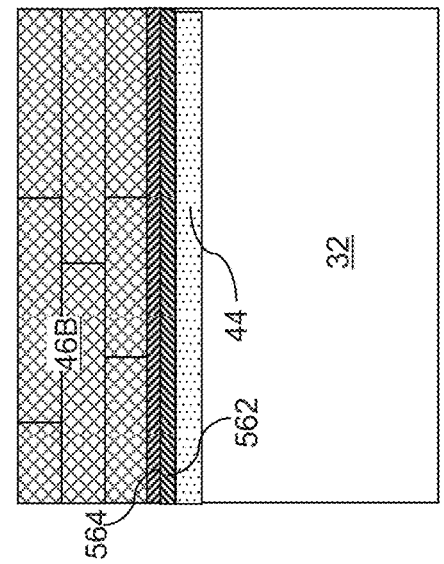
Figure 25A:
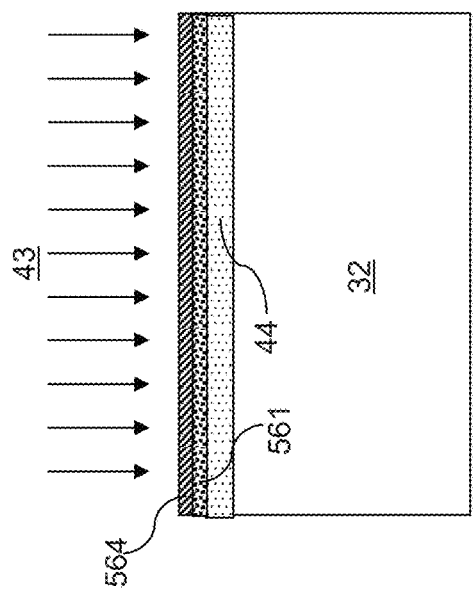

Referring to FIG. 25A, a precursor gas for deposition of a metallic material is provided into a process chamber in which the exemplary structure is loaded. The precursor gas can include molecules including a metallic element to be deposited and at least one fluorine atom. For example, if tungsten is to be deposited as the metallic material, the precursor gas can be tungsten hexafluoride, i.e., $WF_6$. Application of the precursor gas to the physically exposed surfaces of the polycrystalline metallic barrier layer 564 is schematically illustrated by the arrows.

Referring to FIG. 25B, the precursor gas decomposes on the surfaces of the polycrystalline metallic barrier layer 564 to deposit the metallic material, which may be an elemental metal such as tungsten. A chemical vapor deposition process or an atomic layer deposition process may be employed to deposit the metallic material. A metal fill material layer 46B is formed by the deposited metallic material within remaining volumes of the backside recesses 43 that remain after formation of the first barrier layer stack (561, 564). The metal fill material layer 46B is deposited directly on surfaces of the polycrystalline metallic barrier layer 564. The metal fill material layer 46B is deposited as a polycrystalline material layer having grain boundaries GB, which are schematically illustrated in FIG. 25B.

Without wishing to be bound by a particular theory, it is believed that the amorphous barrier layer 561, such as an amorphous titanium oxide layer, provides an enhanced barrier to fluorine diffusion into the memory film because the amorphous barrier layer lacks grain boundaries which are believed to be a conduit to fluorine diffusion. Furthermore, the inventors of the present disclosure experimentally confirmed that the polycrystalline metallic barrier layer 564, such as a polycrystalline titanium nitride layer, which is grown directed on the amorphous barrier layer 564 has a larger grain size than a polycrystalline metallic barrier layer grown on an underlying polycrystalline material. The larger grain size in the polycrystalline metallic barrier layer 564 reduces the number of grain boundaries and decreases the amount of fluorine diffusion through the grain boundaries of the polycrystalline metallic barrier layer 564 and decreases the resistivity of the polycrystalline metallic barrier layer 564. The large grain size of the TiN layer is desirable because the large grain size of the TiN layer reduces F diffusion due to fewer grain boundaries, and may further promote formation of a large grain tungsten layer.

Furthermore, it is believed that the electrically conductive layer 46, such as a tungsten layer, which is subsequently grown on the surface of the large grain polycrystalline metallic barrier layer 564, has improved adhesion, improved gap fill properties and a lower roughness. This is believed to result in improved device performance. The polycrystalline metallic barrier layer 564 also protects the amorphous barrier layer 561 from being etched away during the deposition of the electrically conductive layer 46 which may use a tungsten hexafluoride precursor which can etch the amorphous barrier layer 561. The inventors of the present disclosure experimentally verified that the deposited metal has lower resistivity when deposited on a large grain barrier layer (versus a small grain barrier). Without wishing to be bound by a particular theory, it is believed that a large grain size barrier material promote formation of a large grain size tungsten or other metals.

Figure 25C:
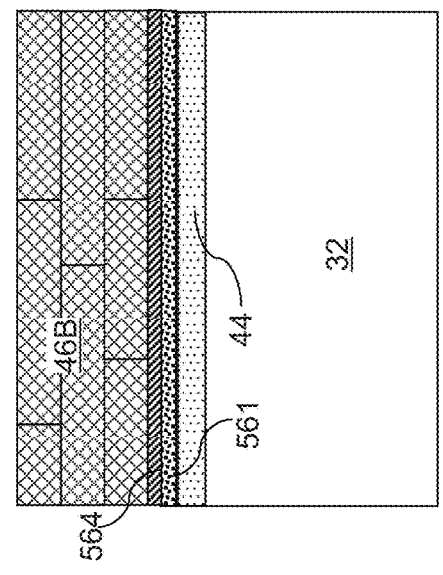

Referring to FIG. 25C, the deposition process continues until the entire remaining volumes of the backside recesses 43 are filled with the metal fill material layer 46B. A seam (not shown) may be formed at locations at which two growing surfaces of the deposited metallic material meet. The structure illustrated in FIG. 24B is formed after the deposition process that forms the metal fill material layer 46B. The exemplary structure at the step of FIG. 24B includes electrically conductive layers 46 that fill backside recesses 43 and a continuous metallic material layer 46L formed at the peripheries of the backside trenches 79 and over the contact level layer 73 (shown in FIG. 10).

Subsequently, the processing steps of FIGS. 11, 12A, and 12B can be performed to form an insulating spacer 74 and a contact via structure 76 within each backside trench 79.

Figure 26A:
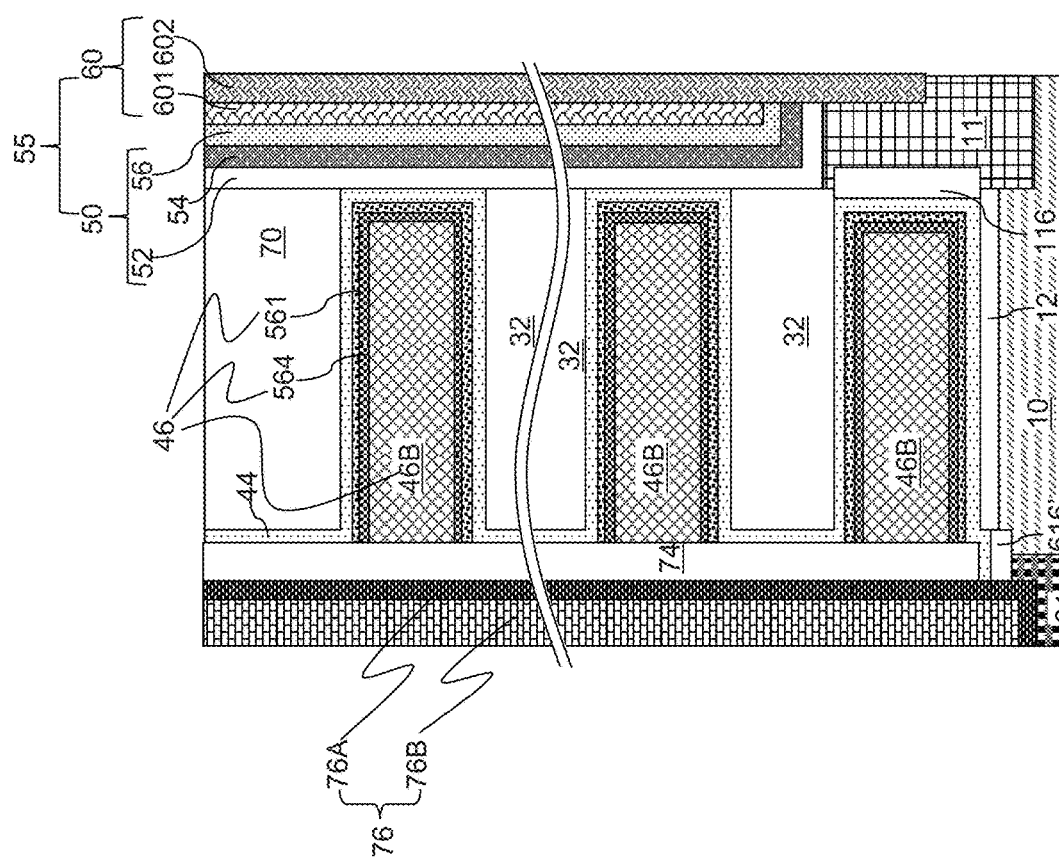
FIGS. 26A and 26B schematically illustrate a region of the exemplary structure after formation of a backside contact via structure according to the first embodiment of the present disclosure.

In one embodiment, the amorphous barrier layer 561 can include an amorphous material provided at the processing step of formation of the amorphous barrier layer 561, e.g., the processing step of FIG. 24A. FIG. 26A illustrates a region of the exemplary structure after formation of a backside contact via structure 76 in an exemplary configuration in which the amorphous barrier layer 561 is present within the exemplary structure after formation of the contact via structure 76.

Figure 26B:
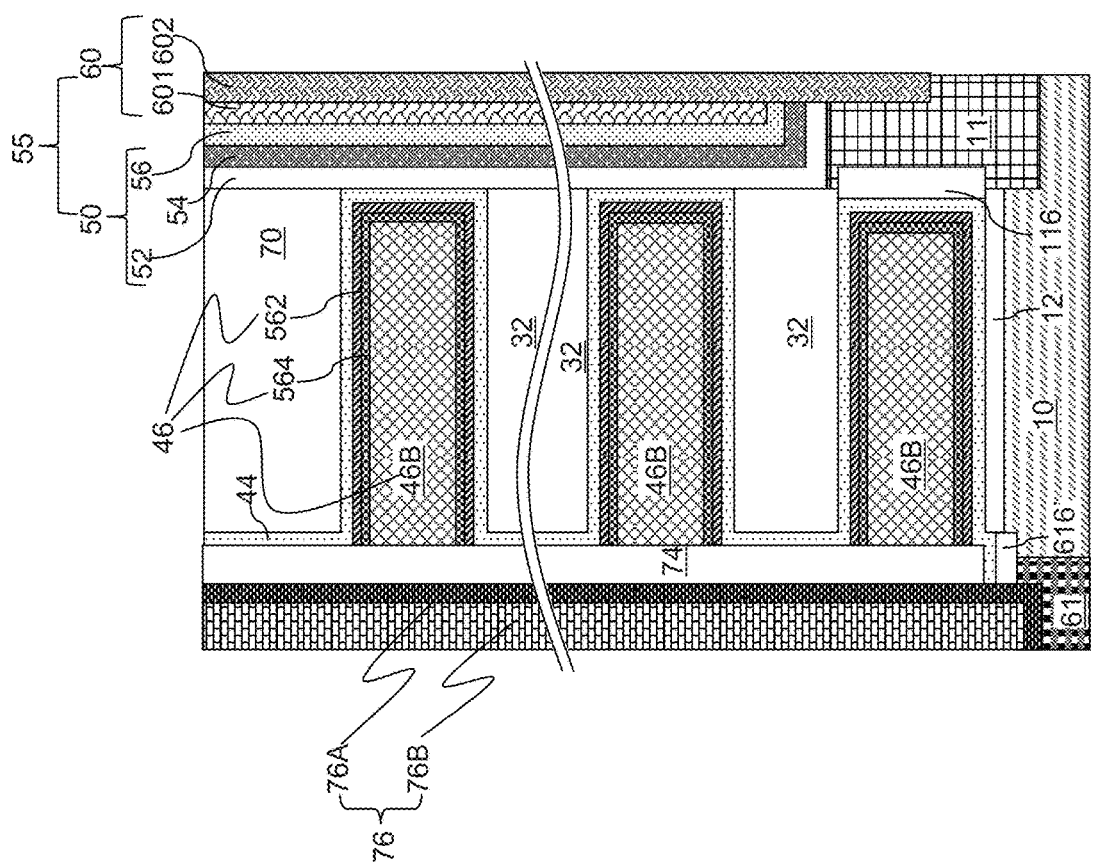

Alternatively, the amorphous barrier layer 561 may be transformed into a polycrystalline barrier layer 562 during thermal cycling that is performed on the exemplary structure (such as an anneal to decrease the resistivity of the electrically conductive layers and/or an activation anneal that activates electrical dopants in the source region 61) as illustrated in FIG. 25D. FIG. 26B illustrates a region of the exemplary structure after formation of a backside contact via structure 76 in another exemplary configuration in which the polycrystalline barrier layer 562 is present within the exemplary structure after formation of the contact via structure 76. The polycrystalline barrier layer 562 can include a material having a different composition than, or the same composition as, the material of the polycrystalline metallic barrier layer 564. The polycrystalline barrier layer 562 may include a conductive metal nitride, a non-conductive metal nitride, a conductive metal oxide, or a non-conductive metal oxide described above.

Referring to FIG. 27A, a region of the exemplary structure according to a second embodiment of the present disclosure is illustrated, in which the order of the amorphous and polycrystalline barrier layers 562, 564 is reversed compared to the first embodiment. The structure of the second embodiment is derived from the exemplary structure illustrated in FIG. 8 by optional deposition of a backside blocking dielectric layer 44 and subsequent deposition a second barrier layer stack (562, 563). If the backside blocking dielectric layer 44 is employed, the second barrier layer stack (562, 563) is deposited over, and directly on, the outer surfaces of the backside blocking dielectric layer 44. If the backside blocking dielectric layer 44 is not employed, the second barrier layer stack (562, 563) is deposited directly on surfaces of the insulating layers 32 and sidewalls of the memory stack structures 55.

The second barrier layer stack (562, 563) includes a polycrystalline metallic (i.e., electrically conductive) barrier layer 562 and an amorphous barrier layer 563. In one embodiment, the polycrystalline metallic barrier layer 562 can be deposited over the surfaces of the insulating layers 32 and sidewalls of the memory stack structures 55, and the amorphous barrier layer 563 can be deposited directly on the polycrystalline metallic barrier layer 562.

In one embodiment, the polycrystalline metallic barrier layer 562 and the amorphous barrier layer 563 may have different material compositions, or may have the same material composition but different crystallinity. The polycrystalline metallic barrier layer 562 includes a polycrystalline metallic conductive material. In one embodiment, the polycrystalline metallic barrier layer 562 comprises a material selected from TiN, TaN, WN, Ti, and Ta, an alloy thereof, and a layer stack thereof. The polycrystalline metallic barrier layer 562 can be deposited employing a conformal deposition process such as low pressure chemical vapor deposition (LPCVD) or atomic layer deposition. In one embodiment, the polycrystalline metallic barrier layer 562 may be formed by at least one cycle of a deposition step that deposits one or more metallic monolayers, and a subsequent nitridation in which the one or more metallic or non-metallic monolayers are nitrided. Multiple cycles of the deposition step and the nitridation step may be repeated. The polycrystalline metallic barrier layer 562 can be formed as a continuous material layer. The average thickness of the polycrystalline metallic barrier layer 562 may be in a range from 0.5 nm to 3 nm, such as from 0.7 nm to 2 nm, although lesser and greater average thicknesses can also be employed.

In one embodiment, the amorphous barrier layer 563 may be a metallic conductive amorphous material layer or a non-conductive amorphous material layer. In one embodiment, the amorphous barrier layer 563 comprises an amorphous metallic nitride material such as TiSiN, TiCN, TiBN, TiAlN, WCB, WBN, TiGeBN, amorphous TiN, an alloy thereof, or a layer stack thereof. In another embodiment, the amorphous barrier layer 563 comprises an amorphous metal oxide such as $TiO_x$ and $TaO_y$, in which x is in a range from 1.7 to 2.3 and y is in a range from 1.8 to 2.8. In yet another embodiment, the amorphous barrier layer 563 comprises silicon nitride, i.e., $Si_3N_4$.

The amorphous barrier layer 563 can be deposited employing a conformal deposition process such as low pressure chemical vapor deposition (LPCVD) or atomic layer deposition. The same processing step can be employed to deposit the amorphous barrier layer 563 in the second barrier layer stack (562, 563) as the amorphous barrier layer 561 in the first barrier layer stack (561, 564). The amorphous barrier layer 563 may be formed as a continuous material layer that covers 100% of the underlying surfaces of the polycrystalline metallic barrier layer 562, or may have less than 100% of coverage. The average thickness of the amorphous barrier layer 563 may be in a range from 0.5 nm to 4 nm, such as from 0.7 nm to 3 nm, although lesser and greater average thicknesses can also be employed.

Subsequently, a metal fill material layer can be deposited directly on the second barrier layer stack (562, 563), as shown in FIG. 27B. FIGS. 28A-28C sequentially illustrate a portion of a backside recess 43 during formation of an electrically conductive layer 46 on the exemplary structure illustrated in FIG. 27A.

Referring to FIG. 28A, a precursor gas for deposition of a metallic material is provided into a process chamber in which the exemplary structure is loaded. The precursor gas can include molecules including a metallic element to be deposited and at least one fluorine atom. For example, if tungsten is to be deposited as the metallic material, the precursor gas can be tungsten hexafluoride, i.e., $WF_6$. Application of the precursor gas to the physically exposed surfaces of the amorphous barrier layer 563 is schematically illustrated by the arrows. A chemical vapor deposition process or an atomic layer deposition process may be employed to deposit the metallic material.

In one embodiment, the precursor gas can etch, partly or completely, the amorphous barrier layer 563 during nucleation of a metallic material. For example, the fluorine radicals within the precursor gas can effectively etch the material of the amorphous barrier layer 563 during the nucleation stage in which clusters of the metallic material are deposited as isolated islands.

Referring to FIG. 28B, the amorphous barrier layer 563 may be completely removed during the nucleation phase of the deposition process for the metallic material, and a metal fill material layer 46B can be formed directly on the entire outer surface of the polycrystalline metallic barrier layer 562. Alternatively, discrete islands of the remaining portions of the amorphous barrier layer 563 may be present at the interface between the polycrystalline metallic barrier layer 562 and the metal fill material layer 46B. The metal fill material layer 46B is deposited as a polycrystalline material layer having grain boundaries GB.

Although a predominant portion of the amorphous barrier layer 563 is removed during nucleation of the metal fill material layer 46B, the amorphous structure of the amorphous barrier layer 563 has the effect of increasing the average grain size of the metal fill material layer 46B. Without wishing to be bound by any particular theory, it is believed that the amorphous structure of the amorphous barrier layer 563 has the effect of providing an amorphous template during nucleation of the material of the metal fill material layer 46B. In this case, the deposited metallic material of the metal fill material layer 46B can form on amorphous surfaces with larger grains. Once the amorphous barrier layer is etched away, the deposition of the metal fill material layer 46B continues from the polycrystalline metallic barrier layer 562. Without wishing to be bound by a particular theory, this is believed to form a metal fill material layer 46B with improved adhesion, improved gap fill properties and a lower roughness. The amorphous barrier layer 563 is not etched instantaneously, but stays long enough before eventual removal, which may be partial or complete, during formation of the first few large grain monolayers of tungsten (or another metal). During the deposition of such first monolayers of tungsten (or another metal), the amorphous barrier layer 563 is gradually etched. However, the material of the amorphous barrier layer 563 is not needed after formation of the first monolayers of tungsten because the large grain monolayers of tungsten that are already formed can promote formation of additional layers of large grain tungsten during the remaining part of the tungsten deposition process. Thus, the amorphous barrier layer 563 is a sacrificial component, and does not have to (although it may) exist at the end of the tungsten deposition process.

In one embodiment, the metal fill material layer 46B can be deposited with a polycrystalline structure having a greater average grain size than an average grain size within the polycrystalline metallic barrier layer 562. The polycrystalline metallic barrier layer 562 acts as a diffusion barrier for the word lines. In one embodiment, the average lateral extent of grains within the metal fill material layer 46B can be greater than the average lateral extent of grains within the polycrystalline metallic barrier layer 562 by a factor greater than 2, and/or 3, and/or 4, and/or 5.

Referring to FIG. 28C, the deposition process continues until the entire remaining volumes of the backside recesses 43 are filled with the metal fill material layer 46B. A seam (not shown) may be formed at locations at which two growing surfaces of the deposited metallic material meet. The structure illustrated in FIG. 27B is formed after the deposition process that forms the metal fill material layer 46B. The exemplary structure at the step of FIG. 27B includes electrically conductive layers 46 that fill backside recesses 43 and a continuous metallic material layer 46L formed at the peripheries of the backside trenches 79 and over the contact level layer 73 (shown in FIG. 10). Optionally, the metal fill material layer 46B can be annealed to reduce its resistivity.

Figure 29:
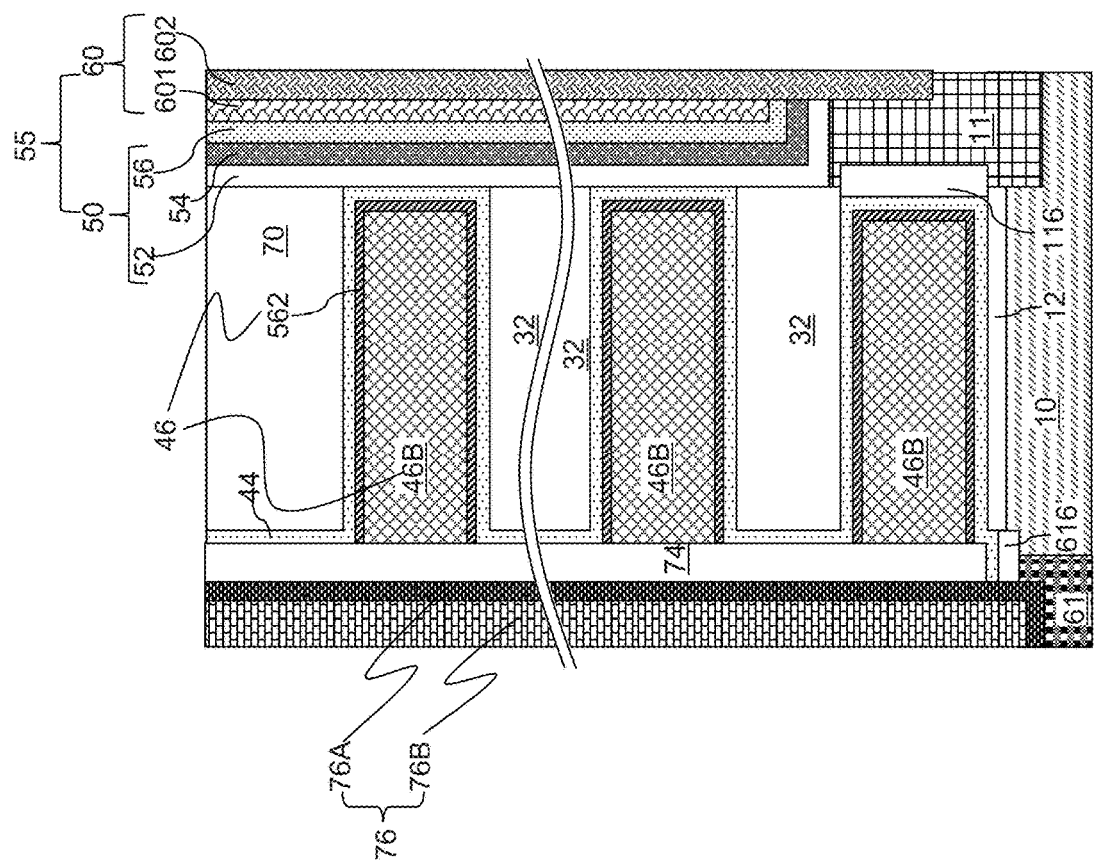
FIG. 29 schematically illustrates a region of the exemplary structure after formation of a backside contact via structure according to the third embodiment of the present disclosure.

Subsequently, the processing steps of FIGS. 11, 12A, and 12B can be performed to form an insulating spacer 74 and a contact via structure 76 within each backside trench 79. FIG. 29 illustrates a region of the exemplary structure after formation of the backside contact via structure 76.

Referring to FIG. 30A, a region of the exemplary structure according to a third embodiment of the present disclosure is illustrated, which contains two amorphous barrier layers separated by a polycrystalline barrier layer. The structure of the third embodiment is derived from the exemplary structure illustrated in FIG. 8 by optional deposition of a backside blocking dielectric layer 44 and subsequent deposition a third barrier layer stack (561, 564, 565). If the backside blocking dielectric layer 44 is employed, the third barrier layer stack (561, 564, 565) is deposited over, and directly on, the outer surfaces of the backside blocking dielectric layer 44. If the backside blocking dielectric layer 44 is not employed, the third barrier layer stack (561, 564, 565) is deposited directly on surfaces of the insulating layers 32 and sidewalls of the memory stack structures 55.

The third barrier layer stack (561, 564, 565) includes an amorphous barrier layer that is herein referred to as a first amorphous barrier layer 561, a polycrystalline metallic barrier layer 564, and a second amorphous barrier layer 565. The first amorphous barrier layer 561 within the third barrier layer stack (561, 564, 565) can be the same as the amorphous barrier layer 561 within the first barrier layer stack (561, 564), and the polycrystalline metallic barrier layer 564 within the third barrier layer stack (561, 564, 565) can be the same as the polycrystalline metallic barrier layer 564 within the first barrier layer stack (561, 564). Thus, the third barrier layer stack (561, 564, 565) can be derived from the first barrier stack (561, 564) by depositing an additional second amorphous barrier layer 565. The first amorphous barrier layer 561 can be deposited over the surfaces of the insulating layers 32 and sidewalls of the memory stack structures 55, the polycrystalline metallic barrier layer 564 can be deposited on the first amorphous barrier layer 561, and the second amorphous barrier layer 565 can be deposited directly on the polycrystalline metallic barrier layer 564.

The polycrystalline metallic barrier layer 564 can have a composition that is different from, or the same as, the composition of the first amorphous barrier layer 561 and from the composition of the second amorphous barrier layer 565. The compositions of the first and second amorphous barrier layers (561, 565) may be the same or different.

The first amorphous barrier layer 561 may be a metallic conductive amorphous material layer or a non-conductive amorphous material layer. The first amorphous barrier layer 561 can include any material that can be employed for the amorphous barrier layer 561 of the first barrier stack (561, 564), and can be formed by any of the deposition methods that can be employed to form the amorphous barrier layer 561 of the first barrier stack (561, 564). The first amorphous barrier layer 561 may be formed as a continuous material layer that covers 100% of the underlying surfaces, or may cover less than 100% of the underlying surfaces. The average thickness of the first amorphous barrier layer 561 may be in a range from 0.5 nm to 4 nm, such as from 0.7 nm to 3 nm, although lesser and greater average thicknesses can also be employed.

The polycrystalline metallic barrier layer 564 includes a polycrystalline metallic conductive material. The polycrystalline metallic barrier layer 564 can include any material that can be employed for the polycrystalline metallic barrier layer 564 of the first barrier stack (561, 564), and can be formed by any of the deposition methods that can be employed to form the polycrystalline metallic barrier layer 564 of the first barrier stack (561, 564). The polycrystalline metallic barrier layer 564 can be a continuous material layer that provides 100% coverage of the underlying first amorphous barrier layer 561. The average thickness of the polycrystalline metallic barrier layer 564 may be in a range from 0.5 nm to 3 nm, such as from 0.7 nm to 2 nm, although lesser and greater average thicknesses can also be employed.

The second amorphous barrier layer 565 can be deposited employing a conformal deposition process such as low pressure chemical vapor deposition (LPCVD) or atomic layer deposition. The same processing step can be employed to deposit the second amorphous barrier layer 565 in the third barrier layer stack (561, 564, 565) as the amorphous barrier layer 561 in the first barrier layer stack (561, 564). The amorphous barrier layer 565 may be formed as a continuous material layer that covers 100% of the underlying surfaces of the polycrystalline metallic barrier layer 564, or may have less than 100% coverage. The average thickness of the amorphous barrier layer 565 may be in a range from 0.5 nm to 4 nm, such as from 0.7 nm to 3 nm, although lesser and greater average thicknesses can also be employed.

Subsequently, a metal fill material layer can be deposited directly on the third barrier layer stack (561, 564, 565), as shown in FIG. 30B. FIGS. 31A-31D sequentially illustrate a portion of a backside recess 43 during formation of an electrically conductive layer 46 on the exemplary structure illustrated in FIG. 30A.

Figure 31A:
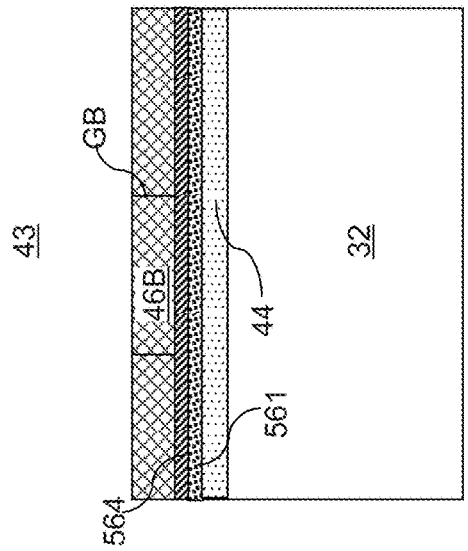
FIGS. 31A-31D are sequential magnified views of a portion of a backside recess during formation of an electrically conductive layer employing the third exemplary barrier liner stack and a metal fill material layer according to the third embodiment of the present disclosure.

Referring to FIG. 31A, a precursor gas for deposition of a metallic material is provided to a process chamber in which the exemplary structure is loaded. The precursor gas can include molecules including a metallic element to be deposited and at least one fluorine atom. For example, if tungsten is to be deposited as the metallic material, the precursor gas can be tungsten hexafluoride, i.e., $WF_6$. Application of the precursor gas to the physically exposed surfaces of the second amorphous barrier layer 565 is schematically illustrated by the arrows. A chemical vapor deposition process or an atomic layer deposition process may be employed to deposit the metallic material.

In one embodiment, the precursor gas can etch, partly or completely, the second amorphous barrier layer 565 during nucleation of a metallic material. For example, the fluorine radicals within the precursor gas can effectively etch the material of the second amorphous barrier layer 565 during the nucleation stage in which clusters of the metallic material are deposited as isolated islands.

Figure 31B:
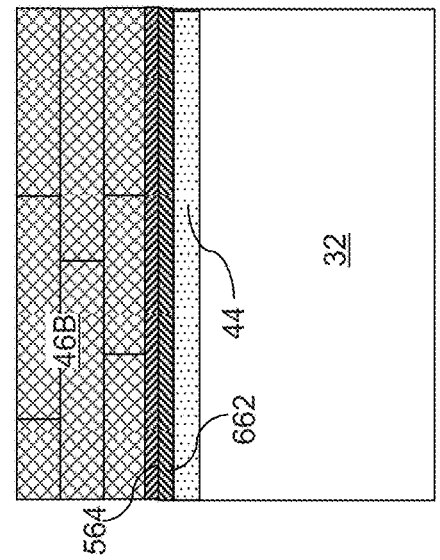

Referring to FIG. 31B, the second amorphous barrier layer 565 may be completely removed during the nucleation phase of the deposition process for the metallic material, and a metal fill material layer 46B can be formed directly on the entire outer surface of the polycrystalline metallic barrier layer 564. Alternatively, discrete islands of the remaining portions of the second amorphous barrier layer 565 may be present at the interface between the polycrystalline metallic barrier layer 564 and the metal fill material layer 46B. The metal fill material layer 46B is deposited as a polycrystalline material layer having grain boundaries GB.

Although a predominant portion of the second amorphous barrier layer 565 is removed during nucleation of the metal fill material layer 46B, the amorphous structure of the amorphous barrier layer 565 has the effect of increasing the average grain size of the metal fill material layer 46B. Without wishing to be bound by any particular theory, it is believed that the amorphous structure of the second amorphous barrier layer 565 has the effect of providing an amorphous template during nucleation of the material of the metal fill material layer 46B. In this case, the deposited metallic material of the metal fill material layer 46B can be deposited on amorphous surfaces with larger grains. Once the amorphous barrier layer 565 is etched away, the deposition of the metal fill material layer 46B continues from the polycrystalline metallic barrier layer 564. Without wishing to be bound by a particular theory, this is believed to form a metal fill material layer 46B with improved adhesion, improved gap fill properties and a lower roughness.

In one embodiment, the metal fill material layer 46B can be deposited with a polycrystalline structure having a greater average grain size than an average grain size within the polycrystalline metallic barrier layer 564. In one embodiment, the average lateral extent of grains within the metal fill material layer 46B can be greater than the average lateral extent of grains within the polycrystalline metallic barrier layer 564 by a factor greater than 2, and/or 3, and/or 4, and/or 5.

Figure 31C:
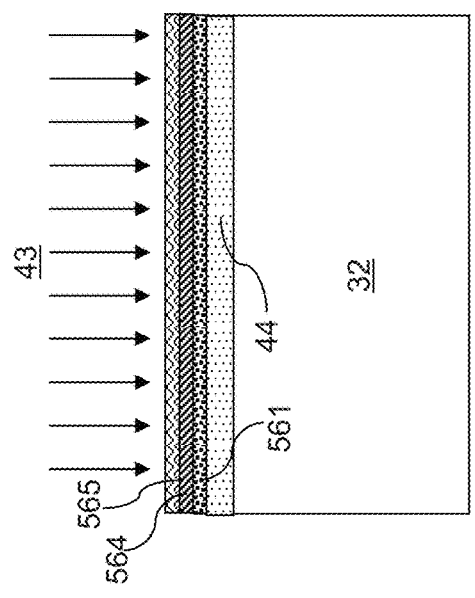

Referring to FIG. 31C, the deposition process continues until the entire remaining volumes of the backside recesses 43 are filled with the metal fill material layer 46B. A seam (not shown) may be formed at locations at which two growing surfaces of the deposited metallic material meet. The structure illustrated in FIG. 30B is formed after the deposition process that forms the metal fill material layer 46B. The exemplary structure at the step of FIG. 30B includes electrically conductive layers 46 that fill backside recesses 43 and a continuous metallic material layer 46L formed at the peripheries of the backside trenches 79 and over the contact level layer 73 (shown in FIG. 10). Optionally, the metal fill material layer 46B can be annealed to reduce its resistivity.

Subsequently, the processing steps of FIGS. 11, 12A, and 12B can be performed to form an insulating spacer 74 and a contact via structure 76 within each backside trench 79.

In one embodiment, the first amorphous barrier layer 561 can include an amorphous material as provided at the processing step of formation of the amorphous barrier layer 561, e.g., the processing step of FIG. 30A. FIG. 32A illustrates a region of the exemplary structure after formation of a backside contact via structure 76 in an exemplary configuration in which the first amorphous barrier layer 561 including an amorphous material is present within the exemplary structure after formation of the contact via structure 76.

Figure 31D:
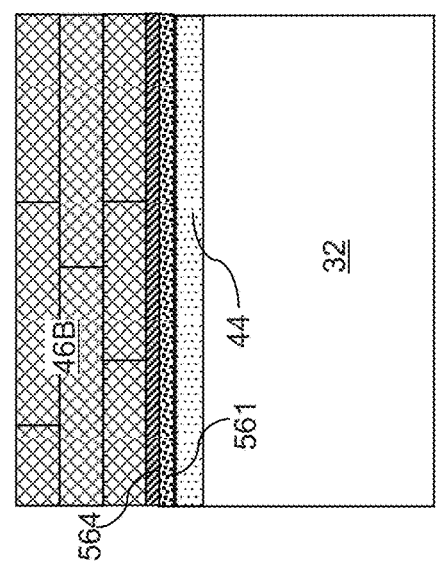
Figure 32B:
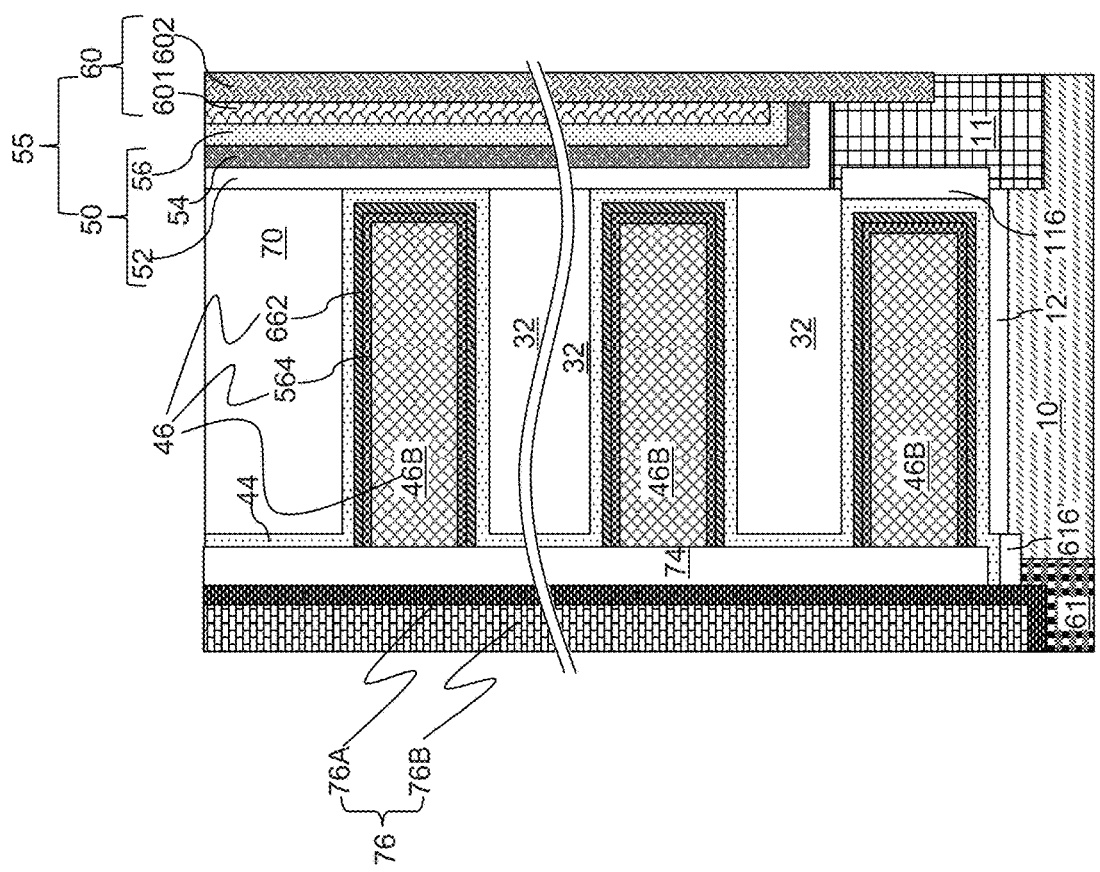

Alternatively, the first amorphous barrier layer 561 may be transformed into a polycrystalline barrier layer 662 during thermal cycling that is performed on the exemplary structure (such as an activation anneal that activates electrical dopants in the source region 61) as illustrated in FIG. 31D. FIG. 32B illustrates a region of the exemplary structure after formation of a backside contact via structure 76 in another exemplary configuration in which the polycrystalline barrier layer 662 is present within the exemplary structure after formation of the contact via structure 76. The polycrystalline barrier layer 662 can include a material having a different composition than, or the same as, the material of the polycrystalline metallic barrier layer 564. The polycrystalline barrier layer 662 may include a conductive metal nitride, a non-conductive metal nitride, a conductive metal oxide, or a non-conductive metal oxide.

Figure 33:
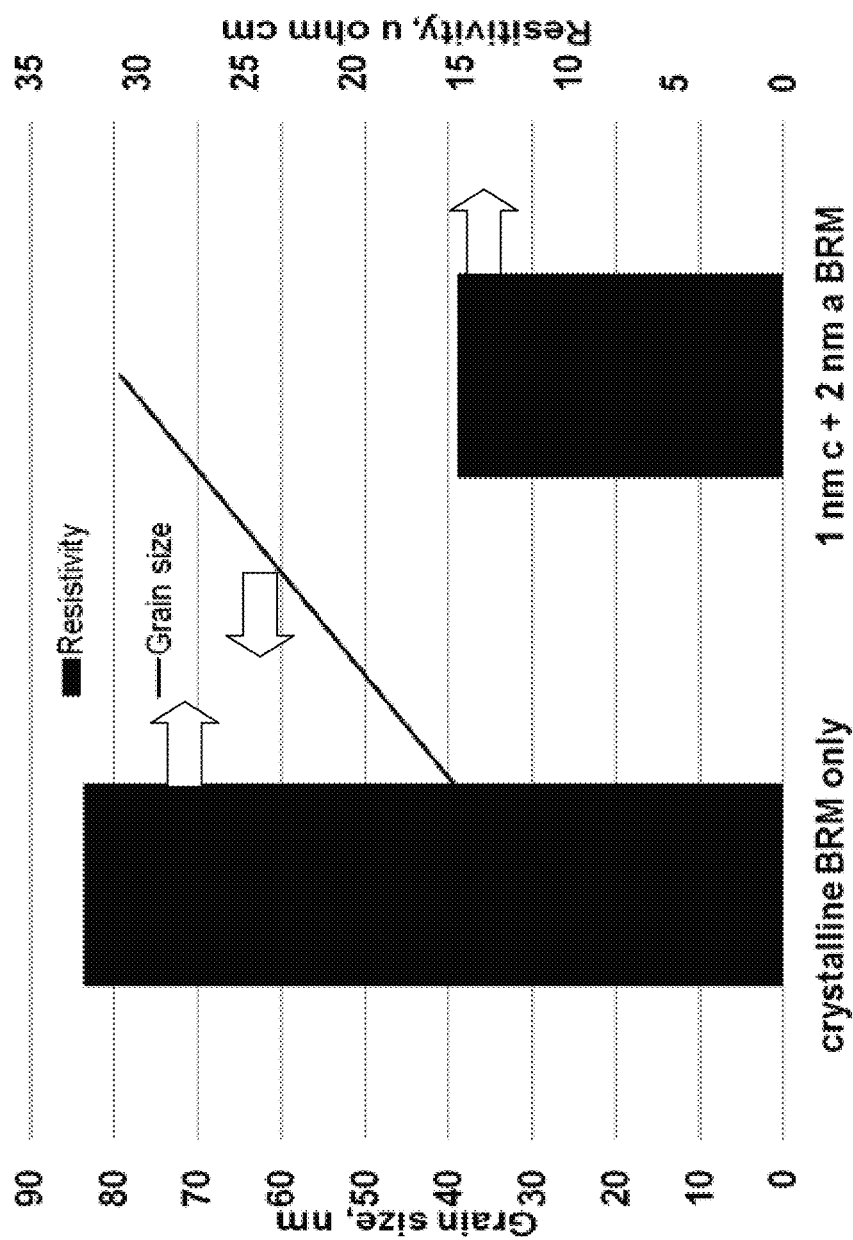
FIG. 33 is a graph illustrating the differences between tungsten layers formed on a 3 nm thick polycrystalline TiN layer and formed on a stack including a 1 nm thick polycrystalline TiN layer and a 2 nm thick amorphous barrier layer.

Referring to FIG. 33, the average grain size (indicated by the left side vertical axis) and the resistivity (in μOhms-cm) of two sample tungsten layers formed on two different underlying surfaces are compared. A first sample tungsten layer can be deposited on a 3 nm thick TiN layer to provide a reference structure. A second sample tungsten layer can be deposited on a first barrier layer stack of the present disclosure that includes an underlying 2 nm thick amorphous barrier layer and an overlying 1 nm thick polycrystalline TiN barrier layer. The first sample tungsten layer has an average grain size of about 30 nm, while the second sample tungsten layer has an average grain size of about 80 nm. Further, the first sample tungsten layer has a resistivity of about 33

μOhms-cm, while the second sample tungsten layer has a resistivity of about 15 μOhms-cm. Thus, the amorphous barrier layer is believed to increase the average grain size and decrease the resistivity of the tungsten layer deposited on the multilayer barrier film.

The various barrier layer stacks of the present disclosure can be incorporated into the three-dimensional memory device of the present disclosure or variants thereof. According to various embodiments of the present disclosure, a three-dimensional memory device is provided, which comprises: an alternating stack of insulating layers 32 and electrically conductive layers 46 located over a substrate (9, 10, 61); and memory stack structures 55 extending through the alternating stack (32, 46), wherein each of the memory stack structures 55 comprises a memory film 50 and a vertical semiconductor channel 60 laterally surrounded by the memory film 50. Each of the electrically conductive layers 46 comprises: a barrier layer stack (561, 564) including a crystalline metallic barrier layer 564 and an amorphous barrier layer 561; and a metal fill material layer 46B spaced from the insulating layers 32 and the memory stack structures 55 by the barrier layer stack (561, 564).

In one embodiment, the metal fill material layer 46B has a greater average grain size than an average grain size within the polycrystalline metallic barrier layer 564. In one embodiment, the polycrystalline metallic barrier layer 564 is spaced from the memory stack structures 55 by the amorphous barrier layer 561. In one embodiment, a backside blocking dielectric layer 44 may be provided, which includes vertical portions disposed between the memory stack structures 55 and the barrier layer stack (561, 564) and horizontal portions disposed between the insulating layers 32 and the barrier layer stack (561, 564). In one embodiment, the polycrystalline metallic barrier layer 564 can include a material selected from TiN, TaN, WN, Ti, and Ta, and the amorphous barrier layer 561 can include a material selected from TiSiN, TiCN, TiBN, TiAlN, WCB, WBN, TiGeBN, amorphous TiN, TiO$_x$, and TaO$_y$, wherein x is in a range from 1.7 to 2.3 and y is in a range from 1.8 to 2.8.

The barrier layer stacks of the present disclosure can be employed in lieu of the amorphous barrier layers described above. Compared to crystalline barriers, amorphous barriers provide larger grain W growth, lower W resistivity, smoother memory opening/word line interface, and lower grain boundary diffusion of F through bulk W. In contrast, compared to amorphous barriers, crystalline barrier layers provide lower fluorine etch rates during tungsten deposition, better W fill and adhesion and lower barrier resistivity. The multilayer barrier structures provide synergistic advantages over single layer barriers, such as good F blocking, large grain/low resistivity W formation, and good adhesion of W.

Figure 34:
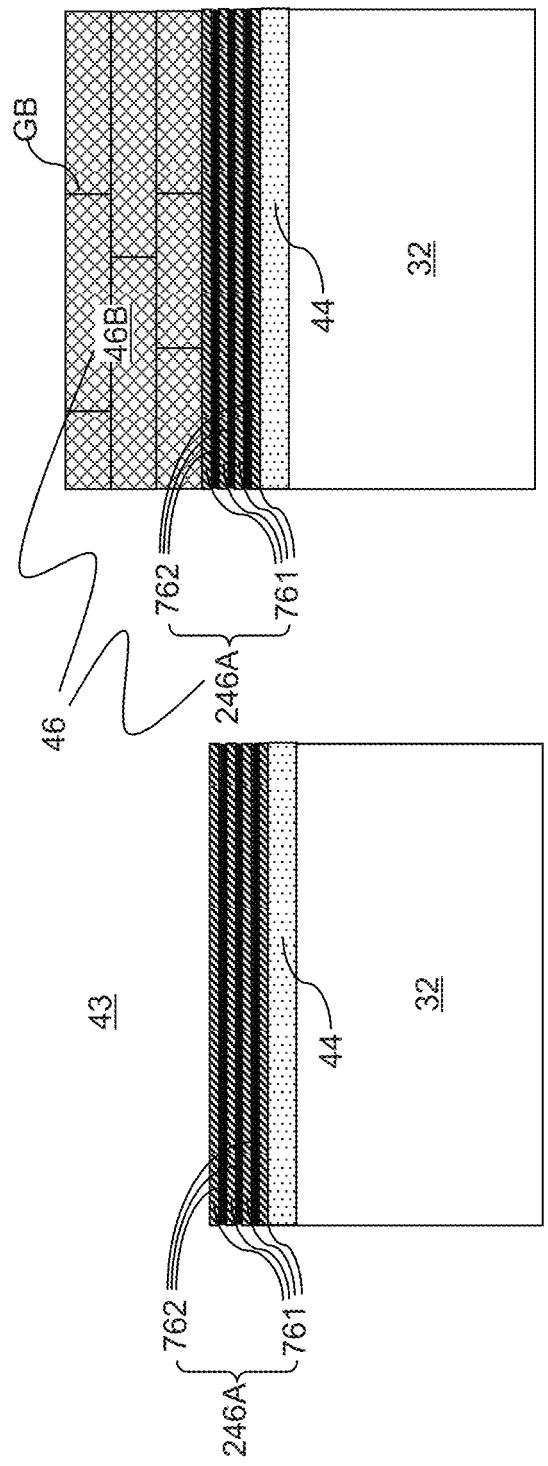
FIGS. 34A-34B schematically illustrate a region of the exemplary structure during formation of an alternating stack of TiN layers and BN layers according to a fourth embodiment of the present disclosure.
Figure 35:
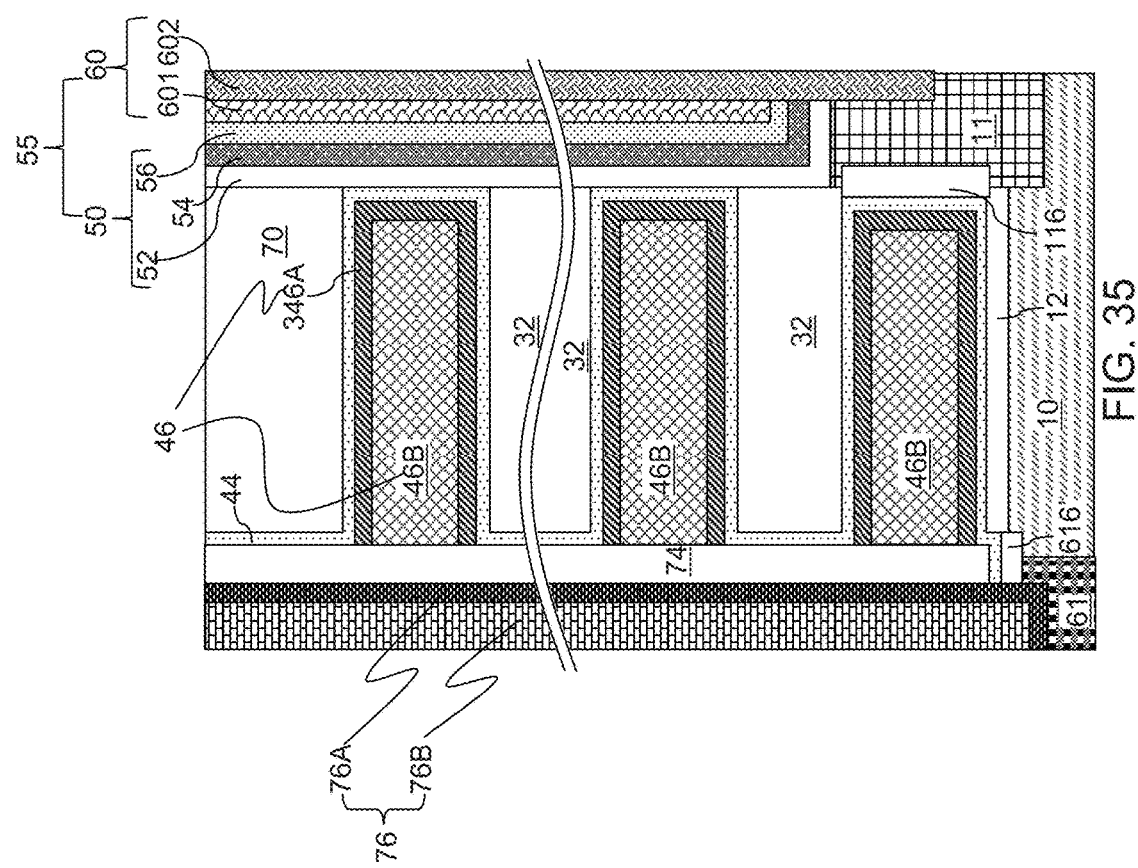
FIG. 35 schematically illustrates a region of the exemplary structure after formation of a backside contact via structure according to the fourth embodiment of the present disclosure.

Referring to FIG. 34A, a region around a backside recess 43 is illustrated for a fourth embodiment in which a fourth barrier stack 246A containing a ternary transition metal nitride, such as a ternary boron and transition metal nitride is employed in lieu of a first, second, or third barrier stack described above. The exemplary structure illustrated in FIG. 34A can be derived from the exemplary structure illustrated in FIG. 8 by optional deposition of a backside blocking dielectric layer 44 and subsequent deposition the fourth barrier layer stack 246A. If the backside blocking dielectric layer 44 is employed, the fourth barrier stack 246A is deposited over, and directly on, the outer surfaces of the backside blocking dielectric layer 44. If the backside blocking dielectric layer 44 is not employed, the fourth barrier stack 246A is deposited directly on surfaces of the insulating layers 32 and sidewalls of the memory stack structures 55.

The fourth barrier stack 246A can be an alternating barrier stack, i.e., a stack of first component barrier layers and second component barrier layers. In one embodiment, the first component barrier layers can be titanium nitride layers 761 and second component barrier layers can be boron-containing layers 762. Processes for depositing a titanium nitride layer 761 and processes for forming a boron-containing layer 762 are alternately performed to form the alternating barrier stack of the fourth barrier stack 246A.

Each of the titanium nitride layers 761 can be deposited employing a titanium-containing precursor gas and a nitrogen containing precursor in a chemical vapor deposition (CVD) process or an atomic layer deposition (ALD) process. Exemplary titanium-containing precursor gases include tetrakis(dimethylamido)titanium (TDMAT), Ti(NEtMe)$_4$ (TEMATi), titanium tetrachloride (TiCl$_4$), titanium tetraiodide (TiI$_4$), and titanium tetrafluoride (TiF$_4$). The nitrogen containing precursor can be, for example, ammonia. The thickness of each titanium nitride layer 761 can be in a range from 0.4 nm to 2.5 nm, such as from 0.6 nm to 2.0 nm, although lesser and greater thicknesses can also be employed.

Each of the boron-containing layers 762 can be formed by decomposition of a boron-containing precursor on a surface of one of the titanium nitride layers 761. The boron-containing precursor can be B$_2$H$_6$, BCl$_3$, or other boron-containing gases. Boron atoms derived from dissociation of the boron-containing precursor gas can be adsorbed on an underlying titanium nitride layer 761. Optionally, a subsequent nitridation process can be performed to convert the adsorbed boron atoms into a boron-nitrogen compound (e.g., boron nitride (BN)). Thus, each of the boron-containing layers 762 can be formed by decomposition of a boron-containing precursor on a surface of one of the titanium nitride layers 761. Alternatively, the boron nitride layer can be deposited from boron and nitrogen containing precursors. The boron-containing layers 762 can include atomic boron and/or BN. The phase of the boron-containing layers 762 may be amorphous or polycrystalline. Each boron-containing layer 762 can have a thickness in a range from 0.01 nm to 0.5 nm. Each boron-containing layer 762 may be formed as a continuous layer or as discrete islands. The thickness of each boron-containing layer 762 can be calculated by multiplying the coverage by the total boron atoms or boron compounds with the thickness of a monolayer of the boron atoms or boron compounds.

The total thickness of the fourth barrier stack 246A can be in a range from 1.5 nm to 6.0 nm, such as from 3.0 nm to 5.0 nm. The average boron concentration in fourth barrier stack 246A can be tuned by selecting the total number of boron-containing layers 762 and the total amount of boron atoms adsorbed per boron-containing layer 762. The total number of boron-containing layers 762 in the fourth barrier stack 246A can be in a range from 1 to 10, such as from 2 to 6. The fourth barrier stack 246A may terminate with a titanium nitride layer 761 or with a boron-containing layer 762. The boron atoms in the boron-containing layers 762 may be present as boron atoms and/or as a boron-nitrogen compound such as BN.

Referring to FIG. 34B, a precursor gas for deposition of a metallic material is provided to a process chamber in which the exemplary structure is loaded using CVD or ALD. The precursor gas can include molecules including a metallic element to be deposited and at least one fluorine atom. For example, if tungsten is to be deposited as the metallic material, the precursor gas can be tungsten hexafluoride, i.e., WF$_6$. Alternatively, organic precursors, WCl$_6$ or WCl$_5$ may be used instead. The precursor gas is applied to the physically exposed surfaces of the fourth barrier stack 246A. Preferably, no boron or silicon containing gases, such as silane ($SiH_4$) or $B_2H_6$ are used during tungsten deposition and no boron or silicon containing tungsten nucleation layer is formed. Thus, the higher resistivity boron or silicon containing tungsten nucleation layer can be omitted.

The precursor gas decomposes on the surfaces of the fourth barrier stack 246A to deposit the metallic material, which may be an elemental metal such as tungsten. In one embodiment, the boron atoms can be provided on a physically exposed topmost boron-containing layer 762 or on the top surface of a topmost titanium nitride layer 761 after diffusion through the topmost titanium nitride layer 761. The boron atoms can facilitate nucleation of the metallic material in the initial phase of the deposition process. For example, if $WF_6$, $WCl_5$, or $WCl_6$ is employed as the precursor gas for deposition of tungsten, the boron atoms facilitate nucleation of tungsten on the physically exposed surfaces of the fourth barrier stack 246A.

A metal fill material layer 46B is formed by the deposited metallic material within remaining volumes of the backside recesses 43 that remain after formation of the fourth barrier stack 246A. The metal fill material layer 46B is deposited directly on surfaces of the fourth barrier stack 246A. The metal fill material layer 46B is deposited as a polycrystalline material layer having grain boundaries GB.

The inventors of the present disclosure manufactured and tested a sample of the exemplary structure that employs the fourth barrier stack 246A. After formation of an alternating stack of titanium nitride layers 761 and boron-containing layers 762, tungsten was deposited by atomic layer deposition without employing any nucleation layer. The resistivity of tungsten deposited by this method was about 22 μOhm-cm for a 20 nm tungsten thickness. In contrast, tungsten deposited on a conventional TiN barrier layer without boron and without employing any nucleation layer shows resistivity of about 42 μOhm-cm for a 20 nm tungsten thickness. This test demonstrated that the fourth barrier stack 246A of the present disclosure can lower resistivity of a metal that is deposited thereoupon.

Optionally, the alternating barrier stack of the fourth barrier stack 246A may be annealed to induce partial diffusion of boron through the fourth barrier stack 246A. In this case, the fourth barrier stack 246A can be converted into at least a ternary transition metal and boron containing nitride barrier layer, such as a titanium boronitride (TiBN) layer 346A. In one embodiment, the TiBN layer 346 may have a composition $Ti_zB_{1-z}N$ where z is greater than zero and less than one. In one embodiment, the TiBN layer 346 may have a variable (e.g., undulating) boron concentration as a function of distance from a most proximal one of the insulating layers 32 or as a function of distance from a most proximal surface of a memory stack structure 55 (i.e., a variable value of z as a function of thickness, such as an increasing, decreasing and increasing values of z as a function of thickness). The total number of peaks in a boron concentration profile through a thickness of the TiBN layer 346A can be the same as the total number of boron-containing layers 762 as provided in the fourth barrier stack 246A.

According to an aspect of the present disclosure, a three-dimensional memory device is provided, which comprises: an alternating stack of insulating layers 32 and electrically conductive layers 46 located over a substrate (9, 10, 61); and memory stack structures 55 extending through the alternating stack (32, 46), wherein each of the memory stack structures 55 comprises a memory film 50 and a vertical semiconductor channel 60 laterally surrounded by the memory film 50. Each of the electrically conductive layers 46 comprises at least a ternary transition metal boronitride barrier layer 346A, and a metal fill material layer 46B spaced from the insulating layers 32 and the memory stack structures 55 by the barrier layer 346A. In one embodiment, the at least the ternary transition metal boronitride barrier layer 346A comprises a titanium boronitride layer in which a boron concentration undulates as a function of thickness of the layer.

In case the fourth barrier stack 246A begins within a titanium nitride layer 761 and terminates with another titanium nitride layer 761, the titanium concentration within the TiBN layer 346A has a local peak at an interface with the most proximal one of the insulating layer 32 and at an interface with a most proximal one of the metal fill material layer 46B. In the case in which the fourth barrier stack 246A begins within a titanium nitride layer 761 and terminates with a boron-containing layer, the boron concentration within the TiBN layer 346A has a local peak at an interface with a most proximal one of the metal fill material layer 46B.

Each exemplary structure employing any of the first through fourth barrier stacks can include a three-dimensional memory device. The three-dimensional memory device can comprise a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
    forming an alternating stack of insulating layers and sacrificial material layers over a semiconductor substrate;
    forming memory stack structures through the alternating stack, wherein each of the memory stack structures comprises a memory film and a vertical semiconductor channel;
    forming backside recesses by removing the sacrificial material layers selective to the insulating layers and the memory stack structures;
    forming an amorphous barrier layer in the backside recesses;
    forming a metal fill material layer within remaining volumes of the backside recesses after formation of the amorphous barrier layer;
    forming a polycrystalline electrically conductive barrier layer in the backside recesses; and
    annealing the amorphous barrier layer after depositing the metal fill material to convert the amorphous barrier layer to a polycrystalline barrier layer, wherein the metal fill material layer comprises tungsten, the amorphous barrier layer comprises titanium oxide and the polycrystalline electrically conductive barrier layer comprises titanium oxide.

2. The method of claim 1, wherein:
    the metal fill material layer comprises a word line of the three-dimensional memory device;
    the polycrystalline electrically conductive barrier layer and the amorphous barrier layer have different material compositions;
    the amorphous barrier layer includes an amorphous material formed at a step of depositing the metal fill material layer; and
    the amorphous barrier layer is an electrically conductive amorphous material layer or a non-conductive amorphous material layer.

3. The method of claim 1, wherein:
    the polycrystalline electrically conductive barrier layer is deposited directly on the amorphous barrier layer; and
    the metal fill material layer is deposited directly on the polycrystalline electrically conductive barrier layer.

4. The method of claim 1, further comprising depositing a backside blocking dielectric layer in the backside recesses and directly on sidewalls of the memory stack structures, wherein the amorphous barrier layer is formed over the backside blocking dielectric layer.

5. The method of claim 1, wherein:
    the metal fill material layer comprises tungsten;
    the polycrystalline electrically conductive barrier layer comprises a material selected from TiN, TaN, WN, Ti, and Ta; and
    the amorphous barrier layer comprises a material selected from TiSiN, TiCN, TiBN, TiAlN, WCB, WBN, TiGeBN, amorphous TiN, $Si_3N_4$, $TiO_x$, and $TaO_y$, wherein x is in a range from 1.7 to 2.3 and y is in a range from 1.8 to 2.8.

6. The method of claim 1, wherein:
    the three-dimensional memory array comprises a monolithic three-dimensional NAND memory device;
    the metal fill material layer comprises, or is electrically connected to, a respective word line of the monolithic three-dimensional NAND memory device;
    the substrate comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon;
    the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
    the array of monolithic three-dimensional NAND strings comprises:
        a plurality of semiconductor channels, wherein at least one end portion of each of the plurality of semiconductor channels extends substantially perpendicular to a top surface of the substrate, and
        a plurality of charge storage elements, each charge storage element located adjacent to a respective one of the plurality of semiconductor channels.

7. A method of forming a three-dimensional memory device, comprising:
    forming an alternating stack of insulating layers and sacrificial material layers over a semiconductor substrate;
    forming memory stack structures through the alternating stack, wherein each of the memory stack structures comprises a memory film and a vertical semiconductor channel;
    forming backside recesses by removing the sacrificial material layers selective to the insulating layers and the memory stack structures;
    forming an alternating barrier stack of titanium nitride layers and boron-containing layers;
    depositing a metal fill material layer within remaining volumes of the backside recesses after formation of the alternating barrier stack; and
    annealing the alternating barrier stack to form a TiBN layer having an undulating boron concentration as a function of distance from a most proximal one of the insulating layers.

8. The method of claim 7, wherein the boron-containing layers are formed by decomposition of a boron-containing precursor on a surface of one of the titanium nitride layers and comprises atomic boron or BN.

9. The method of claim 7, wherein each of the boron-containing layers is formed by deposition of a boron layer on an underlying titanium nitride layer and subsequent nitridation of the boron layer, and wherein each of the boron-containing layers has a thickness in a range from 0.01 nm to 0.5 nm.

10. A three-dimensional memory device comprising:
    an alternating stack of insulating layers and electrically conductive layers located over a substrate; and memory stack structures extending through the alternating stack, wherein each of the memory stack structures comprises a memory film and a vertical semiconductor channel laterally surrounded by the memory film, wherein each of the electrically conductive layers comprises:

at least a ternary transition metal boronitride barrier layer; and a metal fill material layer spaced from the insulating layers and the memory stack structures by the barrier layer;

wherein:

the metal fill material layer comprises a word line of the three-dimensional memory device; and the at least the ternary transition metal boronitride barrier layer comprises a titanium boronitride layer in which a boron concentration undulates as a function of thickness.

11. A method of forming a three-dimensional memory device, comprising: forming an alternating stack of insulating layers and sacrificial material layers over a semiconductor substrate; forming memory stack structures through the alternating stack, wherein each of the memory stack structures comprises a memory film and a vertical semiconductor channel; forming backside recesses by removing the sacrificial material layers selective to the insulating layers and the memory stack structures; forming a first amorphous barrier layer in the backside recesses; forming a polycrystalline electrically conductive barrier layer in the backside recesses; forming a second amorphous barrier layer in the backside recesses; and forming a metal fill material layer within remaining volumes of the backside recesses after formation of the second amorphous barrier layer; wherein: the second amorphous barrier layer is deposited directly on the polycrystalline electrically conductive barrier layer; the metal fill material layer comprises tungsten which is deposited employing a fluorine containing precursor gas that etches, partly or completely, the second amorphous barrier layer during deposition of the metal fill material layer; and the polycrystalline electrically conductive barrier layer is deposited directly on the first amorphous barrier layer.

* * * * *